(12) United States Patent
Irie

(10) Patent No.: US 6,337,162 B1
(45) Date of Patent: Jan. 8, 2002

(54) METHOD OF EXPOSURE, PHOTOMASK, METHOD OF PRODUCTION OF PHOTOMASK, MICRODEVICE, AND METHOD OF PRODUCTION OF MICRODEVICE

(75) Inventor: Nobuyuki Irie, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/661,396

(22) Filed: Sep. 13, 2000

Related U.S. Application Data

(63) Continuation of application No. PCT/JP99/01548, filed on Mar. 26, 1999.

(30) Foreign Application Priority Data

| Mar. 26, 1998 | (JP) | 10-098373 |
| Mar. 31, 1998 | (JP) | 10-103767 |
| May 12, 1998 | (JP) | 10-146586 |

(51) Int. Cl.⁷ .............................. G03F 9/00; G03C 5/00
(52) U.S. Cl. ............................. 430/5; 430/17; 430/22; 430/30
(58) Field of Search .................. 430/30, 22, 5, 430/17

(56) References Cited

U.S. PATENT DOCUMENTS

| 4,748,478 A | | 5/1988 | Suwa et al. | 355/53 |
| 5,650,840 A | | 7/1997 | Taniguchi | 355/55 |
| 5,783,341 A | * | 7/1998 | Uzawa | 430/30 |
| 5,841,520 A | | 11/1998 | Taniguchi | 355/53 |
| 6,066,419 A | * | 5/2000 | Wu et al. | 430/30 |

FOREIGN PATENT DOCUMENTS

| JP | 58-208747 | 12/1983 |
| JP | 62-200728 | 9/1987 |
| JP | 4-311025 | 11/1992 |
| JP | 7-211618 | 8/1995 |
| JP | 8-69958 | 3/1996 |
| JP | 10-74696 | 3/1998 |

* cited by examiner

Primary Examiner—Christopher G. Young
(74) Attorney, Agent, or Firm—Oliff & Berridge, PLC

(57) ABSTRACT

A method of exposure projecting and exposing a pattern formed on a mask on to a photosensitive substrate through a projection optical system, comprising the steps of measuring a position of an image projected by said projection optical system; and projecting and exposing said pattern of the mask in a state with imaging characteristics corrected to reduce an amount of offset of a position of said projected image from an ideal position.

64 Claims, 17 Drawing Sheets

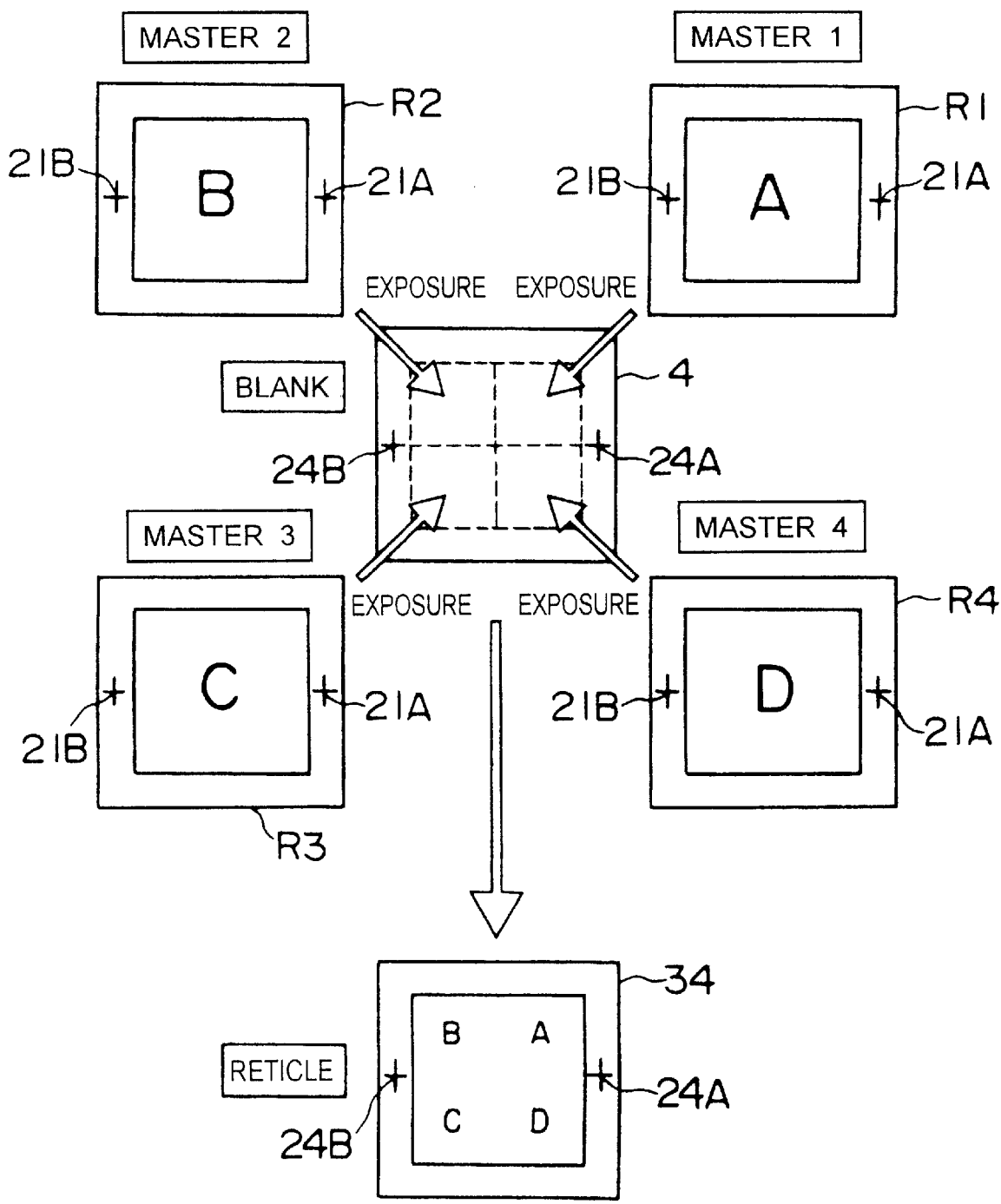

METHOD OF EXPOSURE, PHOTOMASK, METHOD OF PRODUCTION OF PHOTOMASK, MICRODEVICE, AND METHOD OF PRODUCTION OF MICRODEVICE

This application is a continuation of PCT/JP99/01548 filed Mar. 26, 1999.

FIELD OF THE INVENTION

The present invention relates to a method of exposure, exposure apparatus, photomask, method of production of a photomask, microdevice, and method of production of a microdevice.

DESCRIPTION OF THE RELATED ART

In the photolithographic process for production of a semiconductor integrated circuit, liquid crystal display element, thin film magnetic head, pickup element, or other microdevice, a pattern of a photomask is transferred to a semiconductor wafer or glass plate coated with a photoresist (hereinafter also called a "photosensitive substrate"). As this type of projection exposure apparatus, wide use has conventionally been made of a step-and-repeat type exposure apparatus (stepper). This step-and-repeat type exposure apparatus reduces and projects the pattern of the photomask all together on each shot area of a wafer for exposure. When finishing exposing one shot area, it moves the wafer and exposes the next shot area. This action is successively repeated.

To enlarge the scope of exposure of the mask pattern, a step-and-scan type exposure apparatus has been developed which restricts the exposure light from the illumination system to a slit shape (for example, a rectangular shape), uses this slit light to reduce and project part of the mask pattern on the wafer, and makes the mask and wafer synchronously move to be scanned by the projection optical system in that state. This step-and-scan type exposure apparatus (scanning stepper) has both the advantage of the transfer method of an aligner of transferring the pattern of the entire mask on the entire surface of the wafer by an equal magnification using a single scanning light beam and the advantage of the transfer method of the above stepper. Note that the photomask used in this step-and-repeat or step-and-scan reduction projection type exposure apparatus is also called a "reticle".

The photomask used in this type of exposure apparatus has conventionally been produced by using an electron beam lithography system or a laser beam lithography system to draw a master pattern on a photomask substrate. That is, a mask material has been formed on the substrate, a resist coated, then an electron beam lithography system or laser beam lithography system used to draw the master pattern. Next, the resist has been developed, then etched etc. to form the master pattern by the mask material. In this case, if the reduction magnification of the reduction projection type exposure apparatus using this photomask is $1/\beta$, the master pattern drawn on the photomask may be a $\beta$-fold enlarged pattern of the device pattern, so the drawing error of the lithography system is reduced to about $1/\beta$ on the device. Therefore, it becomes possible in practice to form the device pattern by a resolution of about $1/\beta$ the resolution of the lithography system.

In a projection exposure apparatus producing a microdevice using such a photomask (hereinafter sometimes referred to as a "device exposure apparatus"), there is distortion or coma aberration or other aberration of the projection optical system, projection magnification error, drawing error of the pattern of the photomask, rotation, shift, and other offset of the photomask with respect to the projection optical system, bending and other deformation error of the photomask accompanying holding on the stage, and other error, so there was the problem that error occurred in the position or shape of the pattern formed on the substrate for producing the device and the characteristics of the microdevice produced deteriorated.

Further, in the above way, in the past, the master pattern of the photomask had been drawn by an electron beam lithography system or laser beam lithography system. These lithographic systems draw the master pattern directly based on drawing data from a control computer. Recent LSIs and other devices, however, have become larger in area and have been increasingly improved in fineness and integration, so the master pattern required for the exposure has also become larger in area and finer. Further, as the photomask, use has been also made of reticles provided with correction patterns for preventing transfer of unnecessary patterns by double exposure, so-called phase shift reticles providing a phase shift between adjoining patterns, etc., but with such special photomasks, the amount of the drawing data tends to become greater than that of other photomasks. Due to this, the drawing data required by the lithography system for producing the photomask becomes massive.

Therefore, the drawing time required for drawing the master pattern of a single photomask by the lithography system has recently grown from 10 hours to as much as 24 hours or so. This longer drawing time has become one factor behind the rising cost of production of photomasks.

In this regard, in an electron beam lithography system, it is necessary to correct for the proximity effect due to the back scattering distinctive to electron beams. Further, it is necessary to correct for electric field unevenness at the periphery of the substrate due to the charging of the surface of the substrate. Therefore, to draw the master pattern as designed, it is necessary to measure for error in the drawing position etc. in advance under various conditions and make complicated corrections at the time of drawing with a high accuracy and stability. Making such complicated corrections during the above extremely long drawing time with a high accuracy and stability, however, is difficult. The problem of drift in the drawing position occurs during the drawing. Further, it is possible to interrupt the drawing and calibrate for error, but this has the problem of further increasing the overall drawing time.

Further, the resolution and other characteristics of resists for electron beams have not been improved that much and there will probably not been any rapid improvement in these characteristics in the future either. Therefore, if the pattern rule of semiconductor devices etc. becomes further finer in the future, the drawing time for the master pattern of one photomask will become too long, the resolution of the electron beam resist will approach its limits, and the necessary drawing accuracy may no longer be obtained. Further, the amount of the drawing data in the control computer is also becoming so massive as to be difficult for use in a single drawing process.

On the other hand, a laser beam lithography system draws a master pattern using an ultraviolet band laser beam. It has the advantages that a resist offering a higher resolution than an electron beam lithography system can be used and there is no proximity effect due to back scattering. The resolution of a laser beam lithography system, however, is inferior to that of an electron beam lithography system. Further, a laser beam lithography system is also a system which draws the master pattern directly, so the amount of the drawing data becomes massive, the processing of the data is becoming difficult, and the drawing time is becoming extremely long. Therefore, the required drawing accuracy may no longer be able to be obtained due to drift etc. of drawing position etc.

Further, a working mask is sometimes produced by a projection exposure apparatus transferring the pattern formed on the master mask to a photomask substrate (blank) (hereinafter also referred to as a "reticle exposure apparatus"), but due to analogous problems as with the above device exposure apparatus for producing a microdevice, that is, distortion and coma aberration and other aberration of the projection exposure apparatus, projection magnification error, drawing error of the pattern of the master mask (master drawing error), rotation, shift, and other offset of the master mask with respect to the projection optical system, bending and other deformation error of the master mask due to holding on the stage, and other error, error occurs in the position and shape of the pattern formed on the blank, the continuity and periodicity of the pattern become poor particularly at the stitching portions, the accuracy of the photomask produced deteriorates, and the accuracy of the microdevice produced using such a photomask deteriorates.

Further, when actually mounting the photomask in a projection exposure apparatus and projecting the pattern of the photomask on a wafer or other device substrate through a projection optical system, the image of the photomask projected on the surface of the device substrate deforms due to the bending of the photomask along with holding, tilt with respect to the reference plane (object plane of projection optical system), phase shift, etc., deforms due to distortion or field curvature or other aberration of the projection optical system, and sometimes deforms due to even bending of the device substrate etc. A pattern distorted from the ideal image (ideal pattern) ends up being transferred and formed on the device substrate. As a result, the overlay error etc. of the pattern increases and the characteristics of the microdevice produced sometimes deteriorate. Further, the imaging characteristics of the projection optical system differ slightly with each projection exposure apparatus, so it is desirable to correct the projected image for each projection exposure apparatus.

Here, for the aberration of the projection exposure system, techniques such as arranging a glass plate or aberration correcting plate in the optical path, providing a mechanism for fine movement of the lenses comprising the projection optical system, or sealing the gas chamber between lenses of the projection optical system and changing the pressure or composition of the gas there are sometimes used, but even such techniques are unable to completely eliminate the aberration. It is necessary to correct the residual aberration or improve the exposure accuracy by a simpler configuration.

Further, if using an electron beam lithography system or laser beam lithography system to produce a photomask, rotation or offset or other error sometimes occurs due to the drawing error etc. between an alignment mark of the photomask and the drawn master pattern. Therefore, even if using the alignment mark of the photomask for complete alignment with the device substrate (wafer) in transfer and exposure of the pattern, error remains between the alignment mark of the photomask and the master pattern, so there is the problem that rotation or offset occurs in the pattern transferred to the device substrate, the overlay accuracy of the pattern deteriorates, and the characteristics of the microdevice produced otherwise deteriorates in some cases.

Note the method of reducing the rotation, offset, or other error includes not only improvement of the basic accuracy of the lithography system, but also drawing the same pattern overlaid several times for averaging, but even normally the drawing time takes from several hours to tens of hours, so drawing several times increases the drawing time tremendously and therefore this is impractical. Further, sometimes the rotation, offset, and other error occurring between the master pattern and an alignment mark of the photomask is measured in advance and the position of the device substrate is corrected using the measured value at the time of exposure on to the device substrate, but the processing is complicated and the accuracy was also insufficient.

SUMMARY OF THE INVENTION

Therefore, an object of the present invention is to produce a high accuracy, high quality microdevice.

Another object of the present invention is to produce a high accuracy, high quality microdevice efficiently in a short time.

1. According to a first aspect of the present invention, there is provided a method of projecting and exposing a pattern (Pi) formed on a mask (Ri) on to a photosensitive substrate (4) through a projection optical system (3), the method of exposure characterized by measuring a position of an image projected by the projection optical system and projecting and exposing the pattern of the mask in a state with imaging characteristics corrected to reduce an amount of offset of the position of the projected image from an ideal position.

According to this method of exposure of the present invention, since the imaging characteristics are corrected so as to reduce the amount of offset of an image projected by the projection optical system from the ideal position, it is possible to reduce the error arising in the position or shape of a pattern formed on the photosensitive substrate caused by distortion or coma aberration or other aberration of the projection optical system, projection magnification error, error in the pattern formed on the mask, rotation, shift, or other positional error of the mask from the projection optical system, bending of the mask along with holding, and other deformation error and therefore possible to produce a high accuracy, high quality microdevice or photomask etc.

Note that there are various methods for correction of the imaging characteristics and the method is not particularly limited. For example, they may be corrected by providing a mechanism for fine movement of the lenses comprising the projection optical system, inserting a wedge-like glass plate or other aberration correcting plate in the optical path, sealing the gas chamber between lenses in the projection optical system and changing the pressure or composition of the gas, or tilting the mask or photosensitive substrate with respect to the object plane of the projection optical system.

2. According to a second aspect of the present invention, there is provided a method of projecting and exposing a pattern (Pi) formed on a mask (Ri) on to a photosensitive substrate (4) through a projection optical system (3), the method of exposure characterized by forming a first mark (53) on the mask; measuring a position of an image projected by the projection optical system of a second mark (64, 65, 66) of a control use reference mask (60) formed with the second mark and a third mark (63) corresponding to the first mark and defining it as a second image position; finding the position of an image projected by the projection optical system of the third mark in a state with imaging characteristics preliminarily corrected to reduce an amount of offset of the second image position from an ideal position and defining it as a third image position; measuring a position of an image projected by the projection optical system of the first mark of the mask and defining it as a first image position; and projecting and exposing the pattern of the mask in a state with imaging characteristics corrected so that the first image position becomes one of a predetermined positional relationship with the third image position.

First, the first mark is formed on a working mask for producing the microdevice or a mask serving as the master mask for producing the working mask. Further, a control use reference mask formed with the third mark at a position corresponding to the first mark (for example, a facing position) and formed with the second mark at a position not corresponding to the first mark is prepared separately from the mask.

Next, the position of the image projected by the projection optical system of the second mark of the control use reference mask (for example, the position in the plane orthogonal to the optical axis of the projection optical system) is measured. The thus measured image position of the second mark is referred to as the second image position. Next, the amount of offset of the second image position from its ideal position (ideal lattice) is found and the imaging characteristics are corrected to reduce the amount of offset, for example, by adjusting the projection magnification etc. The image position of the third mark at this time is found by measurement. The thus measured image position of the third mark is referred to as the third image position. The third image position may also be found by measuring the image position of the third mark before correction of the imaging characteristics and calculating from the measured value. Due to this, the image position of the third mark is found in a state with the imaging characteristics in the pattern area (first area) desirably corrected. This constitutes the advance preparations.

Next, the position of the image projected by the projection optical system of the first mark of the mask is measured. The thus measured image position of the first mark is referred to as the first image position. Next, the imaging characteristics are corrected so that the first image position becomes one of a predetermined positional relation with the third image position (for example, so that they are substantially in register). By correcting the imaging characteristics in this way, it is possible to reproduce imaging characteristics when using the control use reference mask to correct the image position of the second mark (mark formed in first area corresponding to pattern area) to approach the ideal position. Therefore, by transferring the pattern of the mask on to the photosensitive substrate in this state, it is possible to form a high accuracy pattern close to the ideal pattern without distortion or other error in the position or shape of the pattern.

3. According to a third aspect of the present invention, there is provided a method of exposure dividing an enlarged pattern of a pattern for transfer (27) into patterns of a plurality of masks (Ri) and projecting and exposing images reduced by a projection optical system (3) of the patterns (Pi) of a plurality of masks on a surface of a photosensitive substrate (4) while stitching them, the method of exposure characterized by forming a first mark (53) in a peripheral area (52) of a pattern area (51) of a mask in which a pattern is formed; measuring a position of an image projected by the projection optical system of a second mark (64, 65, 66) of a control use reference mask (60) formed with a plurality of the second marks in a first area (61) corresponding to the pattern area of the mask and formed with a third mark (63) facing the first mark in a second area (62) corresponding to the peripheral area of the mask and defining it as a second image position; finding a position of an image projected by the projection optical system of the third mark in a state with the imaging characteristics preliminarily corrected to reduce the amount of offset of the second image positions from their ideal positions and defining it as a third image position; measuring a position of an image projected by the projection optical system of the first mark of the mask and defining it as a first image position; and successively projecting and exposing patterns of the masks in a state with imaging characteristics corrected so that the first image position becomes in register with or proximity to the third image position.

Note that in the specification of the present application, "stitching" means exposure by overlapping a processing area by one exposure with part of a processing area of another exposure and includes the case of stitching in a direction along the patterns (lines)(connecting lines) and the case of stitching in a direction intersecting the patterns (lines) (arranging lines).

According to the present invention, an enlarged pattern of the pattern for transfer is divided into patterns of plurality of masks and images reduced by the projection optical system of the patterns of the plurality of masks are successively projected and exposed on the surface of the photosensitive substrate while stitching them. When producing a photomask (working mask) for use in production of a microdevice, as one example, a thin film of the mask material is formed on the mask substrate (blank) serving as the substrate of the photomask and a photoresist or other photosensitive material is coated on top. Next, reduced images of the patterns of a plurality of master masks are transferred on to the photosensitive material using for example an optical type reduction projection exposure apparatus by step-and-repeat or the step-and-scan, then the photosensitive material is developed. Next, the pattern of the remaining photosensitive material is used as a mask for etching etc., whereby the desired pattern for transfer (master pattern) is formed.

At this time, if the reduction magnification of the optical type exposure apparatus for production of the photomask is $1/\alpha$ ($\alpha$ is an integer, fraction, etc. greater than 1), the pattern for transfer, that is, the master pattern, is enlarged $\alpha$-fold. The enlarged master pattern is divided into patterns of $\alpha \times \alpha$ number of master masks in the vertical and horizontal directions. If the reduction magnification is $\frac{1}{5}$ ($\alpha$=5), 5×5 or 25 master masks are prepared. As a result, the pattern formed in each master mask becomes part of a master pattern of an a-fold enlargement of the master pattern, so the amount of drawing data of the pattern of each master mask is reduced to about $1/\alpha^2$ of the past and the minimum line width becomes a times that of the past. Therefore, the pattern of each master mask can be drawn by a high accuracy with little drift in a short time using for example a conventional electron beam lithography system or laser beam lithography system. Further, the drawing error due to the lithography systems is reduced to $1/\alpha$ on the photomask, so the accuracy of the master pattern is improved more. Further, after producing the master masks, the patterns of the master masks can be transferred at a high speed on to the substrate of the photomask by a step-and-repeat etc., so the production time when producing several photomasks can be greatly reduced compared with the method of drawing individually by a lithography system as in the past.

Further, when there is a partial mistake in the formation of the pattern of a master mask or when there is a later change in part of the master pattern, it is sufficient to correct or remake only the master mask including the part with the mistake or the master mask including the changed portion. There is no effect on the plurality of master masks as a whole, so even in this case, the correction or change can be handled efficiently.

Note that above the explanation was given of the case of production of a working mask, but the same applies to the case of producing a microdevice (for example a liquid crystal display) by successively projecting and exposing patterns of a plurality of working masks on the surface of a device substrate (wafer or glass substrate) while stitching them.

Here, when successively projecting and exposing patterns while stitching them, the positional accuracy or shape accuracy at the connecting parts of the patterns transferred by the masks has a great effect on the characteristics of the microdevice etc. produced, so a high positional or shape accuracy of the patterns is also very important.

Therefore, in this method of exposure of the present invention, in the same way as the method of exposure according to the second aspect of the present invention, first the first mask is formed at the peripheral area of the working mask for producing the microdevice or master mask for producing the working mask (area outside of pattern area in which pattern to be transferred is formed). Further, the control use reference mask formed with the third mark at a position corresponding to the first mark (for example, a facing position) and formed with the second mark at an area corresponding to the pattern area is provided separate from the mask.

Next, the position of the image projected by the projection optical system of the second mark of the control use reference mask (for example, position in the plane orthogonal to the optical axis of the projection optical system) is measured. This measured image position of the second mark is referred to as the "second image position". Next, the amount of offset of the second image position from the ideal position (ideal lattice) is found and the imaging characteristics are corrected by for example adjusting the projection magnification etc. so as to reduce the amount of offset. The image position of the third mark at this time is measured. This measured image position of the third mark is referred to as the "third image position". This third image position may also be found by measuring the image position of the third mark before correction of the imaging characteristics and calculating from the measured value. This enables the image position of the third mark to be found in the state with the imaging characteristics in the pattern area (first area) suitably corrected. This constitute the advance preparations.

Next, the position of the image projected by the projection optical system of the first mark of the mask is measured. The thus measured image position of the first mark is referred to as the "first image position". The imaging characteristics are corrected so that the first image position becomes in register with or in proximity to the third image position. By correcting the imaging characteristics in this way, it is possible to reproduce imaging characteristics as with correction using the correction use reference mask so that the image position of the second mark (mark formed at first area corresponding to pattern area) approaches the ideal position. Therefore, by transferring the pattern of the mask on to the photosensitive substrate in this state, there is little distortion or other error in the position or shape of the pattern and it is possible to form a high accuracy pattern close to the ideal pattern.

4. According to a fourth aspect of the present invention, there is provided a method of projecting and exposing a pattern (Pi) formed on a mask (Ri) on to a photosensitive substrate (4) through a projection optical system (3), the method of exposure characterized by making part or all of the pattern reach a peripheral area (52) of a pattern area (51) of the mask in which a pattern is formed and defining the portion of the pattern present at the peripheral area as a mark portion (73) for measurement of a spatial image; measuring a position of an image projected by the projection optical system of the mark portion of the mask by a spatial image measurement method; and correcting imaging characteristics so as to give the smallest amount of offset of the image position of the mark portion from its ideal position and exposing and projecting the pattern of the mask in a state with the mark portion shielded by a blind.

According to this method of exposure of the present invention, since part or all of the pattern is made to reach the peripheral area, that part is used as a mark portion, the position of its projected image is measured, and the imaging characteristics are then corrected, the accuracy of the pattern near the boundary of the pattern area with the peripheral area becomes high and when projecting and exposing the patterns of a plurality of masks successively on the substrate while stitching them etc., the continuity (for example, the continuity when connecting in a direction along the lines in the case of a line-and-space (L/S) pattern) or periodicity (periodicity of array of direction orthogonal to the lines in the case of an L/S pattern) of the connection portion of a pattern formed using one mask with an adjacent other pattern formed using another mask can be made extremely good.

Further, when measuring the projected image of a mark, if the shape of the mark or the shape of the pattern (for example, thickness) differs, while depending on the measurement method, a difference sometimes occurs in the coma aberration or distortion when measuring by for example the spatial image measurement method. In the present invention, the mark portion is the same in shape as the pattern of the pattern area, so this problem does not arise. Note that the mark portion is shielded by a blind at the time of exposure, so the mark portion is not transferred on to the photosensitive substrate.

5. According to a fifth aspect of the present invention, there is provided a method of exposure dividing an enlarged pattern of a pattern for transfer (27) into patterns of a plurality of master masks (R1 to RN) and projecting and exposing images reduced by a projection optical system of the patterns of a plurality of master masks on a surface of a mask substrate while stitching them, the method of exposure characterized by finding a displacement of an actually projected point ($\alpha 1$) on the mask substrate from an ideal projected point ($\alpha 1$) and making at least part of the pattern (36) formed on the master mask distort based on the found displacement or making the position of the pattern of the master mask at the object plane side of the projection optical system shift.

The displacement found here includes displacement arising due to at least one of deformation of the pattern of the master mask (deformation due to bending of the master mask along with holding, the tilt with respect to the reference plane (object plane of projection optical system), phase shift, etc.), aberration of the projection optical system (distortion, image plane curvature, astigmatism, coma aberration, spherical aberration, etc.), and deformation of the mask substrate (bending etc.).

According to this aspect of the present invention, the displacement of an actual projected point ($\alpha 1$) on the mask substrate from the ideal projected point (α1) is found and the pattern (36) formed on the master mask is distorted for formation based on the found displacement. For example, a predetermined sampling point (α0) is set on the master mask, the displacement (offset) of the actual projected point (α1) corresponding to the sampling point with respect to the ideal projected point (α1) on the mask substrate is theoretically calculated or is found by performing actual exposure and measuring the displacement of the transferred image by a measuring device, the distortion of the image of the pattern on the mask substrate (4) is found based on this, and the original pattern to be formed on the pattern mask (pattern in design) is made to distort to substantially eliminate this distortion, that is, the data of the pattern in the design is corrected to form (draw) the pattern.

The sampling point may be made a plurality of points arranged at a suitable pitch along the design pattern or in an ideal lattice. The correction values of the data at each point in the design pattern may be found based on the displacement found by the least square method or another approximation method, for example, by preparing a correction value map and interpolating using that data. Since the original pattern (design pattern) is made to distort so that the actual projected image becomes substantially in register with the ideal projected image, even if for example there is residual aberration of the projection optical system etc., it is possible to project and transfer a pattern close to the ideal image on to the mask substrate and possible to produce a high accuracy, high quality photomask. Note that instead of causing distortion of at least part of the pattern, it is also possible to cause the pattern position at the object plane side of the projection optical system to shift or to combine the two techniques.

The photomask of the present invention produced using the above method of exposure for producing the photomask is formed with a pattern close to the ideal image, so is high in accuracy and high in quality. By using such a photomask (working mask) for exposure of a device substrate, it is possible to improve the overlay accuracy of the pattern and produce a microdevice having superior characteristics.

6. According to a sixth aspect of the present invention, there is provided a method of exposure projecting an image of a pattern of a master mask on a mask substrate (4) by a first projection optical system (3) to produce a working mask (34) and projecting and exposing an image of the pattern of the working mask on a device substrate (W) on which a microdevice is to be formed by a second projection optical system (42), the method of exposure characterized by finding at least one of a displacement of an actually projected point (β1) on the mask substrate from an ideal projected point (α1) and a displacement of an actual projected point (β1) on the device substrate from an ideal projected point (α1) and making at least part of the pattern (36) formed on the master mask distort based on the found displacement or making the position of the pattern of the master mask at the object plane side of the projection optical system shift.

In this case, it is possible to divide an enlarged pattern of a pattern for transfer (27) into patterns of a plurality of master masks (R1 to RN) and successively expose reduced images of the master patterns on a surface of the mask substrate (4) while stitching them.

The displacement found here includes displacement arising due to at least one of deformation of the pattern of the master mask (deformation due to bending of the master mask along with holding, the tilt with respect to the reference plane (object plane of projection optical system), phase shift, etc.), aberration of the first projection optical system (distortion, image plane curvature, astigmatism, coma aberration, spherical aberration, etc.), bending and other deformation of the mask substrate, deformation of the pattern of the working mask (deformation due to bending of the working mask along with holding, the tilt with respect to the reference plane (object plane of second projection optical system), phase shift, etc.), and aberration of the second projection optical system (distortion, image plane curvature, astigmatism, coma aberration, spherical aberration, etc.)

According to the method of exposure for producing a microdevice of this aspect of the present invention, at least one of displacement of the actual projected point (β1) on the mask substrate from the ideal projected point (α1) (first displacement) and displacement of the actual projected point (β1) on the device substrate from the ideal projected point (α1) (second displacement) is found and the pattern (36) formed on the master mask is distorted for formation based on the found displacement.

When distorting the pattern by finding the first displacement, a predetermined sampling point (α0) is set on the master mask, the displacement (offset) of the actual projected point (β1) with respect to the ideal projected point (α1) on the mask substrate is theoretically calculated or is found by performing actual exposure and measuring by a measuring device, the distortion of the image of the pattern on the mask substrate (4) is found based on this, and the original pattern (design pattern) to be formed on the master mask is made to distort to substantially eliminate this distortion, that is, the data of the pattern in the design is corrected to form (draw) the pattern.

When distorting the pattern by finding the second displacement or when distorting the pattern by finding both of the first and second displacements, a predetermined sampling point (α0) is set on the master mask or working mask, the displacement (offset) of the actual projected point (β1) with respect to the ideal projected point (α1) on the device substrate (W) corresponding to the sampling point is theoretically calculated or is found by performing actual exposure and measuring by a measuring device, the distortion of the image of the pattern on the device substrate is found based on this, and the original pattern (design pattern) to be formed on the master mask is made to distort to substantially eliminate this distortion, that is, the data of the pattern in the design is corrected to form (draw) the pattern.

The sampling point may be made a plurality of points arranged at a suitable pitch along the design pattern or in an ideal lattice. The correction values of the data at each point in the design pattern may be found based on the displacement found interpolation by the least square method or another approximation method. Since the original pattern (design pattern) to be formed on the working mask is made to distort so that the actual projected image becomes substantially in register with the ideal projected image, even if for example there is residual aberration of the projection optical system etc., it is possible to project and transfer a pattern close to the ideal image on to the device substrate and possible to produce a high accuracy, high quality microdevice. Note that instead of causing distortion of at least part of the pattern, it is also possible to cause the pattern position at the object plane side of the projection optical system to shift or to combine the two techniques.

The microdevice of the present invention produced using the above method of exposure for producing the microdevice is formed with a pattern close to the ideal image, so it is possible to improve the overlay accuracy of the pattern and obtain superior characteristics.

7. According to a seventh aspect of the present invention, there is provided a method of producing a photomask (34) on which a pattern for transfer (27) is formed, the method of producing a photomask characterized by dividing an enlarged pattern of the pattern for transfer into patterns of a plurality of master masks (R1 to RN); forming an alignment mark (24A, 24B) on a surface of a substrate (4) for the photomask; and successively transferring reduced images of the patterns of the plurality of master masks (R1 to RN) on the surface of the substrate (4) for the photomask while stitching them while aligning the substrate (4) for a photomask and the master mask (R1 to RN) using the alignment mark (24A to 24B).

According to this aspect of the present invention, since an alignment mark is formed on the substrate for the photomask and that alignment mark is used for aligning a master mask and the photomask substrate when projecting and transferring the pattern of the master mask on the photomask substrate, the pattern transferred on to the photomask substrate becomes accurately aligned with the alignment mark, there is little rotation, offset, or other error between the alignment mark and pattern as in the past, and therefore it is possible to produce a photomask with a high quality.

The photomask of the present invention produced using this method of production of a photomask has little rotation, offset, or other error between the alignment mark and the pattern formed on its surface as in the past and therefore is high in accuracy and high in quality.

When transferring and exposing a pattern on a device substrate using such a high accuracy, high quality photomask, the alignment mark (24A, 24B) of the photomask (34) is used to align the photomask and the device substrate (W). The alignment mark formed on the photomask is used for alignment when transferring the pattern of the master mask on the photomask substrate for producing the photomask. An alignment mark the same as the alignment mark at this time is used for the alignment when transferring the pattern to the device substrate. Therefore, there is little room for error to enter compared with when forming alignment marks independently, it is possible to improve the positional accuracy of the pattern formed on the device substrate, and in turn it is possible to produce a microdevice with good characteristics.

Note that in this case, when successively transferring reduced images of the plurality of master masks (R1 to RN) on the surface of the substrate (4), it is preferable to selectively use a block exposure type reduction projection exposure apparatus or a scan exposure type reduction projection exposure apparatus according to the application of the photomask (type of exposure apparatus used etc.) For example, when the photomask is to be used in a scan exposure type reduction projection exposure apparatus such as a step-and-scan type, parallelogram shaped distortion (so-called "skew error") etc. sometimes occurs in the projected image. In this case, since skew error is difficult to correct with the block exposure system, by using a scan exposure type projection exposure apparatus when transferring the patterns of a plurality of master masks on the photomask substrate, it is possible to reduce the distortion when using the photomask, therefore the overlay error etc. becomes smaller.

Further, when successively transferring the reduced images of the patterns of the plurality of master masks (R1 to RN) on the surface of the substrate (4), it is desirable to correct the imaging characteristics (transfer position, magnification, distortion, etc.) of the reduced images of the patterns of the master masks (R1 to RN) in accordance with at least one of the nonrotational symmetrical aberration and distortion characteristics of the projection optical system (42) of the projection exposure apparatus using the photomask.

When the amount of variation of a predetermined imaging characteristic of the exposure apparatus using this photomask is known in advance, when transferring patterns of the master masks on the photomask substrate while stitching them, it is possible to adjust the transfer position, magnification, and distortion etc. of the pattern images of the master masks so as to cancel out the variation in the imaging characteristic and thereby reduce the distortion of the device pattern exposed using the photomask and improve the overlay accuracy etc.

In this regard, sometimes a plurality of these photomasks are produced and these photomasks used by a plurality of projection exposure apparatuses by mix-and-match etc. In this case, it is desirable to adjust the transfer position or imaging characteristics etc. at the time of transfer of the patterns of the master masks while stitching them in accordance with the average characteristics of the distortion characteristics etc. of the projected images of at least two projection exposure apparatuses scheduled to use these photomasks so as to obtain good overlap accuracy at these projection exposure apparatuses.

Next, it is preferable that the photomask be used in reduction projection. If deeming the photomask to be one used in $1/\beta$-fold ($\beta$ is an integer, fraction, etc. more than 1) reduction projection, if the reduction magnification of the exposure apparatus for producing the photomask is $1/\alpha$ ($\alpha$ is an integer, fraction, etc. larger than 1 in the same way as $\beta$), the drawing error of the patterns of the master masks is reduced to $1/(\alpha \cdot \beta)$ in the device pattern finally exposed. Therefore, even if making the minimum line width of the device pattern ½ the current level, it would be possible to easily draw the patterns of the master masks easily and in a short time with the necessary accuracy using an electron beam lithography system or laser beam lithography system. Therefore, even if the pattern rule becomes further finer, the desired device pattern can be exposed by the necessary accuracy.

8. According to an eighth aspect of the present invention, there is provided an exposure apparatus for production of a photomask having a mask magazine (16 to 18) which stores a plurality of master masks (R1 to RN); a mask stage (2) which carries one master mask selected from the mask magazine; a projection optical system (3) which projects a reduced image of the pattern of the master mask carried on the mask stage on to a photomask substrate (4) formed with an alignment mark (24A, 24B); a substrate stage (6) which positions the photomask substrate on a plane vertical to an optical axis of the projection optical system; and an alignment system (14A, 14B) which aligns the master mask on the mask stage and the photomask substrate on the substrate stage using the alignment mark of the photomask substrate on the substrate stage so as to stitch the reduced images of the patterns of the plurality of master masks on the photomask substrate.

The method of production of a photomask according to the seventh aspect of the present invention may be worked by use of this exposure apparatus for production of a photomask. When an alignment mark is formed on the photomask substrate and transferring the pattern of the master mask on the photomask substrate, if aligning the master mask and photomask substrate by an alignment system using this alignment mark, the pattern transferred on to the photomask substrate becomes accurately aligned with the alignment mark, there is little rotation, offset, and other error between the alignment mark and pattern as in the past, and therefore a high quality photomask can be produced.

In this case, the mask magazine, as one example, stores a plurality of master masks (R1 to RN) formed with patterns obtained by dividing an enlarged pattern of the pattern (27) of the photomask to be produced. This enables the master masks to be quickly exchangeed and exposure to be performed in a short time.

9. According to a ninth aspect of the present invention, there is provided an exposure apparatus for producing a device projecting an image of a pattern on a photomask (34) according to the present invention on to a device substrate (W), the exposure apparatus characterized by having a mask stage which carries the photomask; a projection optical system (42) which projects a reduced image of a pattern of the photomask carried on the mask stage on to the device substrate; a substrate stage (44) which positions the device substrate on a plane vertical to an optical axis (AX1) of the projection optical system; and an alignment system (41A, 41B) which aligns the photomask on the mask stage and the device substrate on the substrate stage using the alignment mark (24A, 24B) of the photomask on the mask stage so as to project the pattern (27) of the photomask on the the device substrate.

The above-mentioned methods of exposure of the present invention can be worked by using this exposure apparatus for production of a device. The alignment mark formed on the photomask is used for alignment when forming the pattern of the master mask on the photomask substrate for producing the photomask. An alignment mark the same as the alignment mark at this time is used for the alignment when forming the pattern to the device substrate. Therefore, there is little room for error to enter compared with when forming alignment marks independently, it is possible to improve the positional accuracy of the pattern formed on the device substrate, and in turn it is possible to produce a microdevice with good characteristics.

Further, according to the present invention, if the magnification from the pattern of the device formed on the device substrate (W) to the pattern (27) of the photomask is β (β is an integer, fraction, etc. more than 1) and the magnification from the pattern of the photomask to the pattern (36) of the master mask is α (α is an integer, fraction, etc. larger than 1 in the same way as β), the line width of the pattern of the master mask becomes α·β the line width of the pattern of the device. Therefore, if the drawing error of the line width when drawing the pattern of the master mask by an electron beam lithography system is Δd, the error of the line width of the pattern of the device is reduced to about Δd/(α·β), so the pattern of the device can be formed with an extremely high accuracy.

10. According to a 10th aspect of the present invention, there is provided a method of production of a microdevice characterized by forming an alignment mark (24A, 24B) on a first substrate (4) for a photomask, dividing a device pattern to be transferred on to a second substrate (W) on which the microdevice is to be formed into a plurality of element patterns, transferring reduced images of the plurality of element patterns on to the first substrate to form a device pattern using positional information obtained by detecting the alignment mark, and transferring the device pattern on to the second substrate using the alignment mark of the photomask on which the device pattern is formed.

According to this method of production of a microdevice, the alignment mark formed on the photomask is used for alignment when transferring the element pattern on the first substrate for producing the photomask. An alignment mark the same as the alignment mark at this time is used for the alignment when forming the pattern on the second substrate and then the pattern transferred, so there is little room for error to enter compared with when forming alignment marks independently, it is possible to improve the positional accuracy of the pattern formed on the second substrate, and in turn it is possible to produce a microdevice with good characteristics.

11. According to an 11th aspect of the present invention, there is provided a method of exposure using a plurality of masks to transfer patterns on a photosensitive substrate in a plurality of partially overlapping areas, the method of exposure characterized by making the amount of exposure at part of the plurality of areas at the time of transfer of the pattern different from the amount of exposure at other areas.

Further, using this method of exposure, a method of production of a photomask including the step of transferring a plurality of patterns on the photomask substrate by a step-and-stitch can be provided.

Further, using this method of exposure, a method of production of a device including the step of transferring a plurality of patterns on the photomask substrate by a step-and-stitch can be provided.

12. According to a 12th aspect of the present invention, there is provided a method of exposure emitting an illumination beam to a mask and exposing a photosensitive substrate by the illumination beam through a projection optical system, the method of exposure characterized by detecting an image projected by the projection optical system at a plurality of different points in an area illuminated by the illumination beam to obtain first information, adjusting optical characteristics of the projected image based on the same, detecting an image projected by the projection optical system at least at one measurement point outside of the illuminated area in a state with the optical characteristics adjusted to obtain second information, and storing the same and adjusting characteristics of the pattern image by the projection optical system using the second information so as to expose the photosensitive substrate by the illumination beam using the mask. In this case, it is possible to detect a mark positioned outside of the illuminated area on the mask and adjust the characteristics of the pattern image based on the second information and third information obtained by detection of that mark. The mark is for example formed at a plurality of different positions outside the pattern area on the mask on which the pattern to be transferred to the photosensitive substrate is formed.

The first and second information can be obtained using a specific mask different from the above mask. In this case, it is possible to use a specific mask having a first area corresponding to the pattern area and having a second area outside of the same in which the plurality of marks are formed, obtaining the first information by detection of a mark in the first area, and obtaining the second information by detection of a mark in the second area.

Using the above method of exposure, a method of production of a device including the step of transferring a device pattern to a workpiece can be provided.

Further, using the above method of exposure, a method of production of a photomask including the step of transferring patterns formed on a plurality of master masks on to a photomask substrate by the step-and-stitch system can be provided. In this case, it is possible to reducing and projecting the patterns of the master masks through the projection optical system, enlarge a device pattern to be formed on the photomask by exactly an inverse magnification of a projection magnification of the projection optical system, divide the enlarged pattern into elements or functions, and form the same on the plurality of master masks.

13. According to a 13th aspect of the present invention, there is provided a method of production of a photomask for use in an exposure apparatus, the method of production of a photomask characterized by exposing a plurality of partially overlapping areas on a substrate for the photomask using a plurality of master masks formed by dividing an enlarged pattern of a device pattern to be formed on the photomask into a plurality of sections and by adjusting at least one of a shape and position of a reduced image of a divided pattern on the substrate based on transfer characteristics of the master masks by the exposure apparatus. In this case, it is possible to modify design data of a divided pattern produced from the enlarged pattern and form the divided pattern on a master mask in accordance with the modified design data. Further, it is possible to adjust optical characteristics of a projection optical system forming a reduced image of a divided pattern based on the transfer characteristics. Further, it is possible to transfer a divided pattern on the substrate by synchronously moving the master mask and the substrate for scan exposure of the plurality of areas and adjust the shape of the reduced image by changing conditions of the scan exposure based on the transfer characteristics.

BRIEF DESCRIPTION OF THE DRAWINGS

FIG. 10 is a view explaining a master reticle (master), blank (photomask substrate), and working reticle used in the first embodiment of the present invention;

DESCRIPTION OF THE PREFERRED EMBODIMENTS

The present invention will be explained in more detail below with reference to the attached drawings.

First Embodiment

Figure 1:
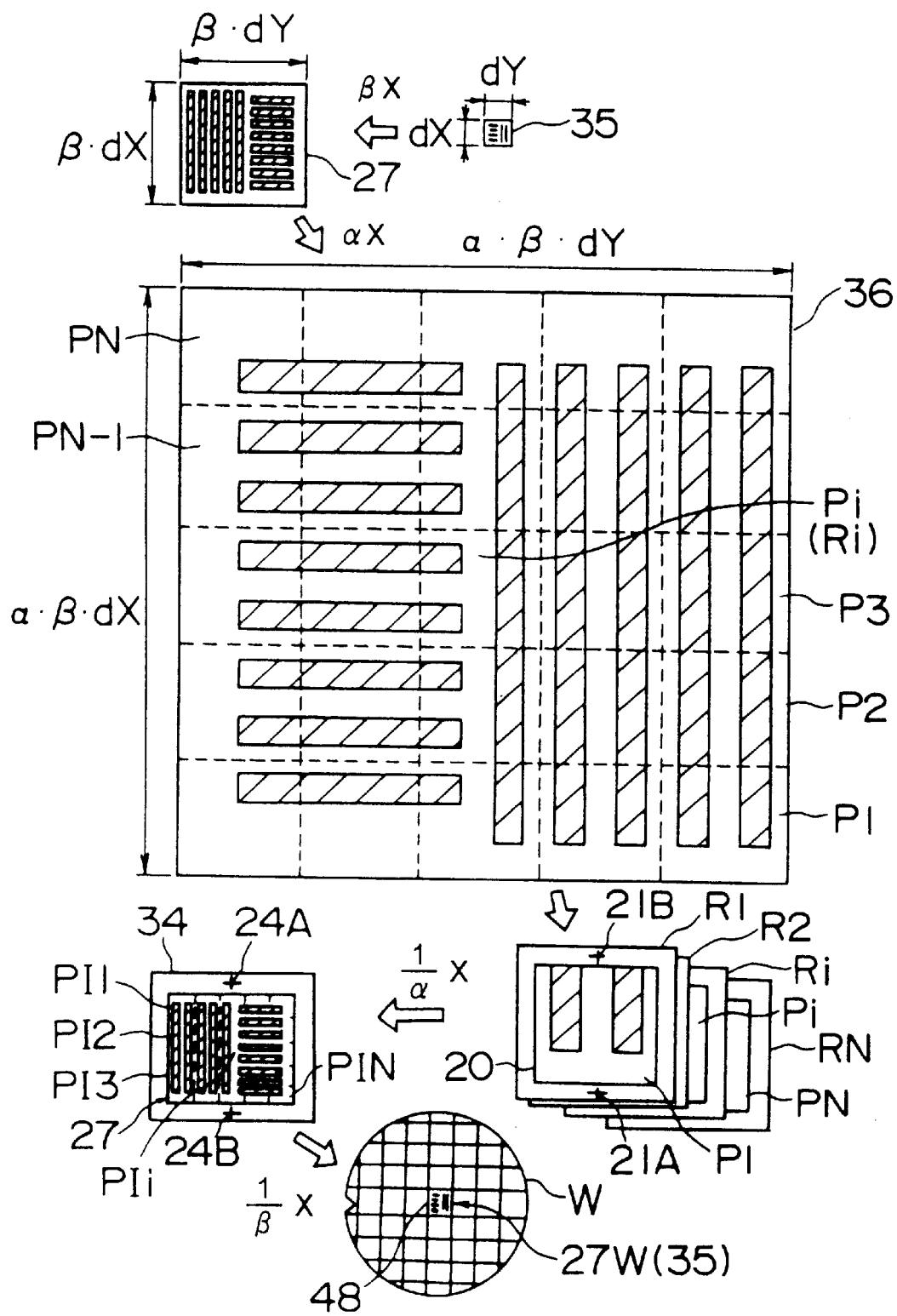
FIG. 1 is a view for explaining a process of production of a working reticle (photomask) according to a first embodiment of the present invention.

Below, a first embodiment of the present invention will be explained with reference to the drawings. FIG. 1 is a view of the process of production of a photomask. In FIG. 1, the photomask to be produced is a working reticle 34 used when actually producing a semiconductor device. The working reticle 34 is comprised of a transparent substrate made of silica glass etc. on one surface of which a master pattern 27 for transfer is formed by chrome (Cr), molybdenum silicate ($MoSi_2$ etc.), or another mask material. Further, two alignment marks 24A and 24B are formed sandwiching the master pattern 27 between them.

Further, the working reticle 34 is one used in $1/\beta$ ($\beta$ is an integer, fraction, etc. larger than 1, for example, 4, 5, or 6) reduction projection through the projection optical system of an optical type projection exposure apparatus. That is, in FIG. 1, a $1/\beta$ reduced image 27W of the master pattern 27 of the working reticle 34 is exposed on each shot area 48 of the wafer W coated with a photoresist, then the wafer is developed and etched to form a predetermined circuit pattern 35 on each shot area 48. Below, an explanation will be given of one example of the method of production of the working reticle 34 as a photomask.

In FIG. 1, first, the circuit pattern 35 of a layer of the semiconductor device to be finally produced is designed. The circuit pattern 35 is formed with various line-and-space patterns (or isolated patterns) etc. in a rectangular area with widths of perpendicularly intersecting sides of dX and dY. The circuit pattern 35 is enlarged $\beta$-fold to prepare a master pattern 27 comprised of a rectangular area with widths of the perpendicularly interesting sides of $\beta \cdot dX$ and $\beta \cdot dY$ in the image data of a computer. The $\beta$ is the reciprocal of the reduction magnification ($1/\beta$) of the projection exposure apparatus using the working reticle 34. Further, when the master pattern 27 is projected inverted, the circuit pattern 35 is enlarged inverted.

Next, the master pattern 27 is enlarged $\alpha$-fold ($\alpha$ is an integer, fraction, etc. larger than 1, for example, 4, 5, or 6) to prepare a master pattern 36 comprised of a rectangular area with widths of the perpendicularly interesting sides of $\alpha \cdot \beta \cdot dx$ and $\alpha \cdot \beta \cdot dy$ in the image data. The master pattern 36 is divided into $\alpha$ sections vertically and horizontally to prepare $\alpha \times \alpha$ number of master patterns P1, P2, P3, . . . , PN ($N=\alpha^2$) in the image data. In FIG. 1, the case where $\alpha=5$ is shown. Note that the divisor $\alpha$ of the master pattern 36 does not necessarily have to match with the magnification $\alpha$ from the master pattern 27 to the master pattern 36. Next, drawing data for an electron beam lithography system (or laser beam lithography system) is generated from these master patterns Pi (i=1 to N) and the master patterns Pi are transferred on to the master reticle Ri serving as the master mask at equal magnifications.

For example, when producing one master reticle R1, a thin film of a mask material such as chrome or molybdenum silicate is formed on a silica glass or other transparent substrate, an electron beam resist is coated on the top, then the electron beam lithography system is used to draw an equal magnification image of the first master pattern P1 on the electron beam resist. Next, the electron beam resist is developed, the etched and the resist peeled off etc, whereby the master pattern P1 is formed on the pattern area 20 on the master reticle R1. At this time, alignment marks 21A and 21B comprised of two two-dimensional marks are formed on the master reticle R1 in a predetermined positional relationship with respect to the master pattern P1. Similarly, the electron beam lithography system etc. is used to form the master pattern Pi and alignment marks 21A and 21B on another master reticle Ri. The alignment marks 21A and 21B are used for alignment at the time of the later stitching. Further, while explained later in detail, a plurality of marks for spatial image measurement are formed in the peripheral areas of the master reticles Ri (shielded areas outside of pattern areas in which patterns are formed).

In this way, in the first embodiment, the master patterns Pi drawn by the electron beam lithography system (or laser beam lithography system) are $\alpha$-fold enlarged patterns of the master pattern 27, so the amounts of the drawing data are reduced to about $1/\alpha^2$ from the case of directly drawing the master pattern 27. Further, the minimum line width of a master pattern Pi is $\alpha$ times (for example, 5 times or 4 times) the minimum line width of the master pattern 27, so each master pattern Pi can be drawn in a short time and with a high accuracy by the electron beam lithography system using a conventional electron beam resist. Further, if producing N number of master reticles R1 to RN at one time, since it is possible to produce the necessary number of working reticles 34 by repeatedly using these as explained later, the time for producing the master reticles R1 to RN does not pose a major burden.

That is, a working reticle 34 is produced by stitching and transferring the $1/\alpha$ reduced images PIi (i=1 to N) of the master patterns Pi of the N number of master reticles Ri.

Figure 2:
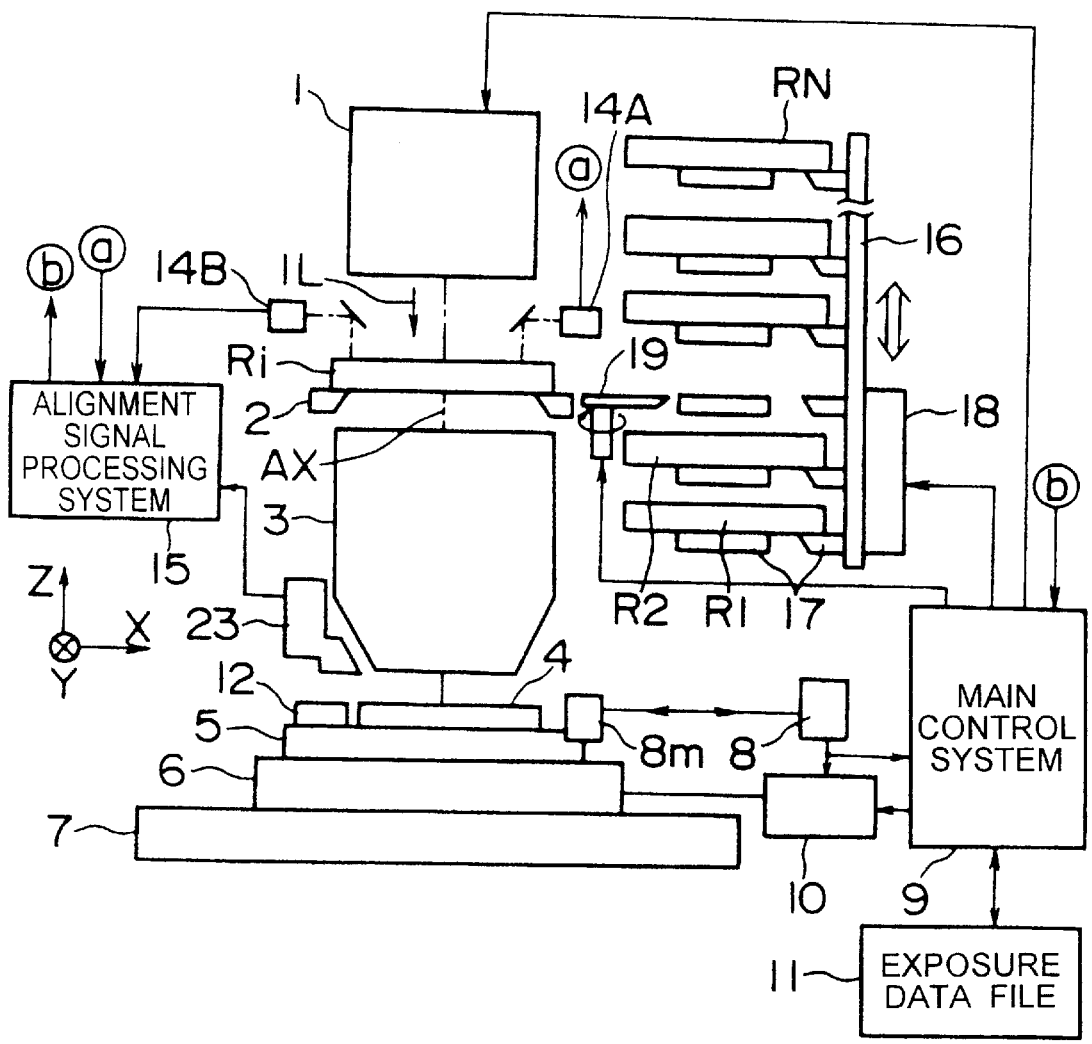
FIG. 2 is a partially cutaway view of an optical type reduction projection exposure apparatus used when producing the working reticle of the first embodiment of the present invention.

FIG. 2 shows an optical type reduction projection exposure apparatus used when producing the working reticle 34. In FIG. 2, at the time of exposure, exposure light IL is irradiated on the reticle on the reticle stage 2 by an illumination light system 1 comprised of an exposure light source, a fly-eye lens or rod integrator or other optical integrator (homogenizer) for homogenizing the illumination distribution, an illumination system aperture stop, a reticle blind (variable field stop), and condenser lens system. An i-th (i=1 to N) master reticle Ri is placed on the reticle stage 2. Note that as the exposure light, it is possible to use i-rays of a mercury lamp (wavelength 365 nm) or other rays or KrF excimer laser light (wavelength 248 nm), ArF excimer laser light (wavelength 193 nm), $F_2$ laser light (wavelength 157 nm), etc.

The image of the pattern in the illuminated area of the master reticle Ri is projected on the surface of the substrate (blank) 4 for the working reticle 34 through the projection optical system 3 by a reduction magnification of $1/\alpha$ ($\alpha$ is for example 5 or 4). The substrate 4 is a transparent substrate such as silica glass. It is formed with a thin film of a mask material such as chrome or molybdenum silicate on the pattern area 25 (see FIG. 4) of its surface and is formed with two alignment marks 24A and 24B comprised of two-dimensional marks for alignment sandwiching the pattern area 25. These alignment marks 24A and 24B are formed in advance before the transfer of the pattern using an electron beam lithography system, laser beam lithography system, projection exposure apparatus (stepper, scanner), etc. Further, the surface of the substrate 4 is coated with a photoresist so as to cover the mask material. After this, the explanation will be given taking the Z-axis parallel to the optical axis AX of the projection optical system 3, taking the X-axis parallel to the paper surface of FIG. 2 in the plane vertical to the Z-axis, and taking the Y-axis vertical to the paper surface of FIG. 2.

First, the reticle stage 2 positions the master reticle Ri on it in the XY plane. The position of the reticle stage 2 is measured by a not shown laser interferometer. The measured value and control information from a main control system 9 are used to control the operation of the reticle stage 2. On the other hand, the substrate 4 is held by suction on a not shown substrate holder. The substrate holder is fixed on a sample table 5, and the sample table 5 is fixed on the XY stage 6. The sample table 5 aligns the surface of the substrate 5 with the image plane of the projection optical system 3 by controlling the focus position (position in optical axis AX direction) and tilt angle of the substrate 4 by an auto focus system. Further, the XY stage 6 positions the sample table 5 (substrate 4) in the X-direction and Y-direction on the base 7 by for example a linear motor system.

Figure 3:
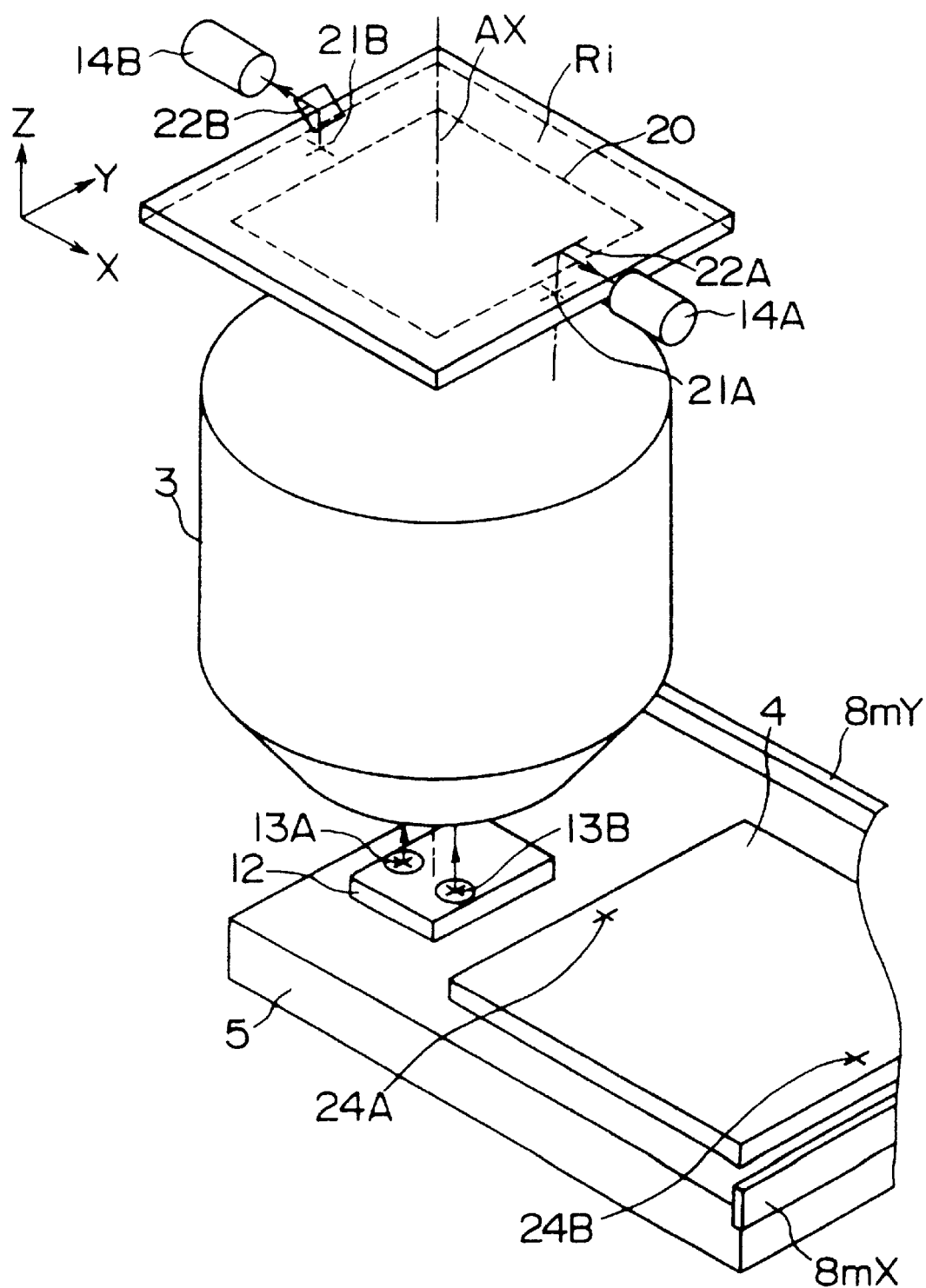
FIG. 3 is a perspective view of partially cutaway main parts showing a case of alignment of a master reticle in the projection exposure apparatus of FIG. 2.

The X-coordinate, Y-coordinate, and rotational angle of the sample table 5 are measured by moving mirrors 8m fixed above the sample table 5 and a laser interferometer 8 arranged facing it. The measured values are supplied to a stage control system 10 and the main control system 9. The moving mirrors 8m, as shown in FIG. 3, include the X-axis moving mirror 8mX and the Y-axis moving mirror 8mY. The stage control system 10 controls the operation of the linear motor of the XY stage 6 etc. based on the measured values and the control information from the main control system 9.

Further, a shelf-like reticle library 16 is arranged at the side of the reticle stage 2. In the reticle library 16 are arranged the mask reticles R1, R2, . . . , RN on N number of support plates 17 successively arranged in the Z-direction. These master reticles R1 to RN are reticles formed with master patterns P1 to PN obtained by dividing the master pattern 36 of FIG. 1 (master masks). The reticle library 16 is supported to be able to move in the Z-direction by a slide 18. A reticle loader 19 provided with an arm able to freely rotate and move in a predetermined range in the Z-direction is arranged between the reticle stage 2 and the reticle library 16. The main control system 9 is designed to be able to adjust the Z-direction position of the reticle library 16 through the slide 18, then control the operation of the reticle loader 19 to transfer the desired master reticles R1 to RN between the desired support plates 17 in the reticle library 16 and the reticle stage 2. In FIG. 2, the i-th master reticle in the reticle library 16 is placed on the reticle stage 2.

Further, the main control system 9 is connected to a magnetic disk device or other storage 11. The storage 11 stores an exposure data file. The exposure data file has recorded in it the positional relationship among the master reticles R1 to RN, alignment information, etc.

When exposing the substrate 4, when finishing exposure of the reduced image of the 1st master reticle R1 on the first shot area on the substrate 4, the next shot area on the substrate 4 is moved to the exposure area of the projection optical system 3 by step movement of the XY stage 6. In parallel with this, the master reticle R1 on the reticle stage 2 is returned to the reticle library 16 by the reticle loader 19 and the next master reticle R2 to be transferred is placed on the reticle stage 2 from the reticle library 16 by the reticle loader 19. After alignment and the later explained correction of the imaging characteristics, the reduced image of the master reticle R2 is projected and exposed on the corresponding shot area on the substrate 4 through the projection optical system 3. After this, a step-and-repeat is used to expose the reduced images of the successively corresponding master reticles R2 to RN on the remaining shot areas on the substrate 4.

When exposing the reduced images of the master reticles R1 to RN on the substrate 4 in this way, the adjacent reduced images have to be stitched together with a high accuracy. Therefore, the master reticles Ri (i=1 to N) and the corresponding shot areas (designated as Si) on the substrate 4 have to be aligned with a high accuracy. For this alignment, the projection exposure apparatus is provided with reticle and substrate alignment mechanisms.

FIG. 3 shows the reticle alignment mechanism of this example. In FIG. 3, a transparent reference mark member 12 is fixed in proximity to the substrate 4 on the sample table 5. A pair of cross-shaped reference marks 13A and 13B are for example formed at a predetermined interval in the X-direction on the reference mark member 12. Further, at the bottom of the reference marks 13A and 13B is provided an illumination system for illuminating the reference marks 13A and 13B from the projection optical system 3 side by illumination light branched from the exposure light IL. When aligning the master reticle Ri, the XY stage 2 of FIG. 2 is driven to position the reference marks 13A and 13B so that, as shown in FIG. 3, the center of the reference marks 13A and 13B on the reference mark member 12 is substantially aligned with the optical axis AX of the projection optical system 13.

Further, as one example, a pair of cross-shaped alignment marks 21A and 21B are formed so as to sandwich the pattern area 20 on the pattern surface (under surface) of the master reticle Ri. The interval of the reference marks 13A and 13B is set to be substantially equal to the interval of the images reduced by the projection optical system 3 of the alignment marks 21A and 21B. In the state with the center of the reference marks 13A and 13B substantially aligned with the optical axis AX as explained above, images enlarged by the projection optical system 3 of the reference marks 13A and 13B are formed in proximity to the alignment marks 21A and 21B of the master reticle Ri by illumination by illumination light of the same wavelength as the exposure light IL from the bottom of the reference mark member 12.

Mirrors 22A and 22B are arranged above these alignment marks 21A and 21B for reflecting in the ±X-directions the illumination light from the projection optical system 3 side. TTR (through the reticle) type image processing type alignment sensors 14A and 14B are provided to receive the illumination light reflected by the mirrors 22A and 22B. The alignment sensors 14A and 14B are provided with imaging systems and CCD cameras and other two-dimensional pickup elements. The pickup elements capture the images of the alignment marks 21A and 21B and the corresponding reference marks 13A and 13B and supply image signals to an alignment signal processing system 15 of FIG. 2.

The alignment signal processing system 15 performs image processing on the image signals to find the amounts of offset of the alignment marks 21A and 21B with respect to the images of the reference marks 13A and 13B in the X-direction and Y-direction and supply the two amounts of offset to the main control system 9. The main control system 9 positions the reticle stage 2 so that the two amounts of offset become symmetric and fall within predetermined ranges. Due to this, the alignment marks 21A and 21B and, in turn, the master pattern Pi (see FIG. 1) in the pattern area 20 of the master reticle Ri, are positioned with respect to the reference marks 13A and 13B.

In other words, the center of the image reduced by the projection optical system 3 of the master pattern Pi of the master reticle Ri (center of exposure) is substantially positioned at the center of the reference marks 13A and 13B (substantially the optical axis AX) and the perpendicularly intersecting sides of the contour of the master pattern Pi (contour of the pattern area 20) are set parallel to the X-axis and Y-axis, respectively. In this state, the main control system 9 of FIG. 2 stores the X-direction and Y-direction coordinates ($XF_0$, $YF_0$) of the sample table 5 measured by the laser interferometer 8 and ends the alignment of the master reticle. After this, any point on the sample table 5 can be moved to the center of exposure of the master pattern Pi.

Further, in FIG. 2, an off-axis system image processing type alignment sensor 23 is provided at the side surface of the projection optical system PL for detecting the position of marks on the substrate 4. The alignment sensor 23 illuminates the mark being detected by illumination light of a broad band to which the photoresist is not sensitive, picks up the image of the detected mark by a CCD camera or other two-dimensional pickup element, and supplies the image signal to the alignment signal processing system 15. Note that the interval between the center of detection of the alignment sensor 23 and the center of the projected image of the pattern of the master reticle Ri (center of exposure) (baseline amount) is found in advance using predetermined reference marks on the reference mark member 12 and stored in the main control system 9.

As shown in FIG. 3, two cross-like alignment marks 24A and 24B are for example formed at the ends of the substrate 4 in the X-direction. After the alignment of the master reticle Ri ends, the XY stage 6 is driven to move the reference marks 13A and 13B of FIG. 3 and the alignment marks 24A and 24B on the substrate 4 successively to the detection area of the alignment sensor 23 of FIG. 2 to measure the amounts of offset of the reference marks 13A and 13B and alignment marks 24A and 24B with respect to the center of detection of the alignment sensor 23. The results of the measurement are supplied to the main control system 9. The results of measurement are used by the main control system 9 to find the coordinates ($XP_1$, $YP_1$) of the sample table 5 when the center of the reference marks 13A and 13B is aligned with the center of detection of the alignment sensor 23. This ends the alignment of the substrate 4.

Figure 4:
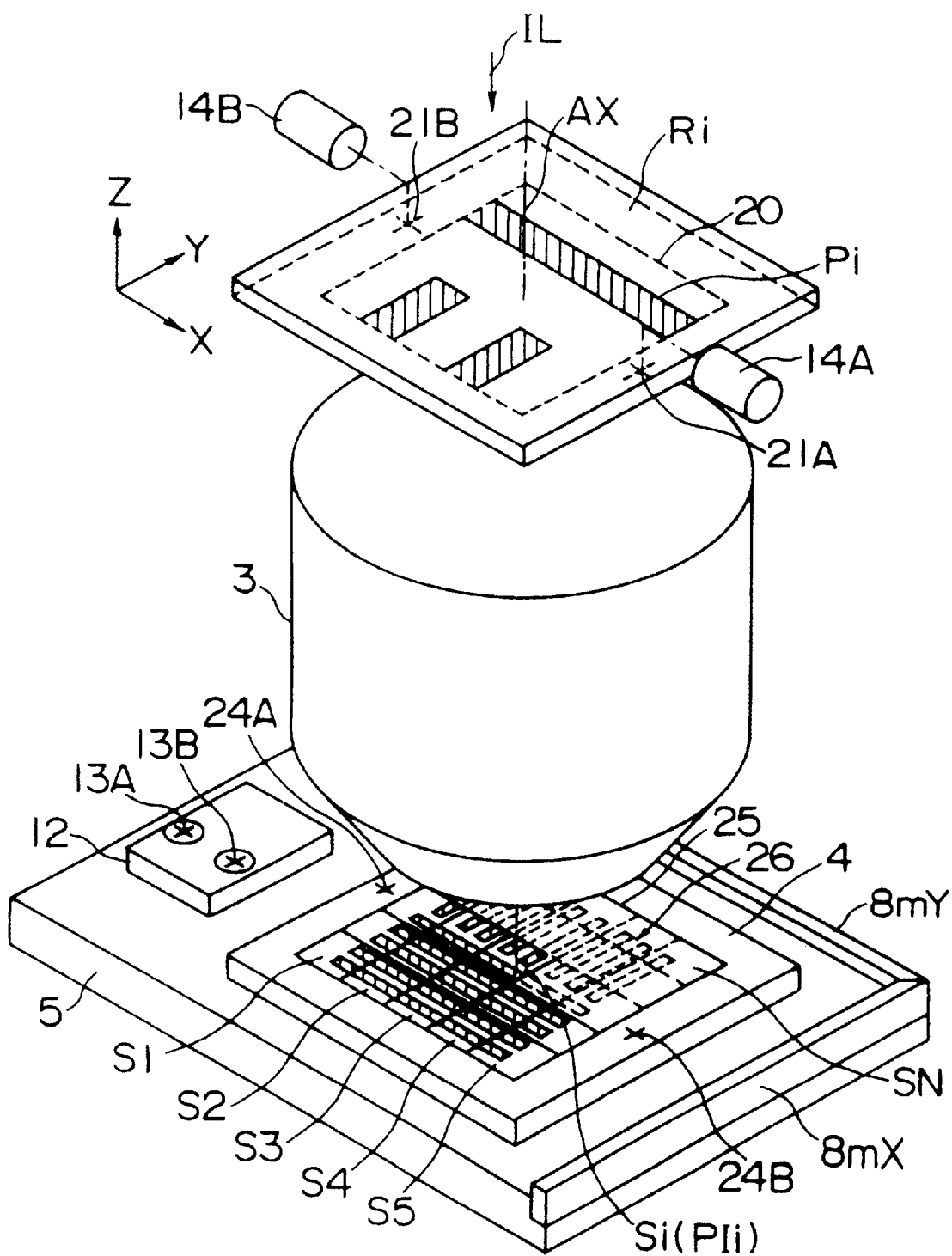
FIG. 4 is a perspective view of main parts showing a case of projecting a reduced image of a master pattern of a master reticle on to a substrate 4 in the projection exposure apparatus of FIG. 2.

As a result, the intervals between the center of the reference marks 13A and 13B and the center of the alignment marks 24A and 24B in the X-direction and Y-direction become ($XP_0$-$XP_1$, $YP_0$-$YP_1$). Therefore, by driving the XY stage 6 of FIG. 2 by exactly those intervals ($XP_0$-$XP_1$, $YP_0$-$YP_1$) with respect to the coordinates ($XF_0$, $YF_0$) of the sample table 5 at the time of alignment of the master reticle Ri, as shown in FIG. 4, it is possible to align the center of the alignment marks 24A and 24B of the substrate 4 (center of substrate 4) with the center of the projected images of the alignment marks 21A and 21B of the master reticle Ri (center of exposure) with a high accuracy. By driving the XY stage 6 of FIG. 2 to move the sample table 5 in the X-direction and Y-direction in this state, it is possible to expose the reduced image PIi of the master pattern Pi of the master reticle Ri at the desired position with respect to the center of the substrate 4.

That is, FIG. 4 shows the state of reducing and transferring the master pattern Pi of the i-th master reticle Ri on the substrate 4 through the projection optical system 3. In FIG. 4, a rectangular pattern area 25 centered at the center of the alignment marks 24A and 24B of the surface of the substrate 4 and bounded by sides parallel to the X-axis and Y-axis is virtually set in the main control system 9. The size of the pattern area 25 is the size of the master pattern of FIG. 1 reduced to $1/\alpha$. The pattern area 25 is divided equally into $\alpha$ sections in the X-direction and Y-direction to virtually set shot areas S1, S2, S3, ... SN ($N=\alpha^2$). The position of the shot area Si (i=1 to N) is set to the position of the reduced image PIi of the i-th master pattern Pi when reducing and projecting the master pattern 36 of FIG. 1 through the projection optical system 3 of FIG. 4.

When the imaging characteristics of the projected image of the projection exposure apparatus using the working reticle 34 of this example are ideal, the main control system 9 drives the XY stage 6 of FIG. 2 to align the center of the i-th shot area Si on the substrate 4 with the center of exposure of the reduced image PIi of the master pattern Pi of the master reticle Ri found by the above alignment. Next, the main control system 9 corrects the imaging characteristics as explained later, then projects and exposes the reduced image of the master pattern Pi on the shot area Si on the substrate 4. In FIG. 4, reduced images of the master pattern already exposed in the pattern area 25 of the substrate 4 are shown by solid lines, while unexposed reduced images are shown by broken lines.

By successively exposing reduced images of the master patterns P1 to PN of the N number of master reticles Ri to RN of FIG. 2 on the corresponding shot areas S1 to SN on the substrate 4 in this way, the reduced images of the master patterns P1 to PN are exposed while being stitched with the adjacent master patterns. Due to this, a projected image 26 of the master pattern 36 of FIG. 1 reduced to $1/\alpha$ is exposed on the substrate 4. Next, the photoresist on the substrate 4 is developed and etched and the remaining resist pattern is peeled off, whereby the projected image 26 on the substrate 4 becomes the master pattern 27 shown in FIG. 5 and the working reticle 34 is completed.

When exposing a single substrate 4, however, there is no exchange of the master reticles Ri, the substrate 4 is fixed to the sample table 5, and the position is accurately measured by the laser interferometer 8. Therefore, during the exposure of a single substrate 4, since the positional relationship between the reference marks 13A and 13B and the substrate 4 does not change, when changing the master reticles Ri, it is sufficient to position the master reticles Ri with respect to the reference marks 13A and 13B. It is not necessary to detect the positions of the alignment marks 24A and 24B on the substrate 4 for each master reticle. In this case as well, the master patterns Pi on the master reticles Ri are exposed held in an accurate positional relationship by the alignment with reference marks 13A and 13B and the positional control of the XY stage 6 by the stage control system 10 monitored by the laser interferometer 8. Therefore, of course, the stitching accuracy between patterns also becomes high.

Further, when forming for example dense patterns and isolated patterns on the master pattern 27 of FIG. 1, sometimes only dense patterns are formed on one master reticle Ra among the master reticles R1 to RN and only isolated patterns are formed on another single master reticle Rb. At this time, since the dense patterns and isolated patterns differ in the best illumination conditions, imaging conditions, and other exposure conditions, it is also possible to optimize the exposure conditions, that is, the shape and size of the aperture stop in the illumination optical system 1, the coherence factor ($\sigma$ factor), and the numerical aperture of the projection optical system 3 in accordance with the master pattern Pi. At this time, when the master pattern Pi consists of dense patterns (periodic patterns), the modified illumination system may be adopted and the shape of the secondary light source may be made annular or restricted to a plurality of local areas separated from the optical axis of the illumination optical system by substantially equal distances. Further, to optimize the exposure conditions, it is also possible to insert or remove optical filters (so-called pupil filters) for blocking the exposure light in circular areas center on for example the optical axis near the pupil plane of the projection optical system 3 or make dual use of the so-called progressive focal point method (flex method) for causing the image plane of the projection optical system 3 and the surface of the substrate 4 to vibrate with respect to each other in a predetermined range.

Further, it is possible to adopt the above progressive focal point method using the master mask as a phase shift mask and making the $\sigma$ value of the illumination optical system for example about 0.1 to 0.4.

Further, the photomask is not limited to a mask comprised of only a shielding layer of chrome and may also be a spatial frequency modulation type (Shibuya-Levenson type), edge enhancement type, halftone type, or other phase shift mask. In particular, in the spatial frequency modulation type or edge enhancement type, since the phase shifter is patterned overlaying the shielding pattern on the mask substrate, a separate master mask for the phase shifter is for example prepared.

Figure 6A:
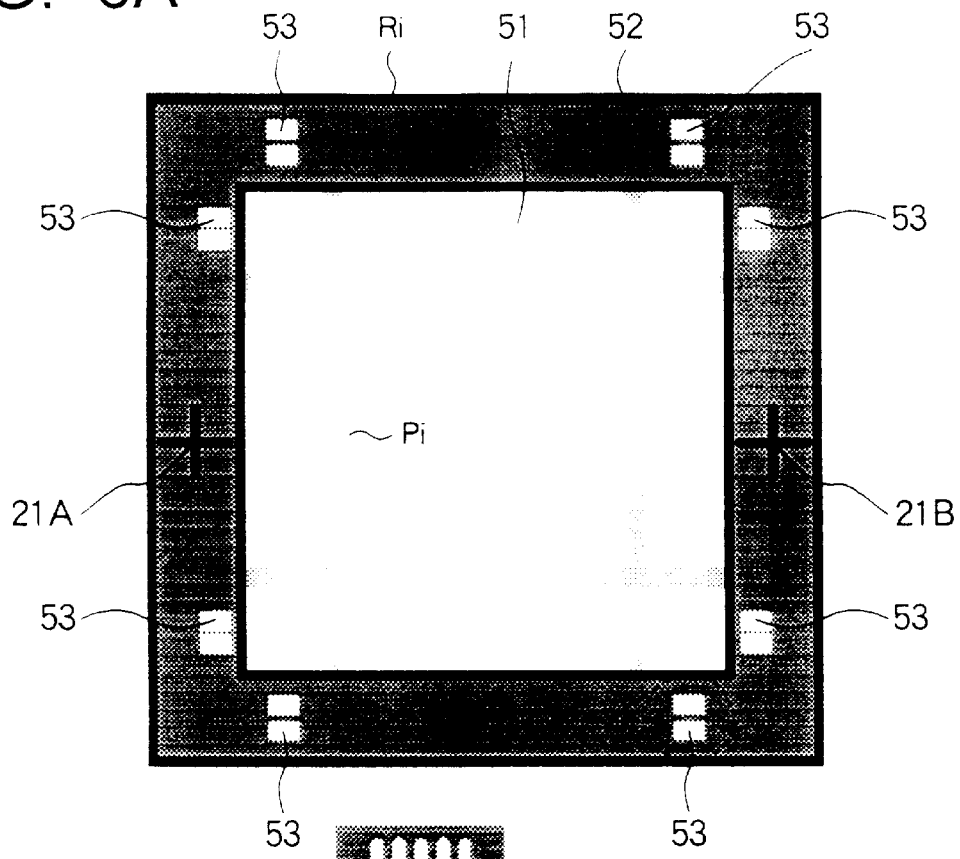
FIG. 6A is a plan view of the configuration of the master reticle of the first embodiment of the present invention.

Next, an explanation will be given of the correction of imaging characteristics in the first embodiment. As shown in FIG. 6A, two alignment marks 21A and 21B are formed in the shielding area (peripheral area) 52 outside the area in which the pattern (device pattern) Pi of the master reticle Ri is formed (pattern area). The peripheral area 52 is further formed with a plurality of spatial image measurement marks (first marks) 53. The spatial image measurement marks 53 are not limited in number or position, but in this embodiment two each are arranged at each of the sides of the pattern area 51 (boundary portion of pattern area 15 and peripheral area 52).

Figure 6B:
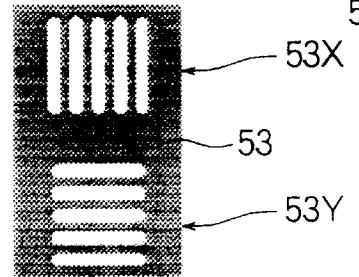
FIG. 6B is a view of an example of a mark of the master reticle of the first embodiment of the present invention.

The spatial image measurement marks 53 are, as shown in FIG. 6B, each comprised of a pair of mark elements 53X and 53Y. Each mark element 53X and 53Y is comprised of a line-and-space pattern comprised of a plurality of slits arrayed intermittently. The longitudinal direction of the slits of the spatial image measurement mark 53X and the longitudinal direction of the slits of the spatial image measurement mark 53Y are formed to perpendicularly intersect.

Figure 6C:
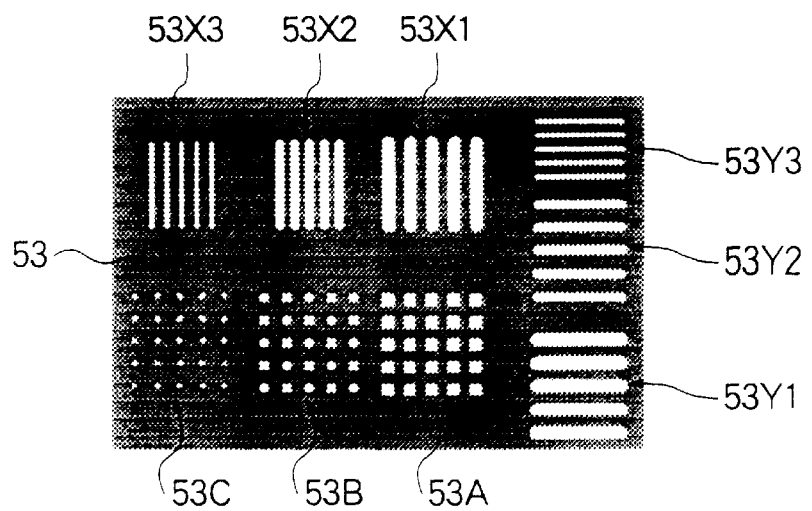
FIG. 6C is a view of another example of a mark of the master reticle of the first embodiment of the present invention.

Note that the spatial image measurement marks 53 are comprised of the pair of mark elements 53X and 53Y here, but it is also possible to provide a single mark element or, as shown in FIG. 6C, provide a combination of a plurality of mark elements 53X1, 53X2, 53X3, 53Y1, 53Y2, 53Y3, 53A, 53B, and 53C. The mark elements, in addition to the arrays of slits 53X1 to 53X3 and 53Y1 to 53Y3, may also be comprised of matrix arrays of a plurality of pinholes (including circular, rectangular, and other shapes) 53A to 53C. Further, the mark elements may be combinations of slits of different thicknesses (weights) and array intervals such as shown by 53X1 to 53X3 or 53Y1 to 53Y3 or combinations of pinholes of different sizes (diameters etc.) or array intervals as shown by 53A to 53C.

A configuration of the mark elements of a spatial image measurement mark 53 of a shape corresponding to the pattern Pi formed in the pattern area S1 may be adopted. When the pattern Pi is a line-and-space pattern, the slit arrays 53X1 to 53X3 and 53Y1 to 53Y3 may be adopted, while when the pattern Pi is an isolated pattern or contact hole (C/H) pattern, pin hole arrays 53A to 53C may be adopted. Having spatial image measurement marks 53 differ in shape between master reticles Ri is not desirable from the viewpoint of standardization etc., so it is also possible to use a combination of a plurality of types of mark elements such as shown in FIG. 6C and perform the measurement by selecting or combining mark elements corresponding to the shape or type of the pattern formed in the pattern area 51. The spatial image measurement marks 53 may be formed simultaneously with or in a separate process from the alignment marks 21A and 21B using an electron beam lithography system, laser beam lithography system, projection exposure apparatus (stepper, scanner), etc.

Figure 7:
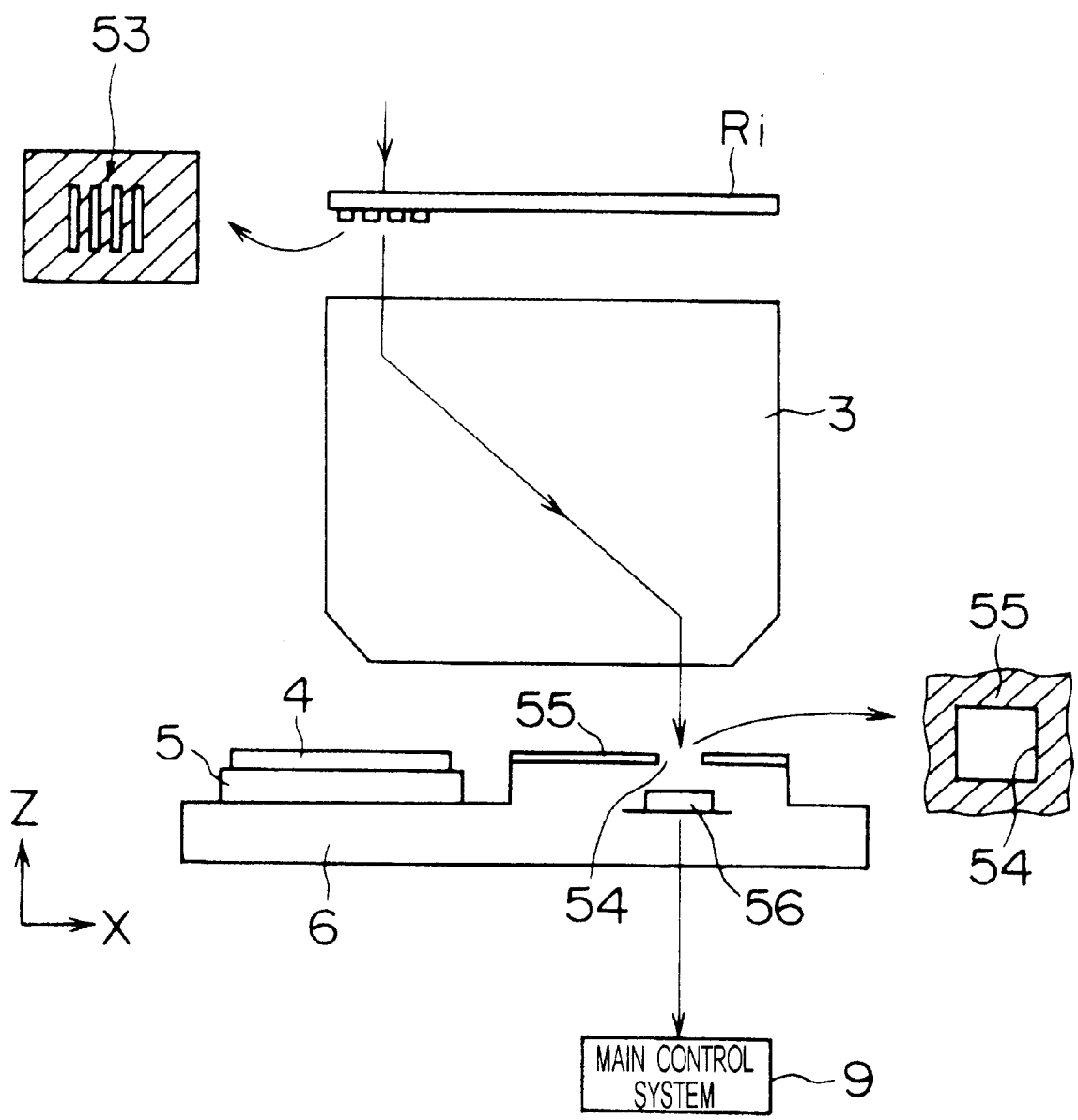
FIG. 7 is a view of the configuration for explaining measurement of a spatial image in the first embodiment of the present invention.

Next, an explanation will be given of a measurement device for such spatial image measurement marks 53. In FIG. 7, a light receiver for spatial image measurement of the images projected by the projection optical system 3 of the spatial image measurement marks 53 formed in the peripheral area 52 of the mask reticle Ri is provided on the XY stage 6. This light receiver is comprised of a photoelectric sensor (photoelectric conversion element) 56 provided beneath a light receiving plate 55 having a rectangular shaped (in this embodiment, a square shaped) aperture 54 as shown in the figure. The detection signal of the photoelectric sensor 56 is input to the main control system 9. Note that it is also possible to not provide the photoelectric sensor 56 under the aperture 54, but to use a light guide or the like to guide the light to another portion and detect the amount of light received by a photoelectric sensor etc. there.

Figure 8A:
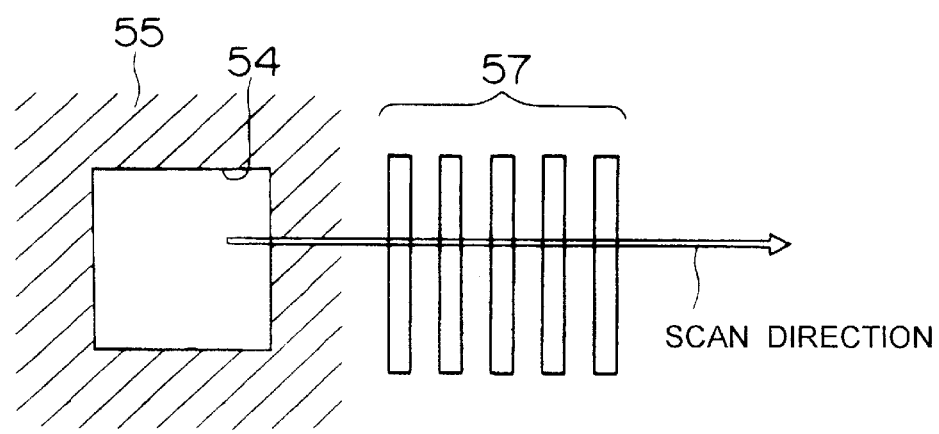
FIG. 8A is a view of the state of scanning a projected image of a mark for explaining the spatial image measurement in the first embodiment of the present invention.
Figure 8B:
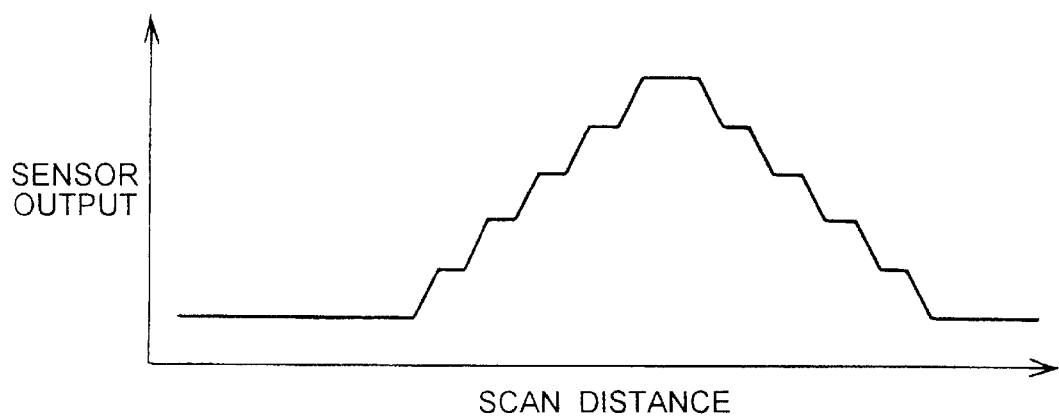
FIG. 8B is a view of the output of a photoelectric sensor for explaining the spatial image measurement in the first embodiment of the present invention.

When illuminating the master reticle Ri, images projected by the projection optical system 3 of the spatial image measurement marks 53 are formed on the surface of the light receiving plate 55. The main control system 9 moves the XY stage 6 to bring the light receiver of the spatial image measurement apparatus into proximity with a position corresponding to one projected image of a spatial image measurement mark 53. In that state, as shown in FIG. 8A, the aperture 54 of the light receiver is made to scan the projected image 57, whereby a signal as shown in FIG. 8B is detected by the photoelectric sensor 56. That is, the image of the head position slit in the scan direction among the plurality of slits (light passing portions) of the spatial image measurement mark 53 appears in the aperture 54, then the images of the adjacent slits successively appear. After all of the slits appear in the aperture 54, they successively move out of the aperture 54. Finally, the images of all of the slits move out from the aperture 54.

At this time, as shown in FIG. 8B, the output (amount of light received) of the photoelectric sensor 56 increases substantially in steps, peaks, then declines in steps along with the movement of the projected images 57 of the slits with respect to the aperture 54. Therefore, by detecting the coordinate position of the XY stage at the peak position of the detected values or the center portion of the signal found by slicing the differentiated signal (differentiated signal of FIG. 8B), it is possible to measure the position of the projected image of the spatial image measurement mark 53 in the X- or Y-direction. Further, if measuring the X,Y-coordinates at a plurality of Z-positions, the strength of the signal of FIG. 8B or the strength of the differentiated signal of the same will change. This signal strength peaks at the imaging plane. Further, by moving the stage 6 in the Z-direction (direction of optical axis of projection optical system) in the state with all or part of the images of the plurality of slits of the projected image of the spatial image measurement mark 53 in the aperture 54, the amount of light received by the photoelectric sensor 56 will gradually increase, peak at the state when in register with the imaging plane, and then gradually decline. Therefore, it is also possible to detect the imaging plane by detecting the position of the peak position in the Z-direction. Accordingly, by moving the stage in the Z-direction and X-direction or Y-direction independently or at an angle, it is possible to detect the projected image at the optimal imaging plane and possible to improve the accuracy of detection.

After alignment of the reticle Ri by the reticle alignment marks 21A and 21B, this spatial image measurement is performed on the projected images of the spatial image measurement marks 53 and the results of measurement are stored and held. Based on the results of the measurement, the imaging characteristics are corrected by for example adjusting the projection magnification using a magnification adjuster so as to reduce the amounts of offset of the positions of the projected images of the spatial image measurement marks 53 (image positions) from the corresponding ideal lattice (design positions). By transferring the pattern Pi of the pattern area 51 of the reticle Ri on to the photomask substrate 4 in this state, a highly accurate pattern can be transferred.

By doing this, it is possible to reduce deformation of the pattern due to distortion or coma aberration or other aberration of the projection optical system 3, projection magnification error, drawing error of the pattern of the master reticle Ri, rotation, shift, and other positional error of the master reticle Ri with respect to the projection optical system 3, bending and other deformation error of the master reticle Ri accompanying holding on the stage 2, and other error.

Here, since the spatial image measurement marks 53 are formed at the peripheral area of the master reticle Ri (they generally cannot be formed in the pattern area 51), even if adjusting conditions to give the optimal imaging characteristics for the spatial image measurement marks 53, the characteristics will not necessarily become optimal at the pattern area 51. Therefore, in this embodiment, the following measure is taken to realize higher accuracy pattern formation.

Figure 9:
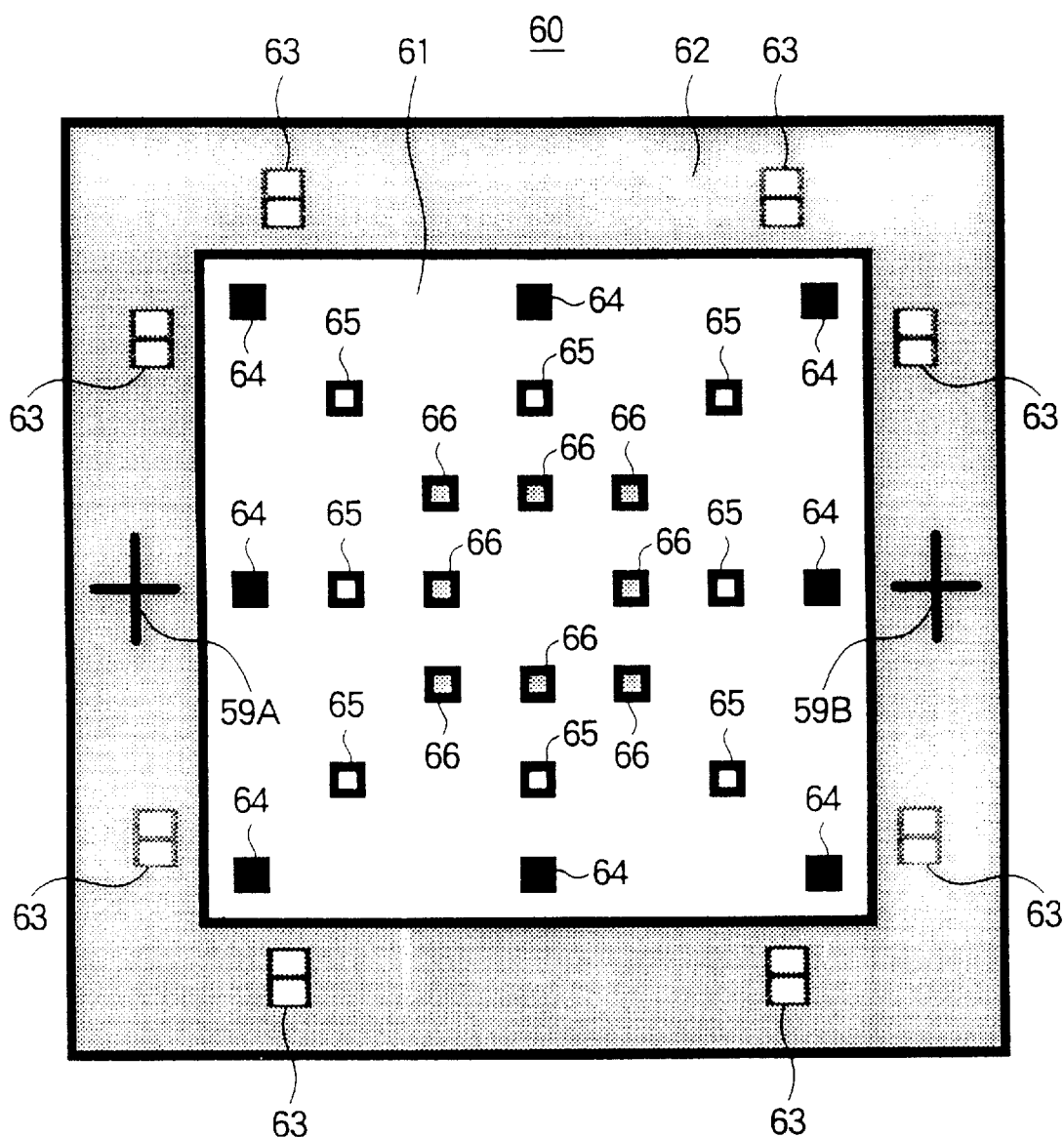
FIG. 9 is a plane view of the configuration of a control use reference mask of the first embodiment of the present invention.

First, a control use reference mask (reticle) 60 such as shown in FIG. 9 is prepared. This control use reference mask 60 is configured in the same way as an ordinary master reticle Ri and is produced through a similar process of production. That is, the area of the control use reference mask 60 (second area) 62 corresponding to the peripheral area, in the same way as the master reticle Ri, is formed with alignment marks 59A and 59B and spatial image measurement marks (third marks) 63. These alignment marks 59A and 59B and spatial image measurement marks 63 are of the same shapes as the alignment marks 21A and 21B and spatial image measurement marks (first marks) 53 of the master reticle Ri and are formed at the same positions (facing positions) by a similar method.

Further, a first area of the control use reference mask 60 (area corresponding to pattern area 51 of master reticle Ri) is formed with a plurality of spatial image measurement marks 64, 65, and 66. The first area 61 of the control use reference mask is divided into a plurality of areas from the center to the outside. Here, the second area 62 will be referred to as the area 1, the peripheral proximity portion of the first area 61 as the area 2, the area inside of that as the area 3, and the center portion of the first area 61 as the area 4. Eight spatial image measurement marks 64, 65, and 66 are formed in each of the area 2 to area 4. The spatial image measurement marks 64, 65, and 66 formed in these area 2 to area 4 are configured the same as the spatial image measurement marks 63 of the area 1, that is, are configured the same as the spatial image measurement marks 53 of the master reticle Ri. Note that the method of dividing the first area 61 is not limited to the above method of division. Other methods of division are also possible. Note that it is possible to measure the positions of the spatial image measurement marks 63 to 66 formed in these area 1 to area 4 in advance using a coordinate measuring device, find the amounts of offset from the ideal lattice (design positions), store and hold these values, and perform various corrections using the amounts of offset as correction values.

This control use reference mask 60 is placed and held on the reticle stage 2 of the exposure apparatus for producing the working reticles (reticle exposure apparatus) and illuminated with illumination light to form images projected by the projection optical system 3 on the stage 6. The spatial image measurement marks 64 to 66 formed in the area 1 to area 4 are measured in image positions in that state in the same way as measurement of the spatial image measurement marks 53 of the master reticle Ri.

Based on the results of measurement, the imaging characteristics are corrected to cancel out the various types of error of the reticle exposure apparatus. As the methods of correction of imaging characteristics, the following three ones may mainly be considered. These are however examples. Further, as items for adjustment to correct the imaging characteristics of the reticle exposure apparatus, for example, the projection magnification, rotation, shift, orthogonality, etc. may be mentioned, but for simplification of the explanation here, the explanation is given taking as an example the projection magnification of the projection optical system. Note that it is also possible to suitably select the methods of correction in accordance with the objective and possible to suitably select one or more items for adjustment to correct the imaging characteristics in accordance with the objective.

(a) Correction to Minimize Amount of Offset of All Points in Pattern Area From Ideal Lattice This method of correction considers the case where uniform accuracy is required over the entire pattern area 51 (areas corresponding to areas 2, 3, and 4 of control use reference mask 60). First, the positions of the projected images of the spatial image measurement marks 63, 64, 65, and 66 of the areas 1, 2, 3, and 4 of the control use reference mask 60 are measured and the average magnification errors in the area 1 and the areas 2 to 4 are calculated using the least square method etc. Here, the calculated magnification error area in the area 1 is defined as M1 and that of the area 2 to area 4 is defined as M234. Next, the projection magnification is corrected by a magnification adjuster (lens controller etc.) to minimize the error of the area 2 to area 4 from the ideal lattice. The magnification error M1' of the area 1 after this adjustment is measured or found by calculation and stored and held as a correction value.

When actually using the master reticle Ri for exposure of a blank 4, the position of the projected images of the spatial image measurement marks 53 formed at the peripheral area 52 of the master reticle Ri are measured. If the magnification error found based on the results of measurement is MM1, M1'–MM1 adjustment is performed by the magnification adjuster. Due to this, the same state is reproduced as the state where correction is made to minimize the error of the area 2 to area 4 from the ideal lattice of the control use reference mask 60 and the imaging characteristics become optimally corrected over the entire pattern area 51 of the master reticle Ri.

(b) Correction to Minimize Amounts of Offset of Points at Periphery of Pattern Area From Ideal Lattice This method of correction considers the case of stressing the accuracy (connection accuracy) of particularly the stitching portions of patterns. First, the positions of the projected images of the spatial image measurement marks 63 and 64 of the areas 1 and 2 of the control use reference mask 60 are measured and the average magnification errors in the area 1 and the area 2 are calculated using the least square method etc. Here, the calculated magnification error area in the area 1 is defined as M1 and that of the area 2 is defined as M2. Next, the projection magnification is corrected by a magnification adjuster (lens controller etc.) to minimize the error of the area 2 from the ideal lattice. The magnification error M1' of the area 1 after this adjustment is measured or found by calculation and stored and held as a correction value.

When actually using the master reticle Ri for exposure of a blank 4, the position of the projected images of the spatial image measurement marks 53 formed at the peripheral area 52 of the master reticle Ri are measured. If the magnification error found based on the results of measurement is MM1, M1'–MM1 adjustment is performed by the magnification adjuster. Due to this, the same state is reproduced as the state where correction is made to minimize the error of the area 2 from the ideal lattice of the control use reference mask 60 and the imaging characteristics become optimally corrected at the peripheral portion of the pattern area 51 of the master reticle Ri (portion corresponding to area 2 of control use reference mask 60).

(c) Correction to Reduce on Priority Basis Amounts of Offset of Points at Periphery of Pattern Area From Ideal Lattice and Reduce Amounts of Offset of Points Other than at Periphery of Pattern Area From Ideal Lattice as Well This method of correction considers the case of stressing the accuracy of the stitching portions of patterns and also stressing the accuracy of other portions though not to the extent of the stitching portions. First, the positions of the projected images of the spatial image measurement marks 63, 64, 65, and 66 of the areas 1, 2, 3, and 4 of the control use reference mask 60 are measured and the average magnification errors in the area 1, area 2, and area 34 (area of both the area 3 and area 4) are calculated using the least square method etc. Here, the calculated magnification error area in the area 1 is defined as M1, that of the area 2 is defined as M2, and that of the area 34 is defined as M34 Next, the projection magnification is corrected by a magnification adjuster (lens controller etc.) to reduce the error of the area 2 from the ideal lattice on a priority basis and to also reduce to a certain extent the error of the area 3 and area 4 from the ideal lattice. The magnification error M1' of the area 1 after this adjustment is measured or found by calculation and stored and held as a correction value.

When actually using the master reticle Ri for exposure of a blank 4, the position of the projected images of the spatial image measurement marks 53 formed at the peripheral area 52 of the master reticle Ri are measured. If the magnification error found based on the results of measurement is MM1, M1'–MM1 adjustment is performed by the magnification adjuster. Due to this, the same state is reproduced as the state where correction is made to reduce the error of the area 2 from the ideal lattice of the control use reference mask 60 on a priority basis and to also reduce to a certain extent the error of the area 34 from the ideal lattice. The imaging characteristics become corrected on a priority basis at particularly the peripheral portion of the pattern area 51 of the master reticle Ri (portion corresponding to area 2 of control use reference mask 60) and the imaging characteristics become corrected for the other areas as well (portions corresponding to area 34 of control use reference mask 60).

When calculating the magnification errors for each area by the above (a) to (c) (in (a), M1 and M234, in (b), M1 and M2, and in (c), M1, M2, and M34) and when finding the magnification error M1' of the area 1, the magnification error is corrected based on the above correction values (amounts of offset of measurement positions of spatial image measurement marks 63 to 66 formed in area 1 to area 4 from ideal lattice).

Here, a more detailed explanation will be give of the case of (c), that is, the correction to reduce the amounts of offset of points at the periphery of the pattern area 51 from the ideal lattice on a priority basis and reduce by a certain amount the amounts of offset of points other than at the periphery of the pattern area from the ideal lattice as well. Note that here, as the items for adjustment for correction of the imaging characteristics of the reticle exposure apparatus, not only the projection magnification of the projection optical system, but also the rotation, shift, and orthogonality are considered. Further, it is assumed that the adjustment of the projection magnification by the magnification adjuster can be performed independently in the X-direction and Y-direction.

First, the measured values when measuring the image positions of the spatial image measurement marks 63 of the area 1 of the control use reference mask 60 are defined as (u1i, v1i), the measured values when measuring the image positions of the spatial image measurement marks 64 of the area 2 control use reference mask 60 are defined as (u2j, v2j), and the measured values when measuring the image positions of the spatial image measurement marks 65 and 66 of the area 34 control use reference mask 60 are defined as (u34k, v34k). Here, i is the number of measurement points in the area 1, j is the number of measurement points in the area 2, and k is the number of measurement points in the area 34. Each is an integer larger than 1. Note that in this embodiment, i=8, j=8, and k=16.

Next, the amounts of offset (error) from the ideal lattice in area 2 and area 34 can be considered to be approximated by the following linear model:

$$\begin{bmatrix} Xn \\ Yn \end{bmatrix} = \begin{bmatrix} a & b \\ c & d \end{bmatrix} \begin{bmatrix} xn \\ yn \end{bmatrix} + \begin{bmatrix} e \\ f \end{bmatrix} \quad (L1)$$

In equation (L1), (Xn, Yn) are the model coordinates, while (xn, yn) are the design coordinates of the n-th measured values.

$$E \equiv E2 + E34 \quad (L2)$$

$$E2 \equiv \sum_j W2 \times j(u2j - Xj)^2 + W2yj(v2j - Yj)^2 \quad (L3)$$

$$E34 \equiv \sum_k W34 \times k(u34k - Xk)^2 + W34yk(v34k - Yk)^2 \quad (L4)$$

a, b, c, d, e, and f giving the smallest E defined by equations (L2) to (L4) are found by the least square method.

Here, W2$xj$, W2$yj$, W34$xk$, and W34$yk$ are parameters (weighting coefficients) for changing the ratio of the residual error from the model equations at area 2 and area 34 and the ratio of the residual errors of the X component and Y component from the models when finding model equations for correcting the error. That is, they are coefficients expressing priority (weight) when giving preference in accuracy in accordance with the position of a pattern in the pattern area 51 (for example, at the peripheral portion or center portion) or giving preference in accuracy in accordance with the direction of the pattern (X-direction, Y-direction). By suitably setting the parameters, a model equation weighted to both the positional accuracy and connection accuracy of patterns simultaneously or to just one of the same can be found.

As one example, consider the case where the following conditions (rules) are given:

(a) The area 2 (that is, the outside portion of the pattern area) is the connection portion with the pattern of another master reticle (connection portion of two patterns), so has to be made ½ of the required accuracy of the area 34.

(b) The positional accuracy or connection accuracy of line patterns becomes stricter in inverse proportion to the line width of the lines.

In this case, the weighting coefficients may be set as follows:

W2$xj$=2/L2$xj$

W2$yj$=2/L2$yj$

W34$xk$=1/L34$xk$

W34$yk$=1/L34$yk$ where, L2$xj$ is the line width of the j-th line pattern extending vertically (up-down direction in FIG. 9) in the area 2, L2$yj$ is the line width of the j-th line pattern extending horizontally (right-left direction in FIG. 9) in the area 2, L34xk is the line width of the k-th line pattern extending vertically in the area 34, and L34yk is the line width of the k-line pattern extending horizontally in the area 34.

By setting the weighting coefficients in this way, model equations giving a higher accuracy to the area 2 than the area 34, that is, stressing more the connection accuracy with other patterns, are found.

Note that here the case was considered where there were both line patterns extending vertically in an area and line patterns extending horizontally, but when there are only line patterns extending horizontally in the area, it is possible to set W2xj and W34xk to small values (in extreme cases to 0), while when there are only line patterns extending vertically in the area, it is possible to set W2yj and W34yk to small values (in extreme cases to 0).

Further, all of the four sides of the rectangular pattern area do not always have to form connection portions. For example, as shown in FIG. 10, when considering the production of a working reticle 34 by using four master reticles R1 to R4 (master 1 to master 4) and transferring these patterns on a blank 4 as shown in FIG. 10, there are connection portions at the left side and bottom in the case of the top right master reticle (master 1) R1, but no connection portions at the top and the right side. In this case, therefore, a large weight is set for connection portions and small weight (in extreme cases 0) for the portions not connection portions.

Next, an explanation will be made of an example of the operation in the case of exposure using the working reticle 34 of FIG. 1 produced in the above way.

Figure 5:
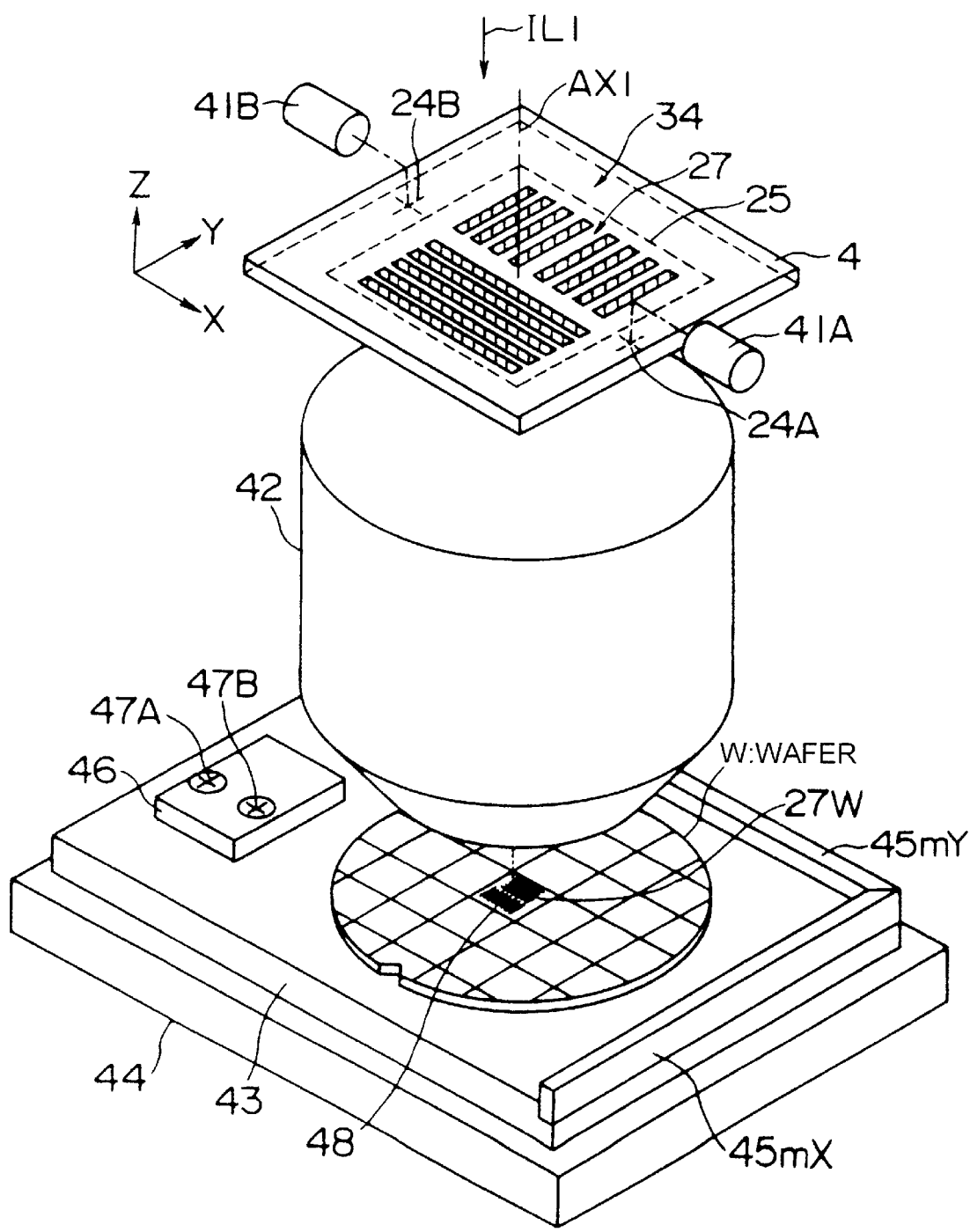
FIG. 5 is a perspective view of main parts showing a projection exposure apparatus for projecting a pattern of a working reticle produced by the first embodiment of the present invention on a wafer.

FIG. 5 shows main parts of a reduction projection type exposure apparatus (device exposure apparatus) mounted with the working reticle 34. In FIG. 5, a wafer W is arranged at the bottom of the working reticle 34 held on a not shown reticle stage across a projection optical system 42 of a reduction magnification of $1/\beta$ ($\beta$ is 5, 4, etc.) The surface of the wafer 2 is coated with a photoresist and held so as to be aligned with the image plane of the projection optical system 42. The wafer W is held on the sample table 43 through a not shown wafer holder, and the sample table 42 is fixed on the XY stage 44. The wafer W is positioned by driving the XY stage 44 based on the coordinates measured by the moving mirrors 45mX and 45mY above the sample table 43 and the corresponding laser interferometers.

Further, a reference mark member 46 formed with reference marks 47A and 47B is fixed on the sample table 43. The working reticle 34 is formed with alignment marks 24A and 24B so as to sandwich the pattern area 25 in the X-direction. The alignment marks 24A and 24B, as shown in FIG. 3, are used as alignment marks when transferring the master pattern Pi on a photomask substrate (blank) 4 for producing a working reticle 34. Above these alignment marks 24A and 24B are arranged alignment sensors 41A and 41B for reticle alignment. In this case as well, the working reticle 34 is aligned with respect to the sample table 43 (orthogonal coordinate system XY defined by two laser interferometers) using the reference marks 47A and 47B, the alignment marks 24A and 24B, and the alignment marks 41A and 41B.

Next, when performing overlay exposure, a not shown wafer use alignment sensor is used for alignment of the shot areas 48 on the wafer W. By successively positioning the shot areas 48 to be exposed on the wafer W at the exposure position, then irradiating the pattern area 25 of the working reticle 34 with excimer laser light or other illumination light IL1 from a not shown illumination light system, a reduced image 27W of a reduction magnification of $1/\beta$ of the master pattern 27 in the pattern area 25 is exposed on the shot areas 48. After exposing the shot areas of the wafer W with the reduced image of the master pattern 27 in this way, the wafer W is developed, etched, and otherwise processed to form a circuit pattern of a certain layer of a semiconductor device in each shot area on the wafer W.

According to the above first embodiment, spatial image measurement marks (first marks) 53 are formed in a peripheral area 52 at the periphery of a pattern area 51 in which the pattern Pi of a master reticle Ri is formed, positions (second image positions) of projected images of the spatial image measurement marks 64, 65, and 66 of the control use reference mask 60 having a first area 61 corresponding to the pattern area 51 of the master reticle Ri formed with the spatial image measurement marks (second marks) 64, 65, and 66 and having a second area 62 corresponding to the peripheral area 52 of the master reticle Ri formed with spatial image measurement marks (third marks) 63 facing the spatial image measurement marks 53 are measured, and the positions (third image positions) of the projected images of the spatial image measurement marks 63 in the state with the imaging characteristics preliminarily corrected to reduce the amount of offset of the second image positions from the ideal positions (ideal lattice) are measured or found by calculation. Further, the positions (first image positions) of the projected images of the spatial image measurement marks 53 of the master reticle Ri are measured and the master patterns Pi of master reticles Ri are successively transferred to the blank 4 in the state with the imaging characteristics corrected so that the first image positions become in register with (or in proximity to) the third image positions. Therefore, by just measuring the first image positions for each master pattern Pi, it is possible to reproduce imaging characteristics of the case when using the control use reference mask 60 to correct them so that the image positions of the spatial image measurement marks (marks formed in first area 51 corresponding to pattern area 51) approach the ideal positions, possible to improve the positional accuracy and connection accuracy of the patterns, and possible to produce a photomask 34 having a high accuracy pattern.

Note that in the first embodiment, the spatial image measurement marks 53 and 63 are formed at the same positions in the master reticles Ri and the control use reference mask 60, but offset sometimes occurs in the mark positions between the master reticles Ri and the control use reference mask 60 due to drawing error etc. In this case, by measuring the positions of the facing the spatial image measurement marks 53 and 63 of the master reticles Ri and the control use reference mask 60 by a coordinate measurement device etc., storing and holding the amounts of offset as correction values, and considering these amounts of offset when correcting the imaging characteristics of the master reticles Ri, it is possible to eliminate error based on the offset of the marks themselves. Further, the spatial image measurement marks 53 and 63 of the master reticles Ri and the control use reference mask 60 do not necessarily have to be formed at facing positions (same positions) and may be provided at nonfacing positions (offset positions) as well so long as the mutual positional relations are clear. In this case, it is sufficient to not only correct for the case of error between marks, but also correct for distortion, coma aberration, projection magnification error, bending of the master reticles, and other error by the differences in positions of the spatial image measurement marks 53 and 63.

Further, in the first embodiment, the marks 53 and 63 to 66 formed in the master reticles Ri and the control use reference mask 60 were made spatial image measurement marks suited for measurement by spatial image measurement method, but they are not limited to such spatial image measurement marks and may also be refraction lattice marks or other marks. Further, the spatial image measurement marks 64, 65, and 66 formed in the first area 61 of the control use reference mask 60 are not limited to those shown in FIG. 9, for example, may be formed at equal intervals in a matrix, and are also not limited to the above numbers. Various methods of dividing the areas during weighting may also be adopted. These spatial image measurement marks 53 and 63 to 66 may be formed using the projection exposure apparatus shown in FIG. 2 and may be formed using an exposure apparatus using charged particle beams (electron beams, ion beams, etc.) or a laser beam lithography system.

In addition, in the first embodiment, the explanation was given of a reticle exposure apparatus designed to using a plurality of master reticles Ri to successively transfer patterns on a blank 4 while stitching them, but the invention may of course also be applied in the same way to a device exposure apparatus (for example, an exposure apparatus for producing a liquid crystal display element) designed to using a plurality of working masks produced in the above way or by a separate method to successively transfer patterns on to a device substrate while stitching them and to cases with no stitching.

Further, the method of correction of the imaging characteristics is not limited to the above ones. Various methods may be adopted. For example, it is also possible to shift the position of a master reticle in the image field of the projection optical system 3, that is, a plane orthogonal to its optical axis or to move the master reticle in a direction parallel to the optical axis or tilt the master reticle with respect to the object plane of the projection optical system 3 (plane orthogonal to its optical axis).

Further, it is also possible to correct the imaging characteristics at a plurality of master reticles used for the production of a working reticle or to correct the imaging characteristics at only a specific master reticle. This may be realized by changing the size, shape, etc. of the master patterns formed in the master reticles Ri. Further, it is also possible to correct the imaging characteristics by for example adjusting the projection magnification for one or more master reticles among all of the master reticles and correct the imaging characteristics by for example rotating the reticles for other master reticles. Note that it is also possible not to correct the imaging characteristics for some master reticles.

Further, when using an exposure apparatus which holds the master reticle and substrate substantially stationary to transfer the pattern to the substrate (stepper) as the reticle exposure apparatus of FIG. 2, it is possible to use the reticle blind (field stop) arranged in the illumination optical system 1 to divide the master pattern of the master reticle into a plurality of sections and transfer these to the substrate and to correct the imaging characteristics for each of the plurality of sections on the master reticle.

Further, when using a scan exposure apparatus as the reticle exposure apparatus of FIG. 2 to transfer the pattern of a master reticle on to the substrate 4, the master reticle and the substrate are made to move relative to the projection optical system 3. Therefore, in the scan exposure apparatus, it is possible to drive a reticle blind (field stop) arranged in the illumination optical system 1 and restricting the area on the master reticle illuminated by the exposure light so as to make the position of the illuminated area in the image field of the projection optical system 3 shift. Further, it is also possible to make the master reticle and substrate synchronously move while shifted somewhat in scan direction or to make the master reticle synchronously move with the substrate while rotating it slightly so as to correct the imaging characteristics, particularly the image distortion etc. Further, it is also possible to movie at least one optical element in the projection optical system 3 so as to correct the imaging characteristics. In addition, it is possible to change the scan speeds of the master reticle Ri and the substrate 4 slightly from a predetermined speed ratio to correct the imaging characteristics (in particular, the magnification relating to the scan direction).

Further, since a plurality of master reticles Ri are successively exchanged to transfer the master patterns Pi to the substrate 4, the time required for exposure of the substrate 4 becomes longer compared with exposure of a wafer W using a working reticle 34. Also when the projection exposure apparatus uses excimer laser light as the exposure light, a chemical amplification type resist is used for the substrate 4. Therefore, sometimes the line width of the pattern image of for example the first master reticle R1 among the plurality of pattern images (resist patterns) formed on the substrate 4 after development will not become the target line width. That is, since the time from exposure to development differs in the N number of master pattern images transferred on a substrate 4, in extreme cases the amount of change of the line width will differ with each master pattern image. Therefore, it is desirable to measure the amount of change of the line width for each master reticle or find it by simulation and finely adjust the amount of exposure of the substrate 4 (resist) in accordance with the amount of change when transferring the master patterns. Due to this, since the amount of exposure is adjusted for each master pattern, the change in line width of the resist patterns can be held to the minimum. Note that the amount of exposure may be adjusted for each master reticle. Also, the amount of exposure may be adjusted for every several master reticles.

Further, when the projection exposure apparatus shown in FIG. 2 to FIG. 4 is a stationary exposure type, for example, a step-and-repeat type, the amount of exposure of the substrate 4 (resist) is adjusted by changing at least one of the intensity and irradiation time (exposure time) of the exposure light on the substrate 4 when the exposure light is continuous light (i-rays etc.) and by changing at least one of the intensity and number of pulses of the exposure light on the substrate 4 when the exposure light is pulse light (excimer laser etc.) On the other hand, when the projection exposure apparatus shown in FIG. 2 to FIG. 4 is a scan exposure type, for example, the step-and-scan type, the amount of exposure of the substrate 4 (resist) is adjusted by changing at least one of the intensity of the exposure light on the substrate 4, the scan speed of the substrate 4, and the width of the area irradiated by the exposure light in the scan direction on the substrate 4 when the exposure light is continuous light and by changing at least one of the intensity of the exposure light on the substrate 4, the scan speed of the substrate 4, the width of the area irradiated by the exposure light in the scan direction on the substrate 4, and the oscillation frequency of the exposure light (pulse light source) when the exposure light is pulse light.

An enlarged device pattern of the device pattern to be formed on the working reticle 34 may be divided into element patterns, for example, divided into dense patterns and isolated patterns or divided into functional blocks (CPU, memory, etc.), to form master reticles and thereby eliminate or reduce the connection portions between master patterns on the substrate 4. In this case, since, depending on the device pattern of the working reticle, the master pattern of a single master reticle is sometimes transferred on to a plurality of areas on the substrate 4, it is possible to reduce the number of master reticles used for production of a working reticle. Note that even when there are no connection portions between master patterns, this is called "stitching exposure" in the present specification. That is, the term "stitching exposure" includes the case of production of a system LSI and the case of dividing an enlarged pattern taking note of the functional blocks to reduce the connections at the boundaries of shot areas on the substrate 4 to substantially zero.

In the first embodiment, the patterns of a plurality of master reticles were transferred on to the substrate 4 in the same exposure apparatus, but it is also possible to use a plurality of exposure apparatuses to transfer the patterns of a plurality of master reticles on the substrate 4. For example, the same number of exposure apparatuses as the number of master reticles required for production of a single working reticle may be prepared, a first exposure apparatus used to transfer the pattern of a first master reticle on to the substrate, then the substrate loaded into the second exposure apparatus where the pattern of the second master reticle is then transferred to the substrate. The remaining exposure apparatuses similarly transfer the patterns of their master reticles to the substrate after this to form the device pattern on the substrate. At this time, the control use reference mask is used to measure the positions of the projected images of the marks for each exposure apparatus and the imaging characteristics are corrected for each exposure apparatus so as to reduce the amounts of offset of the positions of the projected images from the ideal positions. Note that there may also be two or more master reticles provided at each of the plurality of exposure apparatuses. Further, the same exposure apparatus may be used when transferring the pattern of a single master reticle to a plurality of areas on a substrate.

Further, in the first embodiment, third positions determined using the control use reference mask 60 were stored, the projection positions (first image positions) of the spatial image measurement marks 53 of the master reticle Ri were measured at the time of transfer of the master pattern Pi, and the imaging characteristics were corrected so as to bring the first image positions into register with or proximity to the third image positions. Here, the optical characteristics of the projection optical system change due to the heat energy accumulated in the projection optical system at the time of transfer of master patterns and changes in the environmental conditions (atmospheric pressure etc.) etc. Therefore, the third image positions may also change along with the change of the characteristics. Accordingly, after determining the third image positions using the control use reference mask 60, it is preferable to correct the third image positions in accordance with the heat energy and the changes in the environment conditions etc. and correct the imaging characteristics so that the previous first image positions become in register with or proximity to the corrected third image positions. Normally, in an exposure apparatus, the optical characteristics, for example, the projection magnification, focal position, image plane curvature, distortion, etc., are calculated in accordance with the heat energy and the changes in the environmental conditions, so these calculations may be utilized as they are to calculate the change in the third image positions. Further, when the amount of change of the third image positions reaches a predetermined allowable value, the third image positions are preferably determined again using the control use reference mask 60. This enables the prevention of the problem of the difference between the afore-mentioned calculated values and actually measured values of the third image positions becoming greater, that is, the accuracy of transfer of master patterns from falling.

According to the first embodiment, the imaging characteristics were corrected to reduce the amount of offset of the projected images from the ideal positions, so there is less error in the position and shape of the patterns formed on the photosensitive substrate and a high accuracy, high quality microdevice or photomask can be produced. Further, since the plurality of mask patterns are parts of an enlarged pattern of the pattern to be transferred, they can be drawn with less drawing data and with small drift in a short time by for example an electron beam lithography system or laser beam lithography system. Since the drawing error of the marks becomes smaller by the ratio of reduction magnification of the patterns of the masks, the pattern for transfer (master pattern) can be formed with a high accuracy. Further, since the masks may be repeatedly used once produced, there is the advantage that individual master patterns may be formed at a high accuracy in a short time even when producing a large number of photomasks.

Second Embodiment

Figure 11A:
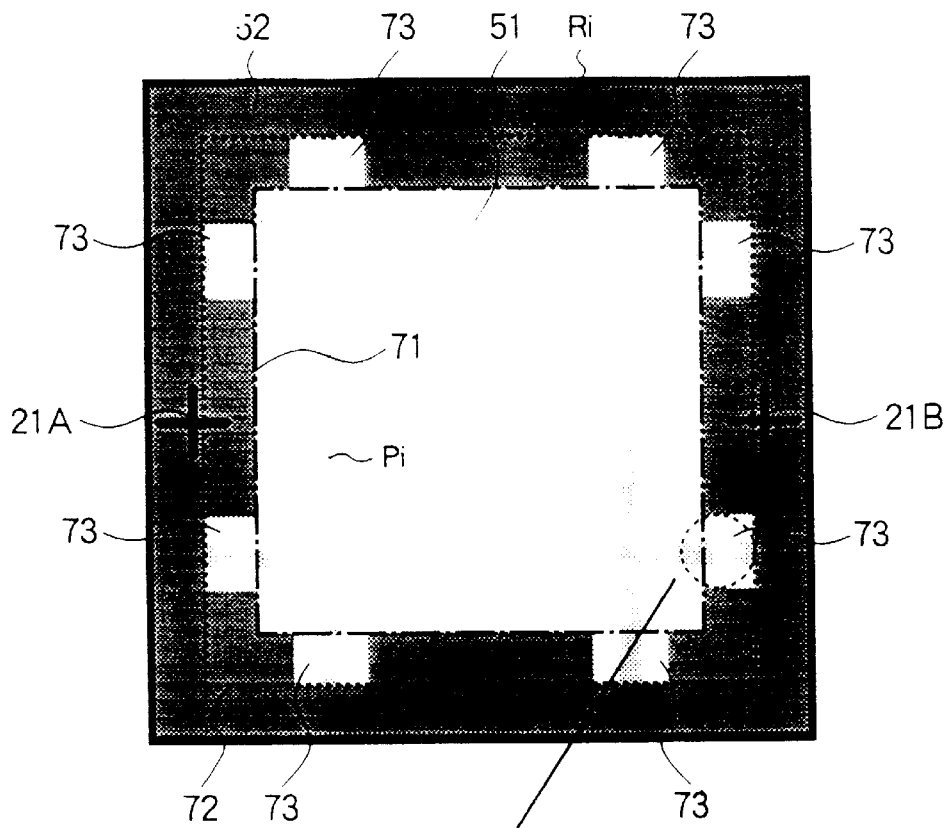
FIG. 11A is a plan view of the configuration of a reticle of a second embodiment of the present invention.
Figure 11B:
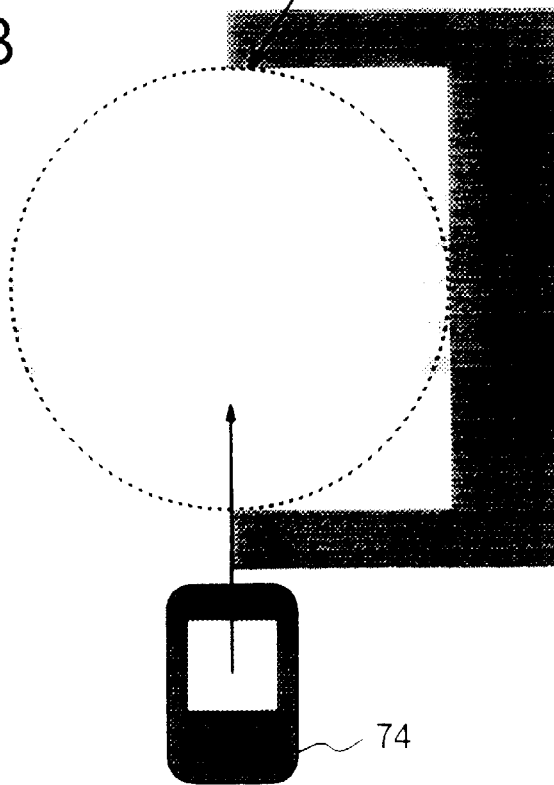
FIG. 11B is an enlarged view of the main parts of a reticle of the second embodiment of the present invention.

FIG. 11A and FIG. 11B are views for explaining a second embodiment of the present invention. FIG. 11A shows the configuration of a master reticle Ri, while FIG. 11B is view of an enlargement of part of FIG. 11A (mark portion). Components substantially the same as those of the first embodiment discussed above are assigned the same references and explanations thereof are omitted.

In the second embodiment, part or all of the proximity of the boundary portion 71 with the pattern area 51 in the light shielded area (peripheral area) 52 at the periphery of the pattern area 51 of the master reticle Ri is made transparent. Part or all of the pattern formed in the pattern area 51 (made line-and-space pattern) Pi is made to reach the light shielded part. That portion is used as the mark portion 73 for spatial image measurement. Further, the reticle blind (field stop) is opened wide to become as shown by the broken line 72 in the figure, the mark portion 73 is illuminated, the position of the projected image of the mark portion 73 is measured by the spatial image measurement apparatus 74, and the imaging characteristics are corrected to minimize the amount of offset of the image position of the mark portion 73 from the ideal position. Next, the reticle blind is set to the normal shot size 71, the mark portion 73 is shielded, and the pattern of the reticle Ri is transferred to the blank 4. By doing this, since the projected image of the peripheral portion of the pattern area of the master pattern Pi of the pattern area 51 and the projected image of the mark portion 73 are the same in coma aberration, distortion, drawing error, and the effects of bending of the master reticle, the accuracy of the peripheral portion (connection portion) of the transferred pattern can be raised. In particular, when stitching, the continuity of position and shape of patterns can be improved.

When the transferred pattern Pi cannot be made to reach the peripheral area 52 such as with the reticle shown in FIG. 11A and FIG. 11B, the accuracy of the connection portion of the pattern to be transferred can be raised in substantially the same way as the above by forming a spatial image measurement mark having similar slit widths and intervals as the line-and-space pattern formed in the pattern area 51 at the boundary portion with the pattern area 51. Further, it is possible not to provide this mark portion, but to measure by spatial image measurement the projected image of the line-and-space pattern formed in the pattern area 51 itself and correct the imaging characteristics based on the results. The rest of the configuration and effects are analogous to those of the first embodiment, so explanations will be omitted.

In the above explanation, the blind size at the time of spatial image measurement was made 72, but it is also possible to further reduce the aperture of the reticle blind to a small aperture exactly the size of the mark portion 73 and reduce the deterioration of accuracy accompanying a rise in temperature of the projection optical system 3 due to the irradiation of unnecessary light on the projection optical system 3 at the time of spatial image measurement.

Third Embodiment

Next, a third embodiment of the present invention will be explained with reference to the drawings. The projection exposure apparatus for producing a working reticle (reticle exposure apparatus) in the third embodiment is substantially the same in configuration as the projection exposure apparatus of the above first embodiment (FIG. 2 to FIG. 4). The projection exposure apparatus for producing the microdevice (device exposure apparatus) is substantially the same in configuration as that of the first embodiment (FIG. 5). Therefore, explanations of these will be omitted. Further, the embodiment is also basically the same in the process of production of a working reticle explained with reference to FIG. 1, so the explanation of this point as well will be omitted.

The pattern of the working reticle (photomask) 34 produced is obtained by successively projecting and transferring reduced images of a plurality of master reticles Ri while stitching them. Due to various factors in the reticle exposure apparatus used for production of the working reticle 34 and the device exposure apparatus using the working reticle 34, a pattern distorted from the ideal image ends up being transferred and formed on the device substrate (W) and so the accuracy and quality of the microdevice produced fall. Therefore, in the third embodiment, the distortion of the pattern occurring at the time of production of the photomask and at the time of the production of the microdevice is measured, the drawing data for the master patterns Pi to be formed on the master reticles Ri is corrected, and the master patterns Pi are formed based on the corrected drawing data. This will be explained in detail below.

Figure 12:
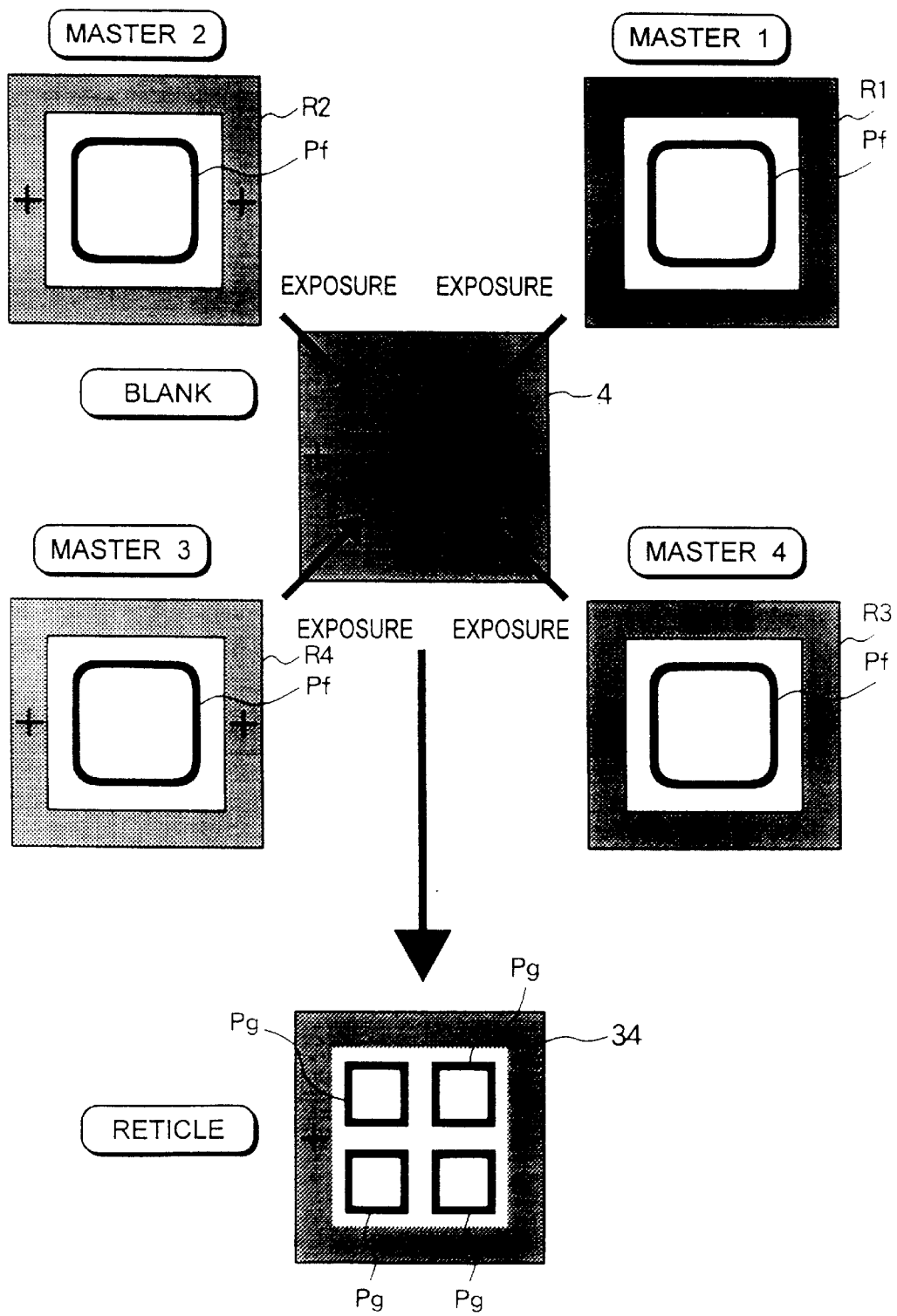
FIG. 12 is a view explaining the case of producing a working reticle using master reticles formed with patterns after correction in a third embodiment of the present invention.
Figure 13:
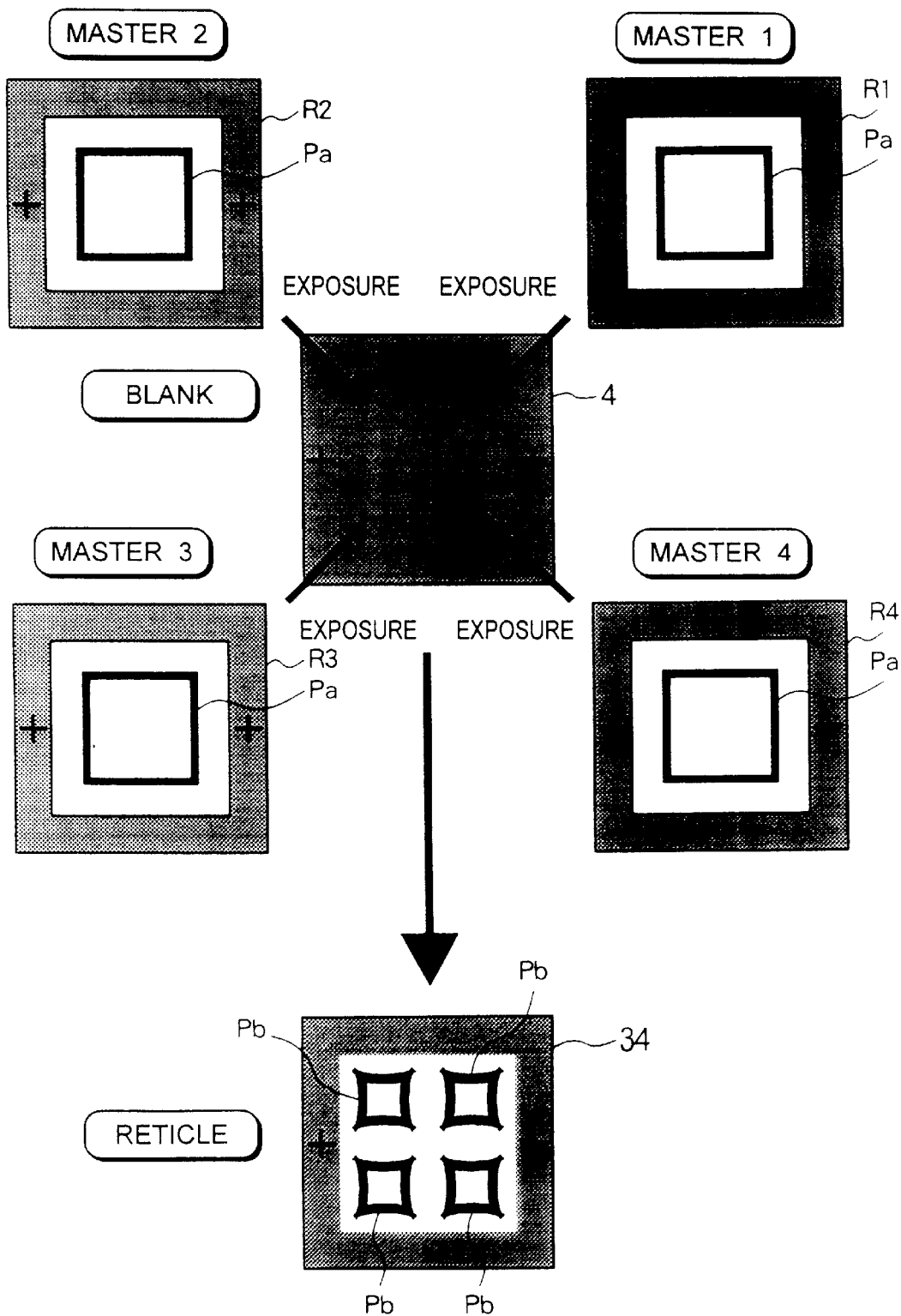
FIG. 13 is a view of the case of producing a working reticle using master reticles formed with patterns before correction in the third embodiment of the present invention in comparing with FIG. 12.
Figure 14:
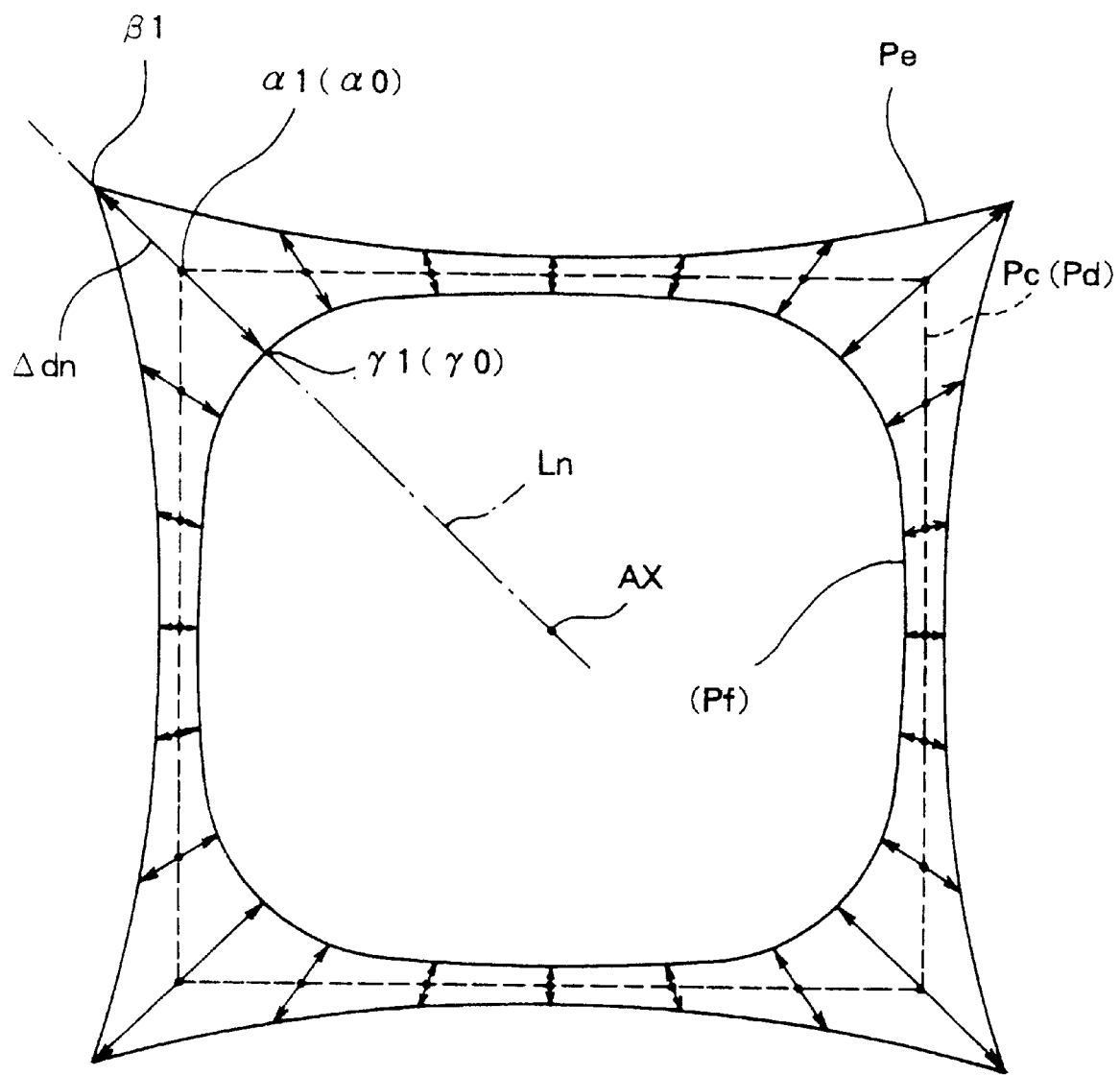
FIG. 14 is a view explaining the measurement and correction of displacement for producing the master reticle shown in FIG. 12.

FIG. 12 and FIG. 13 are views explaining the correction of master patterns for producing a master reticle. FIG. 12 shows the case of producing a working reticle using master reticles formed with master patterns after correction, while FIG. 13 shows the case of producing a working reticle using master reticles formed with master patterns before correction for comparison. FIG. 14 is an explanatory view of the measurement of displacement (distortion) due to the production of the master reticles shown in FIG. 12 and the correction of the drawing data.

For example, the explanation will be given taking as an example the case where there is pincushion distortion in the projection optical system 3 of the reticle exposure apparatus as shown in FIG. 2. In FIG. 13, Ri (i=1 to 4) are master reticles. Here, to simplify the explanation, it is assumed that the patterns Pa of four master reticles R1 to R4 (master 1 to master 4) formed with rectangular patterns Pa as master patterns are transferred on the mask substrate (blank) 4. If transferring the patterns Pa of the mask reticles Ri on the mask substrate 4 while stitching them, due to the distortion, the rectangular patterns Pa distort in projected image in a pincushion fashion and a working reticle 34 formed with distorted patterns Pb is produced.

Therefore, in the third embodiment, as explained below, the image distortion of the patterns is measured and the original master patterns (design patterns) are formed in a distorted fashion based on the results of measurement. This will be explained with reference to FIG. 14. In FIG. 14, Pc is an ideal pattern on the mask substrate 4 (projection pattern in case where there is no distortion) for the rectangular pattern (design pattern) Pd formed on the master reticle (for measurement of distortion) Ri. Pe is the actual pattern of the rectangular pattern Pd formed on the master reticle Ri projected distorted due to this distortion. If the point on the actual pattern Pe corresponding to the point $\alpha 1$ on the ideal pattern Pc corresponding to the point $\alpha 0$ on the design pattern Pd (intersection of the line Ln passing through the center AX of the projection optical system 3 and the ideal pattern Pc) is $\beta 1$ (intersection of line Ln and actual pattern Pe), the position of $\beta 1$ (coordinate values) is measured by a coordinate measurement device etc., the distance (displacement) $\Delta dn$ between the point $\alpha$ and the point $\beta$ is found based on the coordinate values, and the point $\gamma 0$ at the opposite side of the point $\beta 1$ the same distance as the displacement $\Delta dn$ along the line Ln is found. Next, the point $\gamma 0$ on the master reticle Ri having this point $\gamma 1$ as an ideal projection point is found. This calculation etc. is performed continuously or intermittently across the entire pattern Pd and the set of the points $\gamma 0$ found is used as the drawing data after correction (distorted pattern Pf). Note that when intermittently measuring the points in order to increase efficiency, the displacement at points not measured may be found by interpolation based on the measured points.

As shown in FIG. 12, a plurality of master reticles (master 1 to master 4) R1 to R4 formed with the distorted patterns Pf are produced based on the drawing data corrected from the drawing data of the design pattern Pd in this way. If successively projecting and exposing these patterns on the mask substrate 4 while stitching them, patterns Pg having a shape extremely close to the ideal pattern Pc are formed on the mask substrate 4 and a high accuracy, high quality working mask 34 free from distortion is produced.

The above explanation concerned the correction of distortion. In a reticle exposure apparatus as shown in FIG. 2, however, the following may be considered as causes for distortion of an image of a master pattern Pi of a master reticle Ri projected on the surface of a mask substrate 4:

(1) As distortion relating to the master reticle Ri, bending of the master reticle due to holding, tilt and shift with respect to the reference plane (object plane of projection optical system 3), etc.

(2) As distortion relating to the projection optical system 3, aberration of the projection optical system 3 (distortion, image plane curvature, astigmatism, coma aberration, spherical aberration, etc.) etc.

(3) As distortion relating to the mask substrate 4, bending of the mask substrate 4 due to holding etc.

Further, when using a working reticle 34 produced using such a reticle exposure apparatus to produce a microdevice by a device exposure apparatus, the following may be considered as causes for distortion of the image of the pattern of the working reticle 34 projected on the surface of the device substrate (W):

(4) As distortion relating to the working reticle 34, bending of the working reticle due to holding, tilt and shift with respect to the reference plane (object plane of projection optical system (see reference numeral 42 of FIG. 5)), etc.

(5) As distortion relating to the projection optical system (42), aberration of the projection optical system (distortion, image plane curvature, astigmatism, coma aberration, spherical aberration, etc.) etc.

The drawing data for the patterns Pi formed on the master reticles Ri may be corrected for all of the pattern distortions caused by the above causes (1) to (5) of the reticle exposure apparatus and device exposure apparatus, but it is also possible to correct it for just one or more with a larger effect on accuracy.

Next, an explanation will be made of the relation for correction of design patterns by measuring the positions (coordinate values) of actually projected points on the mask substrate 4 or device substrate W for the above causes (1) to (5).

Here, the following parameters are defined:
n: Number of measurement points when measuring deformation (n is an integer)
i: Ordinal number of measurement when measuring deformation (i is 1 to n)
j: Oridinal number corresponding to above causes (1) to (5) (j is 1 to 5)
(x0i, y0i): Coordinates of point P0i at i-th measurement position when measuring deformation
(xji, yji): Results of measurement of position of point Qji when point P0i (x0i, y0i) displaces and becomes the point Qji (xji, yji) due to deformation due to the cause (j).

First, consider finding a linear approximation model where the point P0i (x0i, y0i) of the 1-th measurement position displaces to the point Rji (Xji, Yji) in accordance with the following equation (M1) due to deformation due to the cause (j).

$$\begin{bmatrix} Xji \\ Yji \end{bmatrix} = \begin{bmatrix} aji & bji \\ cji & dji \end{bmatrix} \begin{bmatrix} x0i \\ y0i \end{bmatrix} + \begin{bmatrix} eji \\ fji \end{bmatrix} \quad (M1)$$

In the above equation, aji, bji, cji, dji, eji, and fji may be found using the least square method so that the difference between the Qji (xji,yji) of the measured value and the Rji (Jji, Yji) of a point in the model becomes the smallest. The error due to the deformation caused by the above causes (1) to (5), however, is not projected to be linear, so the closer the model to the desired position (here, the i-th measurement point), the greater the weight in the weighted linear approximation used.

Specifically, the following $Eji^2$ and Wik are defined from the point Qji (xji, yji) of the i-th measured value when measuring deformation and the point Rji (Xji, Yji) on the model. That is, s is a constant and k is an integer of 1 to n. Aji, bji, cji, dji, eji, and fji may be found by the least square method to give the smallest $Eji^2$. That is $$Eji^2 \equiv \sum_{k=1}^{n} (Wik((Xji - xji)^2 + (Yji - yji)^2)) \quad (M2)$$

$$Wik \equiv \left(1/\sqrt{2\pi s}\right)\exp(-((xji - xjk)^2 + (yji - yjk)^2)/2s) \quad (M3)$$

Here, Wik is a Gaussian function which becomes greater in value the closer the distance between the i-th measured point and the k-th measured point. The s in equation (M3) expresses the spread of the Gaussian function Wik. The larger the s, the more the data further away from the i-th measured point is considered in the linear approximation. On the other hand, if the s is small, only data close to the i-th measured point is considered in the linear approximation.

The deformation model for the cause (j) at the i-th measured position is one of local linear approximation near the i-th measured point.

Using this, the deformation model for the cause (j), that is, the model of deformation of the i-th measured point P0i (x0i, y0i) to the point Rji (Xji, Yji), is found. Here, for simplification, the equation (M1) is rewritten to the following expression:

$$Zj = Aj \cdot Z0 + Bj$$

where, $$Zi = \begin{bmatrix} Xji \\ Yji \end{bmatrix} \quad Aj = \begin{bmatrix} aji & bji \\ cji & dji \end{bmatrix} \quad Z0 = \begin{bmatrix} x0i \\ y0i \end{bmatrix} \quad Bj = \begin{bmatrix} eij \\ fji \end{bmatrix}$$

The deformation due to the causes (1) to (5) is assumed to successively accumulate. The deformation models for the causes (1) to (5) may be considered to be:

$$Z1 = A1 \cdot Z0 + B1 \quad (1)$$

$$Z2 = A2 \cdot Z1 + B2 \quad (2)$$

$$Z3 = A3 \cdot Z2 + B3 \quad (3)$$

$$Z4 = A4 \cdot Z3 + B4 \quad (4)$$

$$Z5 = A5 \cdot Z4 + B5 \quad (5)$$

Next, the relations for inverse transformation are found. The inverse transformation model for the deformation for the cause (j) becomes:

$$Z0 = Aj^{-1}(Zj - Bj)$$

where, $Aj^{-1}$ is the inverse matrix of Aj.

Therefore, the inverse deformation models for deformation due to the causes (1) to (5) may be considered to be:

$$Z0 = A1^{-1}(Z1 - B1) \quad (1)$$

$$Z1 = A2^{-1}(Z2 - B2) \quad (2)$$

$$Z2 = A3^{-1}(Z3 - B3) \quad (3)$$

$$Z3 = A4^{-1}(Z4 - B4) \quad (4)$$

$$Z4 = A5^{-1}(Z5 - B5) \quad (5)$$

Finally, it is desired to determine how the patterns should be distorted in drawing on the master reticles Ri in order to arrange the patterns according to the ideal lattice on the device substrate. Therefore, it is sufficient to find positions Z0 for drawing on the master reticles Ri when determining the ideal positional coordinates by Z5.

This calculation equation becomes $$Z0 = A1^{-1}(Z1 - B1)$$
$$= A1^{-1}(A2^{-1}(Z2 - B2) - B1)$$
$$= A1^{-1}(A2^{-1}(A3^{-3}(Z3 - B3) - B2) - B1) \quad (A)$$
$$= A1^{-1}(A2^{-1}(A3^{-1}(A4^{-1}(Z4 - B4) - B3) - B2) - B1)$$
$$= A1^{-1}(A2^{-1}(A3^{-1}(A4^{-1}(A5^{-1}(Z5 - B5) - B4) - B3) - B2) - B1) \quad (B)$$

Note that when finding how to distort patterns for drawing on the master reticles Ri in order to arrange the patterns on the working reticle 34 produced by the reticle exposure apparatus in accordance with the ideal lattice, it is sufficient to use (A). In this case, for example, when not desiring to consider deformation due to the reason (3), it is sufficient to calculate $A3^{-1}$ as a unit matrix and B3 as a zero matrix. Further, when finding how to distort patterns for drawing on the master reticles Ri in order to arrange the patterns on the device substrate (W) exposed by the device exposure apparatus in accordance with the ideal lattice, it is sufficient to use (B). By this method, the equation (B) may be used to find the corrected points for deformation including all of the causes (1) to (5) or deformation arising by one or a combination of two or more of the causes (1) to (5).

Based on the drawing data found in accordance with the above, an electron beam lithography system or laser beam lithography system etc. is used to draw patterns distorted from the design patterns and produce a plurality of master reticles Ri. These master reticles Ri are used to transfer patterns on a mask substrate 4 by a reticle exposure apparatus while stitching them and thereby produce a working reticle 34.

The thus produced working reticle 34 is used for exposure on a device substrate W by the device exposure apparatus shown in FIG. 5.

Note that in the third embodiment, causes (1) to (5) were shown as causes for distortion of projected images in the reticle exposure apparatus or device exposure apparatus, but these are only examples. Other causes may also be considered and the design patterns made to distort to deal with these too.

Before transferring a master pattern Pi to the substrate 4, alignment sensors 14A and 14B are used to detect the alignment marks 21A and 21B and reference marks 13A and 13B for each master reticle Ri and align the master reticle Ri. Further, instead of the alignment marks 24A and 24B comprised of the light shielding materials, use may be made of latent images of alignment marks formed on the resist of the substrate 4. In this case, before loading the substrate 4 into the projection exposure apparatus (FIG. 2) and transferring the master pattern Pi, the projection exposure apparatus may be used to form latent images of alignment marks on the resist on the substrate 4, so the process of forming alignment marks explained above may be deleted and the production time and production costs of the working reticle 34 may be shortened and reduced.

Further, a photoelectric detector having an aperture pattern is arranged above the sample table 5 in FIG. 2. The plurality of marks formed on the master reticle or test reticle are projected on it by the projection optical system 3. The sample table 5 is moved so that the projected images successively are detected by the photoelectric detector through the aperture pattern. The coordinate values of the projected images may be found based on the output signal of the photoelectric detector and the output signal of the interferometer 8 and the image distortion caused by the above (1) and (2) detected from the plurality of coordinate values. At this time, it is preferable to irradiate the marks with the exposure light and project the marks under the same exposure conditions as when transferring the pattern of a master reticle on to the substrate 4 (working reticle 34), that is, making the same the shape and size of the aperture stop in the illumination optical system 1, the coherence factor (σ value), the numerical aperture (NA) of the projection optical system 3, and the existence of a pupil filter.

Further, the line width, pitch, and other formation conditions of the marks are desirably made the same as the pattern of the master reticle. Note that in the same way, the exposure apparatus transferring the pattern of the working reticle 34 on to a wafer W (FIG. 5) may similarly have a photoelectric detector having an aperture pattern arranged above the sample table 43 and detect distortion due to the above (4) and (5). Further, the detectors (reference numerals 54 to 56 etc. in FIG. 7) explained in the first embodiment may also be used to detect the image distortion.

Further, it is possible to transfer the pattern or marks of a master reticle on the substrate 4 and then detect the positions of latent images of the pattern or marks formed on the resist or resist images formed after development by an alignment sensor 23 etc. to find the image distortion. Note the substrate 4 to which the pattern or marks have been transferred may also be developed and etched and then the positions of the images formed on the substrate 4 detected to find the image distortion. In this case, the image distortion including even distortion arising in the processes of development, etching, etc. may also be found.

Further, in the above embodiment, the pattern to be formed on a master reticle was made to distort to cancel out the image distortion arising due to the above (1) to (5), but the entire pattern to be formed on the master reticle need not be distorted. For example, it is also possible to make only part of the pattern distort or make part of the pattern shift relative to another portion. Further, instead of making the pattern of the master reticle distort, it is also possible to move the master reticle at the object plane side of the projection optical system 3 in FIG. 2 to make the position of the pattern shift. At this time, the image field of the projection optical system 3, that is, the position of the pattern in the plane orthogonal to the optical axis, may be made to shift or the master reticle may be made to move in a direction parallel to the optical axis to make the position of the pattern shift or the master reticle may be made to tilt with respect to the object plane of the projection optical system 3 (plane orthogonal to the optical axis). Note that the positions of the patterns at the plurality of master reticles used when producing the working reticle may also be shifted or the position of the pattern at only a specific master reticle may be shifted. Further, the pattern may be made to distort and the position of the pattern made to shift at the object plane side of the projection optical system 3 in the same master reticle or the pattern made to distort for one or more of the plurality of master reticles used for the production of the working reticle and the positions of the patterns made to shift for the remaining master reticles. Note that it is also possible not to make the pattern distort and not to make the position of the pattern shift for some master reticles. Further, when using an exposure apparatus which holds the master reticle and substrate substantially stationary to transfer the pattern to the substrate (stepper), it is possible to use the reticle blind (field stop) arranged in the illumination optical system 1 to divide the pattern of the master reticle into a plurality of sections and transfer these to the substrate and to shift the positions in the image field of the projection optical system 3 for each of the plurality of sections on the master reticle.

Further, when using a scan exposure apparatus to transfer the pattern of a master reticle on to the substrate 4, the master reticle and the substrate are made to move relative to the projection optical system 3. Therefore, in the scan exposure apparatus, it is possible to drive a reticle blind (field stop) arranged in the illumination optical system 1 and restricting the area on the master reticle illuminated by the exposure light so as to make the position of the illuminated area in the image field of the projection optical system 3 shift. Further, it is also possible to make the master reticle and substrate synchronously move while offset somewhat in scan direction or to make the master reticle synchronously move with the substrate while rotating it slightly so as make the transferred image of the pattern on the substrate 4 distort.

Further, the master pattern formed on a master reticle may be made to distort to cancel out nonrotationally symmetrical components of distortion arising due to the above (1) to (5) and the position of the pattern made to shift as explained above or at least one optical element of the projection optical system 3 or 42 made to move to cancel out the remaining rotationally symmetrical components. Note that in a scan type exposure apparatus, the master reticle and substrate may be made to shift slightly in the scan direction to cancel out the rotationally symmetrical components.

Further, since a plurality of master reticles Ri are successively exchanged to transfer the master patterns Pi to the substrate 4, the time required for exposure of the substrate 4 becomes longer compared with exposure of a wafer W using a working reticle 34. Also when the projection exposure apparatus of FIG. 2 uses excimer laser light as the exposure light, a chemical amplification type resist is used for the substrate 4. Therefore, sometimes the line width of the pattern image of for example the first master reticle R1 among the plurality of pattern images (resist patterns) formed on the substrate 4 after development will not become the target line width. That is, since the time from exposure to development differs in the N number of master pattern images transferred on a substrate 4, in extreme cases the amount of change of the line width will differ with each master pattern image. Therefore, it is desirable to measure the amount of change of the line width for each master reticle or find it by simulation and finely adjust the amount of exposure of the substrate 4 (resist) in accordance with the amount of change when transferring the master patterns. Due to this, since the amount of exposure is adjusted for each master pattern, the change in line width of the resist patterns can be held to the minimum. Note that the amount of exposure may be adjusted for each master reticle. Also, the amount of exposure may be adjusted for every several master reticles.

Further, when the projection exposure apparatus shown in FIG. 2 to FIG. 4 is a stationary exposure type, for example, a step-and-repeat type, the amount of exposure of the substrate 4 (resist) is adjusted by changing at least one of the intensity and irradiation time (exposure time) of the exposure light on the substrate 4 when the exposure light is continuous light (i-rays etc.) and by changing at least one of the intensity and number of pulses of the exposure light on the substrate 4 when the exposure light is pulse light (excimer laser etc.) On the other hand, when the projection exposure apparatus shown in FIG. 2 to FIG. 4 is a scan exposure type, for example, the step-and-scan type, the amount of exposure of the substrate 4 (resist) is adjusted by changing at least one of the intensity of the exposure light on the substrate 4, the scan speed of the substrate 4, and the width of the area irradiated by the exposure light in the scan direction on the substrate 4 when the exposure light is continuous light and by changing at least one of the intensity of the exposure light on the substrate 4, the scan speed of the substrate 4, the width of the area irradiated by the exposure light in the scan direction on the substrate 4, and the oscillation frequency of the exposure light (pulse light source) when the exposure light is pulse light.

An enlarged device pattern of the device pattern to be formed on the working reticle 34 may be divided into element patterns, for example, divided into dense patterns and isolated patterns or divided into functional blocks (CPU, memory, etc.), to form master reticles and thereby eliminate or reduce the connection portions between master patterns on the substrate 4. In this case, since, depending on the device pattern of the working reticle, the master pattern of a single master reticle is sometimes transferred on to a plurality of areas on the substrate 4, it is possible to reduce the number of master reticles used for production of a working reticle.

In the third embodiment, the patterns of a plurality of master reticles were transferred on to the substrate 4 in the same exposure apparatus, but it is also possible to use a plurality of exposure apparatuses to transfer the patterns of a plurality of master reticles on the substrate 4. For example, the same number of exposure apparatuses as the number of master reticles required for production of a single working reticle may be prepared, a first exposure apparatus used to transfer the pattern of a first master reticle on to the substrate, then the substrate loaded into the second exposure apparatus where the pattern of the second master reticle is then transferred to the substrate. The remaining exposure apparatuses similarly transfer the patterns of their master reticles to the substrate after this to form the device pattern on the substrate. At this time, the image distortion occurring due to at least one of the above (1) to (5) is canceled out by making the pattern of the master reticle used in the exposure apparatus distort for each apparatus or making the pattern position shift. Note that there may also be two or more master reticles provided at each of the plurality of exposure apparatuses. Further, the same exposure apparatus may be used when transferring the pattern of a single master reticle to a plurality of areas on a substrate.

According to the third embodiment, the design patterns to be formed on the master masks (master reticles Ri), that is, the working mask (working reticle 34), are made to distort so that the actual projected images substantially match with the ideal projected images, so even if there is bending of the substrate due to holding, aberration of the projection optical system, etc., patterns close to the ideal images can be projected and transferred to the mask substrate 4 or the device substrate W and a high accuracy, high quality microdevice or photomask can be produced.

Fourth Embodiment

Next a fourth embodiment of the present invention will be explained with reference to the drawings. Parts of the explanations of matters already explained in the first embodiment will be omitted.

In the fourth embodiment, nonrotationally symmetric aberration of the projected image of the projection exposure apparatus and the distortion characteristics and other imaging characteristics are measured in advance, and the results of the measurement are used at the time of production of the working reticle 34 as explained later.

While already explained in the first embodiment, the substrate (blank) 4 for the working reticle 34 is a transparent substrate such as silica glass. It is formed with a thin film of a mask material such as chrome or molybdenum silicate on the pattern area 25 of its surface and is formed with two alignment marks 24A and 24B comprised of two-dimensional marks for alignment sandwiching the pattern area 25. These alignment marks 24A and 24B are formed in advance before the transfer of the pattern using an electron beam lithography system, laser beam lithography system, projection exposure apparatus (stepper, scanner), etc. The substrate 4 is aligned by measuring the relative positions of the alignment marks 24A and 24B and reference marks 13A and 13B using the alignment sensor 23 (FIG. 2).

On the other hand, alignment marks 21A and 21B are formed on the master masks Ri as well. Before transferring a master pattern Pi to the substrate 4, alignment sensors 14A and 14B are used to detect the alignment marks 21A and 21B and reference marks 13A and 13B for each master reticle Ri and align the master reticle Ri.

In the first embodiment, before transferring the master pattern P2 of the second master reticle R2 on to the substrate 4, the sensor 23 detected the alignment marks 24A and 24B to obtain their positional information (X-coordinate, Y-coordinate, and rotation). However, the alignment marks 24A and 24B may also be detected before transferring the master pattern P1 of the first master reticle R1 to the substrate 4 and that positional information used for transferring the master patterns P1 to PN of the master reticles R1 to RN to the substrate 4.

Further, when transferring the master pattern Pn ($1 \leq n \leq N-1$) of the n-th master reticle Rn to the substrate, for example, at least one of the alignment marks 21A and 21B may be transferred to the substrate 4 and the latent image of that at least one alignment mark formed on the substrate 4 (resist) may be detected by the alignment sensor 23. The positional information obtained may be used to transfer the master pattern Pn+1 of the (n+1)th master reticle Rn+1 to the substrate 4. At this time, the positional information of the previously detected alignment marks 24A and 24B may also be used together. Further, when transferring the patterns of third and following master reticles Rn to the substrate 4, it is possible to use all of the positional information relating to the latent images of the alignment marks formed at the time of transfer of the 1 to (n−1)th master reticles or to select one or more latent images and use only that positional information. At this time, the positional information of the alignment marks corresponding to a transferred image obtained by stitching together reduced images of the master patterns Pn of the master reticles Rn among the transferred images of the first to (n−1)th master patterns P1 to Pn−1 transferred on the substrate 4 may also be selectively used.

Here, while partially overlapping with the above explanation, the flow of the production of the working reticle 34 will be explained in brief with reference to FIG. 17 and FIG. 10. In FIG. 10, Ri (i=1 to 4) are master reticles. Here, to simplify the explanation, it is assumed that the patterns of four master reticles Ri to R4 (master 1 to master 4) formed with the patterns "A" to "D" are to be transferred to the photomask substrate (blank) 4.

Figure 17:
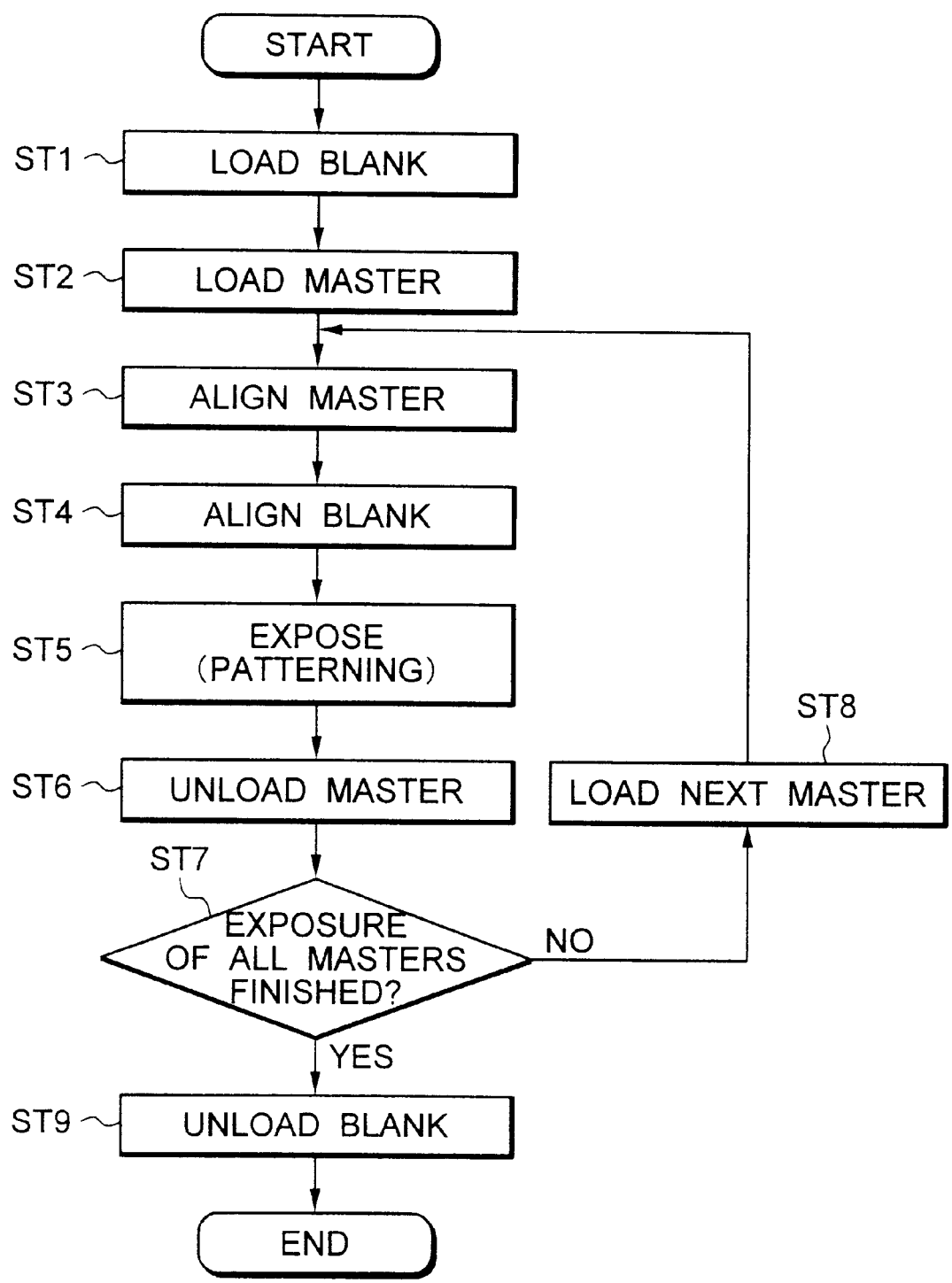
FIG. 17 is a flow chart showing a summary of the process of production of a working reticle of the fourth embodiment of the present invention.

In FIG. 17, first, a substrate 4 coated with a photoresist is loaded on to the sample table 5 on the XY stage 6 of FIG. 2 (ST1) and the first (master 1) of the plurality of master reticles Ri is loaded on to the reticle stage 2 of FIG. 2 (ST2). Next, the alignment marks 21A and 21B of the master reticle Ri are aligned with the reference marks 13A and 13B (ST3), then the alignment marks 24A and 24B of the substrate 4 are detected by the alignment sensor 23, the master reticle R1 and substrate are moved relative to each other based on the positional information obtained so as to align the reduced image of the master pattern P1 and the substrate 4 (ST4), then exposure is performed to transfer the pattern "A" on the master reticle R1 on to the substrate 4 (ST5). Next, the master reticle R1 is unloaded from the reticle stage 2 (ST6) and it is judged if the transfer of patterns to the substrate 4 has been completed for all master reticles (ST7). When it is judged at step ST7 that the transfer of patterns has not ended for all master reticles, the next of the master reticles R2 to R4 (master 2 to master 4) is successively loaded (ST8), then the processing returns to ST3. This is successively repeated to transfer the patterns "B" to "D" of the master reticles R2 to R4 to the substrate 4 while stitching them. When it is judged at step ST7 that the transfer of patterns has ended for all master reticles, the substrate 4 is unloaded (ST9) and the exposure processing is ended.

Next, the photoresist on the substrate 4 is developed and etched and the remaining resist pattern peeled off etc. to complete the working reticle 34 with the master patterns "A" to "D" transferred as shown in FIG. 10. At this time, the alignment marks 24A and 24B on the substrate 4 used for the alignment with the master reticles are left as they are for use for the alignment when transferring the pattern on a device substrate using this working reticle 34 in the device exposure apparatus shown in FIG. 5.

Next, an explanation will be given of the case where the imaging characteristics of the projected image of the projection exposure apparatus using the working reticle 34 deviates from the ideal image. When the projection exposure apparatus shown in FIG. 5 using the working reticle 34 is a block exposure type, there may be a certain amount of nonrotationally symmetrical aberration or distortion etc. remaining in the imaging characteristics. Here, it is assumed that the imaging characteristics of the projection optical system 42 includes distortion whereby the lattice-like ideal image 28 shown by the broken lines becomes a pincushion shaped (or barrel shaped) projected image 29 as shown by the solid lines as shown in FIG. 15A.

Figure 15A:
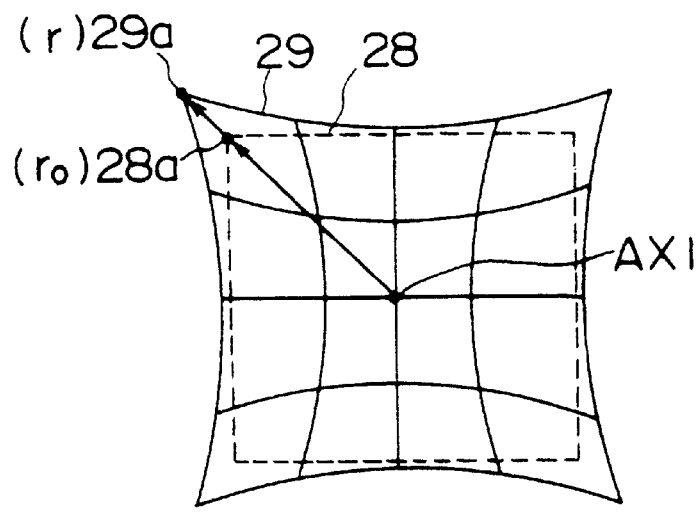
FIG. 15A is a view of an example of error in imaging characteristics of a projection exposure apparatus using the working reticle produced in a fourth embodiment of the present invention.

In FIG. 15A, when the distance from the optical axis AX1 of the projection optical system 42 to the point 29a on the projected image 29 is r and the distance from the optical axis AX1 to the point 28a on the corresponding ideal image 28 is $r_0$, the distortion D(r) at the distance r can be expressed as follows:

$$D(r)=(r-r_0)/r \qquad (N1)$$

Therefore, the amount of offset of the projected image 29 from the ideal image 28 at the distance r becomes about $r \cdot D(r)$.

In this case, in the fourth embodiment, as shown in FIG. 4, when projecting a reduced image of a master pattern Pi of the i-th master reticle Ri on the substrate 4, the exposure position is shifted laterally in the X-direction and Y-direction from the original shot area Si so as to cancel out the distortion.

Figure 15B:
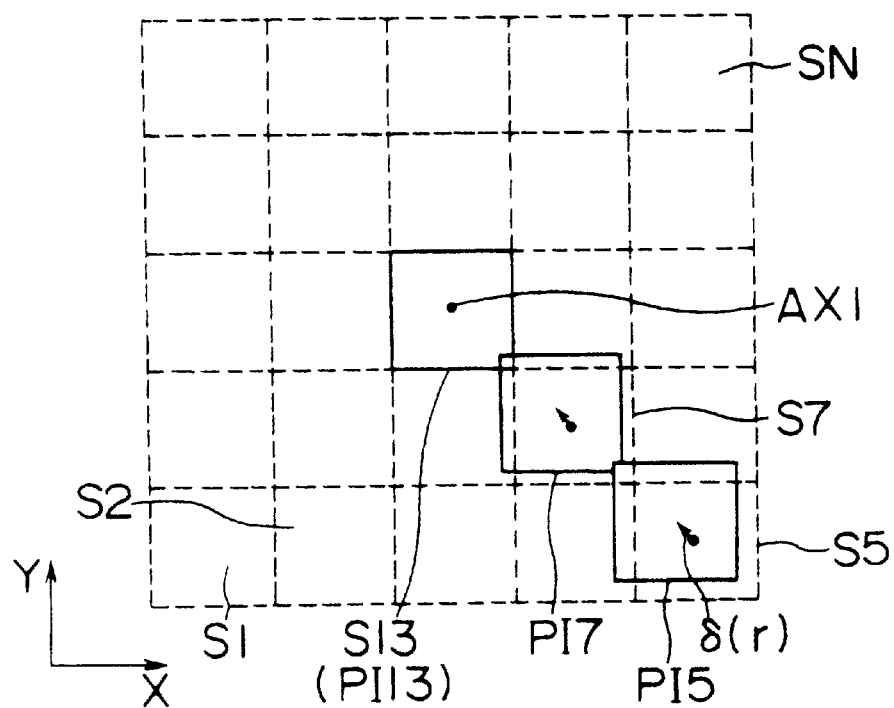
FIG. 15B is a view of the method of correcting imaging characteristics of a reduced image of a master pattern on a working reticle produced in the fourth embodiment of the present invention.

FIG. 15B shows the array of the shot areas S1, S2, . . . , SN on the substrate 4 again. In FIG. 15B, it is assumed that a reduced image PI5 of the corresponding master pattern P5 is being projected on the original shot area S5. In this case, if the distance from the center of the shot area S5 to the optical axis AX1 of the projection optical system 42 of the exposure apparatus scheduled to use the substrate 4 (working reticle 34), in this embodiment, the exposure apparatus of FIG. 5, is r, the amount of offset of the projection position in the radial direction when reducing and projecting the shot area S5 by 1/β by the projection optical system 42 becomes, from equation (N1), (r/β)D(r/β). Further, in the exposure apparatus of FIG. 2, the amount of offset due to the projection optical system 42 of the scan exposure apparatus of FIG. 5 when making the exposure position of the reduced image PI5 shift by exactly δ(r) in advance with respect to the shot area S5 in the scan exposure apparatus of FIG. 2 becomes δ(r)/β. Therefore, the condition for canceling out the distortion by the amount of offset becomes as follows:

$$\delta(r)/\beta = -(r/\beta)D(r/\beta) \tag{N2}$$

From equation (N2), the amount of offset δ(r) becomes as follows:

$$\delta(r) = -r \cdot D(r/\beta) \tag{N3}$$

In this equation, the minus sign when D(r/β) is a positive value means that the exposure apparatus of FIG. 2 makes the reduced image PI5 shift toward the optical axis AX in the plane orthogonal to the optical axis AX. Similarly, for example, in the shot area S7 as well, the exposure position of the corresponding reduced image PI7 is made to shift so as to satisfy equation (N3) and the reduced images are similarly made to shift in the other shot areas as well. Note that at the shot area S13 on the optical axis AX1 in the exposure apparatus of FIG. 5, there is no need to change the position of the reduced image PI13 in the exposure apparatus of FIG. 2. Due to this, in the exposure apparatus of FIG. 5, the distortion of FIG. 15A is canceled out and an ideal image 28 is exposed on the device substrate (W) by the projection optical system 42.

Note that as will be understood from FIG. 15A, in the partial area at a position of distance r from the optical axis AX1 in the projected image 29, the magnification also changes by exactly Δβ(r) and a slight nonrotationally symmetrical distortion also arises. Therefore, the projection optical system 3 of the projection exposure apparatus of FIG. 2 to FIG. 4 is preferably provided with a correction mechanism for driving a predetermined lens element in the projection optical system 3, for example, so as to enable the projection magnification or distortion to be controlled within a predetermined range. Further, when exposing the reduced image PI5 on the shot area S5 of the FIG. 15B for example, the projection exposure apparatus of FIG. 2 to FIG. 4 is used to not only shift the exposure position by exactly δ(r), but also correct the magnification of the projection optical system 3 so as to cancel out the corresponding magnification error Δβ(r/β) and correct the distortion characteristics of the projection optical system 3 so as to cancel out the corresponding partial distortion as much as possible. Due to this, it becomes possible to cancel out the distortion of FIG. 15A with a higher accuracy overall.

Figure 16A:
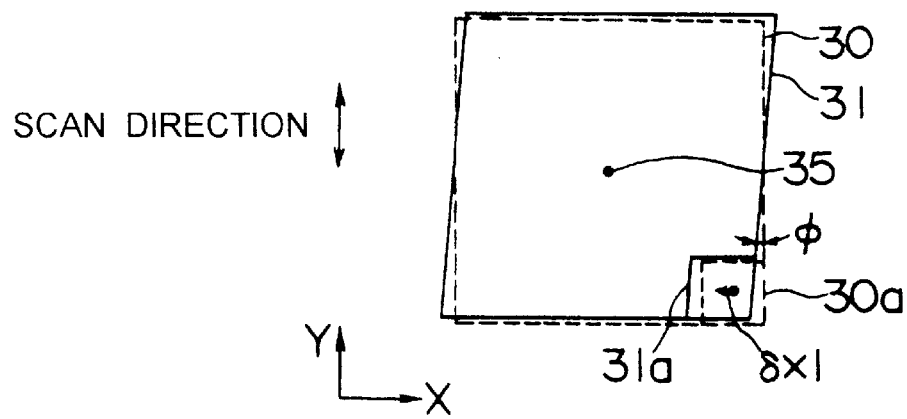
FIG. 16A is a view of another example of error in imaging characteristics of a projection exposure apparatus using the working reticle produced in the fourth embodiment of the present invention.

Next, the explanation will be given of the case where the projection exposure apparatus of FIG. 5 is for example a scan exposure type such as a step-and-scan type and where the imaging characteristics of the projected image include so-called skew error where, as shown in FIG. 16A, the rectangular ideal image 30 shown by the broken lines becomes the parallelopiped projected image 31 shown by the solid lines.

In FIG. 16A, the center of the projected image 31 is the same as the center 35 of the ideal image 30, but the projected image 31 is distorted by exactly the angle φ clockwise about the axis of the scan direction, that is, the Y-direction, from the ideal image 30. This is error distinctive to the scan exposure system (also called an example of nonrotationally symmetrical aberration) arising when the scan directions of the reticle and exposed substrate are offset. For example, the partial image 31a at the periphery of the projected image 31 is laterally offset by exactly δX1 in the −X-direction and distorted in a parallelopiped fashion by exactly the angle φ from the ideal partial image 30a.

In this case, in the present embodiment, as the projection exposure apparatus for successively projecting reduced images of the master patterns of the master reticles R1 to RN on the substrate 4 shown in FIG. 2 to FIG. 4, a step-and-scan type projection exposure apparatus having the Y-direction as its scan direction is used. Further, when exposing the reduced image PI21 of the pattern of the master reticle R21 corresponding to a partial image 31a of FIG. 16A, the imaging characteristics are corrected so as to cancel out the errors of the lateral offset δX1 and angle φ.

Figure 16B:
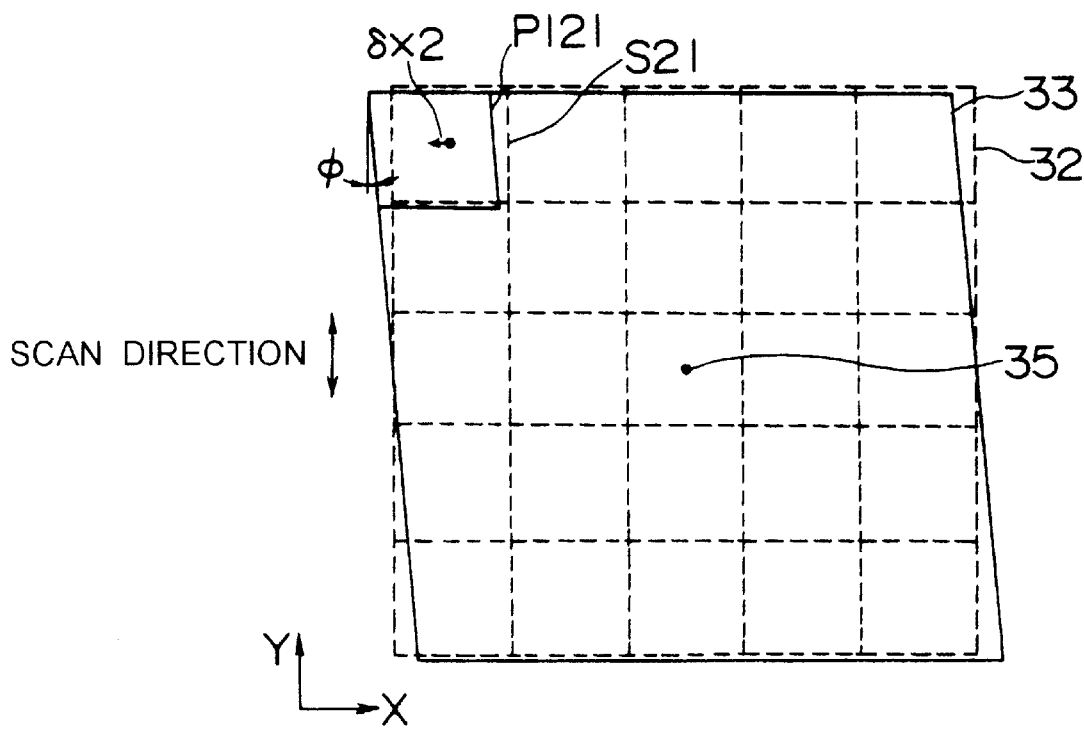
FIG. 16B is a view of the method of correcting imaging characteristics of a reduced image of a master pattern on a working reticle produced in the fourth embodiment of the present invention.

The broken line array 32 of FIG. 16B shows the array of the design shot areas of the substrate 14. In FIG. 16B, it is assumed that the reduced image PI21 of the master pattern is being projected on the design shot area S21 corresponding to the partial image 30a of FIG. 16A. In this case, since the amount of lateral offset when reducing and projecting the shot area S21 by 1/β by the projection optical system 3 is δX1, the amount of offset due to the projection optical system 42 of the scan exposure apparatus of FIG. 5 when making the exposure position of the reduced image PI21 shift by exactly δX2 in advance with respect to the shot area S21 in the scan exposure apparatus of FIG. 2 to FIG. 4 becomes −δX2/β (the minus sign is due to the inverted projection). Therefore, the condition for canceling out the amount of lateral offset δX1 by that amount of offset becomes as follows:

$$-\delta X2/\beta = -\delta X1 \tag{N4}$$

From equation (N4), the amount of offset δX2 becomes β·δX1.

Further, in this example, when exposing a reduced image PI21 by the exposure apparatus of FIG. 2 to FIG. 4, the reduced image PI21 may be made to distort by exactly the angle φ clockwise about the Y-axis by making the scan direction the Y-direction and shifting the scan direction of the master reticle and the substrate 4. Similarly, in other shot areas as well, the exposure positions of the corresponding reduced images are made to shift laterally and distort by exactly the angle φ clockwise about the Y-axis. Due to this, in the scan exposure apparatus of FIG. 5, the skew error of FIG. 16A is substantially completely canceled out and the ideal image 30 is exposed.

In the above explanation, the alignment marks 24A and 24B were detected by the alignment sensors 41A and 41B and the working reticle 34 was aligned so that the center of the two became substantially in register with the optical axis AX1 of the projection optical system 3, but it is also possible to use alignment sensors 41A and 41B to detect the alignment marks 24A and 24B of the working reticle 34 and the alignment marks of every shot area on the device substrate (wafer) W and make the working reticle 34 and wafer W move relatively, i.e., perform die-by-die alignment. Further, it is possible to select a plurality (for example, about 5 to 10) shot areas on the wafer W as an alignment shot area and use the alignment sensors 41A and 41B to detect alignment marks 24A and 24B and the alignment marks of the alignment shot area to find the X- and Y-coordinates of the XY stage 44 giving a zero amount of offset between the pattern image of the working reticle 34 and the alignment shot area. Further, it is possible to calculate the coordinate positions of the shot areas on the wafer W by statistical computations using the plurality of coordinates found and successively move the XY stage 44 in accordance with the calculated coordinate positions, i.e, perform enhanced global alignment. Note that instead of the alignment sensors 41A and 41B, it is also possible to use the alignment sensor 23 for the enhanced global alignment. In this case, in the same way as above, the alignment marks 24A and 24B are used for alignment of the working reticle 34. Further, alignment marks used for die-by-die alignment or enhanced global alignment may also be formed on the working reticle 34 (substrate 4) separate from the alignment marks 24A and 24B used for the alignment of the working reticle 34.

Note that as the projection exposure apparatus for exposure of the working reticle 34, it is possible to use a scan exposure type reduction projection exposure apparatus such as the step-and-scan type.

The alignment marks formed on the substrate 4 (working reticle 34) are not limited to two marks. One or three or more may also be provided. Further, the alignment marks 24A and 24B are not limited to cross-marks and may be any shape or may be line-and-space patterns, refractive lattices, etc. Further, the alignment marks 24A and 24B may be formed using the projection exposure apparatus shown in FIG. 2 or may be formed using an exposure apparatus using charged particle beams (electron beams, ion beams, etc.) or a laser beam lithography system etc.

Further, the alignment marks 24A and 24B are comprised of a light shielding material such as chrome. In the projection exposure apparatus of FIG. 2, the alignment marks 24A and 24B are detected by the alignment sensor 23 or 14A and 14B through the resist to which the master pattern Pi is transferred. At this time, if the alignment marks 24A and 24B are covered by the light shielding layer on the substrate 4 where the master pattern Pi is formed, it might become difficult for the alignment sensor 23 etc. to detect the alignment marks 24A and 24B. Therefore, it is preferable to deposit the light shielding layer only at the predetermined area including the transfer area of the master pattern Pi (corresponding to the pattern area 25) so that the alignment marks 24A and 24B are not covered by the light shielding layer or to make the alignment marks 24A and 24B step type marks. Note that when the working reticle 34 is a phase shift reticle, the alignment marks 24A and 24B may also be formed by a phase shifter etc., but considering the detection accuracy of the alignment sensor 23 (S/N ratio of detection signal etc.), they are preferably formed by a shielding material even in the case of a phase shift reticle.

Further, instead of the alignment marks 24A and 24B comprised of light shielding materials, use may be made of latent images of alignment marks formed on the resist of the substrate 4. In this case, before loading the substrate 4 into the projection exposure apparatus (FIG. 2) and transferring the master pattern Pi, the projection exposure apparatus may be used to form latent images of alignment marks on the resist on the substrate 4, so the process of forming alignment marks explained above may be deleted and the production time and production costs of the working reticle 34 may be shortened and reduced.

Further, the device pattern to be formed on the working reticle 34 was enlarged and divided into $\alpha \times \alpha$ number of master patterns and the master patterns were stitched together for transfer to the substrate 4, but it is also possible to divide the enlarged device pattern into element patterns, for example, divide it into dense patterns and isolated patterns or divide it into functional blocks (CPU, memory, etc.), to form master reticles and thereby eliminate or reduce the connection portions between master patterns on the substrate 4. In this case, since, depending on the device pattern of the working reticle, the master pattern of a single master reticle is sometimes transferred on to a plurality of areas on the substrate 4, it is possible to reduce the number of master reticles used for production of a working reticle.

Further, since a plurality of master reticles Ri are successively exchanged to transfer the master patterns Pi to the substrate 4, the time required for exposure of the substrate 4 becomes longer compared with exposure of a wafer W using a working reticle 34. Also when the projection exposure apparatus uses excimer laser light as the exposure light, a chemical amplification type resist is used for the substrate 4. Therefore, sometimes the line width of the pattern image of for example the first master reticle R1 among the plurality of pattern images (resist patterns) formed on the substrate 4 after development will not become the target line width. That is, since the time from exposure to development differs in the N number of master pattern images transferred on a substrate 4, in extreme cases the amount of change of the line width will differ with each master pattern image. Therefore, it is desirable to measure the amount of change of the line width for each master reticle or find it by simulation and finely adjust the amount of exposure of the substrate 4 (resist) in accordance with the amount of change when transferring the master patterns. Due to this, since the amount of exposure is adjusted for each master pattern, the change in line width of the resist patterns can be held to the minimum. Note that the amount of exposure may be adjusted for each master reticle. Also, the amount of exposure may be adjusted for every several master reticles.

Further, when the projection exposure apparatus shown in FIG. 2 to FIG. 4 is a stationary exposure type, for example, a step-and-repeat type, the amount of exposure of the substrate 4 (resist) is adjusted by changing at least one of the intensity and irradiation time (exposure time) of the exposure light on the substrate 4 when the exposure light is continuous light (i-rays etc.) and by changing at least one of the intensity and number of pulses of the exposure light on the substrate 4 when the exposure light is pulse light (excimer laser etc.) On the other hand, when the projection exposure apparatus shown in FIG. 2 to FIG. 4 is a scan exposure type, for example, the step-and-scan type, the amount of exposure of the substrate 4 (resist) is adjusted by changing at least one of the intensity of the exposure light on the substrate 4, the scan speed of the substrate 4, and the width of the area irradiated by the exposure light in the scan direction on the substrate 4 when the exposure light is continuous light and by changing at least one of the intensity of the exposure light on the substrate 4, the scan speed of the substrate 4, the width of the area irradiated by the exposure light in the scan direction on the substrate 4, and the oscillation frequency of the exposure light (pulse light source) when the exposure light is pulse light.

According to the fourth embodiment, it is possible to produce a high accuracy, high quality microdevice with little rotation, offset, or other error between the alignment marks and pattern. Further, since the same alignment marks are used for alignment when producing the photomask and producing the device, there is little room for error to enter, the positional accuracy of the pattern formed on the device substrate can be raised, and in turn a microdevice with good characteristics can be produced.

Note that the present invention is not limited to the above embodiments and can of course be modified in various ways within the scope of the invention.

Further, in the embodiments, the exposure apparatus shown in FIG. 5 was used for the production of a semiconductor device, but the present invention may also be applied to an exposure apparatus used for the production of for example a liquid crystal display element, a plasma display or other displays, a thin film magnetic head, a pickup element (CCD), a vibrator used in a cellular phone or home game system etc., and the like.

Further, in the exposure apparatus of FIG. 5, the projection optical system 42 was a reduction system, but the projection optical system 42 may also be an equal magnification system or an enlargement system. Further, the projection optical system 42 may be any of a refraction system comprised of only a plurality of refraction elements, a reflection system comprised of only a plurality of reflection elements, and a reflection and refraction system comprised of refraction elements and reflection elements. Further, the exposure apparatus of FIG. 5 may be a proximity type or a contact type not using a projection optical system or may be a stationary exposure type or scan exposure type.

Further, the exposure apparatus of FIG. 5 is not limited to a step-and-repeat type or a step-and scan type and may also be a step-and-stitch type which makes a plurality of shot areas partially overlap on a substrate W to transfer a single pattern in the plurality of shot areas. Further, the exposure apparatus of FIG. 5 may be a mirror projection type which uses a single scan exposure to form a plurality of patterns on the entire surface of the photosensitive substrate. Note that in the step-and-stitch type, when transferring patterns to the shot areas, either the stationary exposure or the scan exposure type may be used. The scan exposure system is disclosed for example in Japanese Unexamined Patent Publication (Kokai) No. 4-196513 or its corresponding U.S. Pat. No. 5,473,410. The disclosure of this publication and U.S. Patent are made part of the disclosure of this specification by reference to the extent allowed by the domestic laws of the countries designated or selected by this international application.

Further, in the exposure apparatus of FIG. 5, as the illumination light for exposure, use may be made of the g-rays (wavelength 436 nm) or i-rays (wavelength 365 nm) emitted from mercury lamps, a KrF excimer laser (wavelength 248 nm), ArF excimer laser (wavelength 193 nm), $F_2$ laser (wavelength 157 nm), $Ar_2$ laser, harmonics of a metal vapor laser or YAG laser, etc. Further, use may be made of a harmonic obtained by amplifying an infrared region or visible region single wavelength laser light emitted from a DFB semiconductor laser or fiber laser by for example an erbium (or both erbium and yttrium) doped fiber amplifier and converting this in wavelength to ultraviolet light using a nonlinear optical crystal (explained in detail later). Further, the exposure illumination light is not limited to the above-mentioned far ultraviolet region or vacuum ultraviolet region (wavelength 120 to 200 nm) and may also be one of the soft X-ray region (wavelength 5 to 15 nm or so) emitted from a laser plasma light source or SOR, for example, EUV (extreme ultraviolet) light of a wavelength of 13.4 nm or 11.5 nm, or of the hard X-ray region (wavelength of 1 nm or less). Note that in an EUV exposure apparatus, a reflection type reticle (mask) is used. Also, the projection optical system is a telecentric reduction system only at the image plane side and is a reflection type comprised of only a plurality of (about three to six) reflection optical elements.

Further, the present invention may also be applied to an exposure apparatus using energy beams, ion beams, and other charged particle beams. Note that the electron beam exposure apparatus may be a direct drawing type (for example, self projection type, variable shape beam type, blanking aperture array type, etc.) or may be a projection type (for example, a type using a transmission mask to expose a 250 nm square area on a photosensitive substrate at one time). In the direct drawing type, no mask is used, but the exposure apparatus of the present invention may be applied to the production of the cells or apertures used for shaping the electron beam.

As explained above, the exposure apparatus of FIG. 5 may be any configuration or type of exposure apparatus so long as it uses a mask or reticle (including cell or aperture etc.) On the other hand, the exposure apparatus (FIG. 2 to FIG. 4) for producing the mask or reticle may also be any configuration or type in the same way as the exposure apparatus for producing a device explained above (FIG. 5), but considering the production of the master masks (master reticles), a projection type, in particular a reduction projection type, is preferable. Note that in the exposure apparatus shown in FIG. 2 to FIG. 4 had the substrate 4 fixed to the sample table 5, but to avoid deformation of the substrate 4 due to it being held by suction or electrostatics, it is also possible to support the substrate 4 at a plurality of points (for example, three points) rather than hold it on the sample table 5.

In the above embodiments, a transparent substrate (silica glass etc.) was used as the substrate (blank). This is because it was assumed that the illumination light IL1 for exposure used by the exposure apparatus (FIG. 5) for which the substrate 4, that is, working reticle 34, was used was a vacuum ultraviolet band (wavelength 100 to 200 nm or so) or a higher wavelength band. Here, when the wavelength of the exposure illumination light IL1 is more than 190 nm, it is possible to use silica glass as the substrate 4, but at a shorter wavelength, in particular a wavelength of 100 to 180 nm, it becomes difficult to use silica glass as the substrate 4. Therefore, when the wavelength of the exposure use illumination light IL1 is 100 to 180 nm, for example, fluorite, fluorine-doped silica glass, rock crystal, LiF, $LaF_3$, and lithium-calcium-aluminum fluoride (LiCaAlF crystal) etc. are preferably used. Note that the mask material formed on the substrate 4 may be suitably selected in accordance with the type of the working reticle 34 and is not limited to the above-mentioned chrome etc.

Further, the above EUV exposure apparatus uses a reflection type reticle. When the exposure wavelength is 13.4 nm, a multilayer film comprised of tens of layers of alternate coatings of silicon and molybdenum may be formed surface of the substrate 4 as the mask material, while when the exposure wavelength is 11.5 nm, a multilayer film comprised of tens of layers of alternate coatings of molybdenum and beryllium may be formed, and not only a glass substrate, but also a silicon wafer etc. may be used as the substrate 4. Further, with a proximity type X-ray exposure apparatus and electron beam or ion beam or other charged particle ray exposure apparatus etc., a transmission type mask (stencil mask, membrane mask) may be used and a silicon wafer may be used as the substrate 4.

Note that the projection exposure apparatuses shown in FIGS. 2 and 5 may be produced by fixing a projection optical system comprised of a plurality of optical elements built in a mirror barrel and at least part of an illumination optical system comprised of a plurality of optical elements (including optical integrators etc.) to a frame supported by a plurality of shock-absorbing pads, optically adjusting the illumination optical system and projection optical system, connecting wiring and tubing to the reticle stage (2) or wafer stage (sample table 5 and XY stage 6 etc.) comprised of the large number of mechanical parts and their drive systems (linear motor etc.), arranging the reference mark member (12 or 46) or photoelectric detector (56) etc. at the wafer stage, and further performing overall adjustment (electrical adjustment, confirmation of operation, etc.) Note that the exposure apparatus is desirably manufactured in a clean room controlled in temperature and cleanness etc.

The semiconductor device is produced through a step of design of the functions and performance of the circuit, a step of fabrication of a working reticle by the exposure apparatus of FIG. 2 using the above master reticle based on the design step, a step of transferring a pattern of a working reticle on a wafer using an exposure apparatus of FIG. 5, a step of assembly of the device (including dicing, bonding, packaging, etc.), and an inspection step.

As the light source, various ones other than the ones illustrated above may be used. For example, it is also possible to use an infrared region or visible region single wavelength laser light emitted from a DFB semiconductor laser or fiber laser amplified by for example an erbium (or both erbium and yttrium) doped fiber amplifier and use the harmonic obtained by converting the wavelength to ultraviolet light using a nonlinear optical crystal.

For example, if the oscillation wavelength of the single wavelength laser is made a range of 1.51 to 1.59 μm, an 8th harmonic of an oscillation wavelength in the range of 189 to 199 nm or a 10th harmonic of an oscillation wavelength in the range of 151 to 159 nm is output. In particular, if the oscillation wavelength is made one in the range of 1.544 to 1.553 μm, ultraviolet light of an 8th harmonic in the range of 193 to 194 nm, that is, a wavelength substantially the same as that of an ArF excimer laser, is obtained. If the oscillation wavelength is made one in the range of 1.57 to 1.58 μm, ultraviolet light of a 10th harmonic in the range of 157 to 158 nm, that is, a wavelength substantially the same as that of an $F_2$ laser, is obtained.

Further, if the oscillation wavelength is made one in the range of 1.03 to 1.12 μm, a 7th harmonic of an oscillation wavelength in the range of 147 to 160 nm is output. In particular, if the oscillation wavelength is made one in the range of 1.099 to 1.106 μm, ultraviolet light of a 7th harmonic in the range of 157 to 158 nm, that is, a wavelength substantially the same as that of an $F_2$ laser, is obtained. Note that as the single wavelength oscillation laser, a yttrium-doped fiber laser is used.

All of the content of the disclosure of Japanese Patent Application No. 10-98373 filed on Mar. 26, 1998, Japanese Patent Application No. 10-103767 filed on Mar. 31, 1998, and Japanese Patent Application No. 10-146586 filed on May 12, 1998, including the specification, claims, drawings, and abstract, are incorporated here by reference in its entirety.

What is claimed is:

1. A method of exposure projecting and exposing a pattern formed on a mask on to a photosensitive substrate through a projection optical system, comprising the steps of:
   measuring a position of an image projected by said projection optical system;
   correcting imaging characteristics to reduce the offset from an ideal position for the projected image;
   subsequently to measuring and correcting, aligning the mask and the substrate; and
   projecting and exposing said pattern of the mask on to the substrate.

2. A method of exposure as set forth in claim 1, comprising the additional step of forming a mark on said mask, wherein said image to be measured in said measuring step is a projected image of said mark of the mask.

3. A method of exposure as set forth in claim 1, wherein said image to be measured in said measuring step is a projected image of the pattern formed on said mask.

4. A method of projecting and exposing a pattern formed on a mask on to a photosensitive substrate through a projection optical system, comprising the steps of:
   forming a first mark on said mask;
   measuring a position of an image projected by said projection optical system of a second mark of a control use reference mask formed with said second mark and a third mark corresponding to said first mark and defining it as a second image position, finding the position of an image projected by said projection optical system of said third mark in a state with imaging characteristics preliminarily corrected to reduce an amount of offset of said second image position from an ideal position and defining it as a third image position;
   measuring a position of an image projected by said projection optical system of said first mark of said mask and defining it as a first image position; and
   projecting and exposing said pattern of the mask in a state with imaging characteristics corrected so that said first image position becomes one of a predetermined positional relationship with said third image position.

5. A method of exposure as set forth in claim 4, wherein:
   said first mark is formed at a peripheral area of a pattern area of the mask in which said pattern is formed;
   said second mark is formed in a first area corresponding to said pattern area of said control use reference mask; and
   said third mark is formed in a second area corresponding to said peripheral area of said control use reference mask.

6. A method of exposure as set forth in claim 4, wherein said predetermined positional relation is a relation where said first image position is in register with or in proximity to said third image position.

7. A method of exposure as set forth in claim 4, comprising the additional step of measuring in advance an amount of offset of the position of said first mark of said mask and the position of said third mark of said control use reference mask and defining it as a correction value,
   wherein said predetermined positional relation is a relation where said first image position is substantially in register with a position of said third image position corrected by said correction value.

8. A method of exposure as set forth in claim 4, wherein said first to third marks are marks for measurement of a spatial image and in that the positions of the images projected by said projection optical system of said first to third marks are measured by a spatial image measurement method.

9. A method of exposure as set forth in claim 4, wherein the positions of the images projected by said projection optical system of said first to third marks are measured for at least one component among a first direction parallel to an optical axis of said projection optical system, a second direction orthogonal to said first direction, and a third direction orthogonal to said first and second directions.

10. A method of exposure as set forth in claim 4, wherein said imaging characteristics are corrected by adjusting at least one of a projection magnitude of said projection optical system, an aberration of said projection optical system, a position of said mask with respect to said projection optical system, and a position of said photosensitive substrate with respect to said projection optical system.

11. A method of exposure as set forth in claim 8, wherein said first to third marks are comprised of mark elements comprised of a plurality of arrayed slits or pinholes.

12. A method of exposure as set forth in claim 11, wherein said first to third marks are comprised of a plurality of types of mark elements differing from each other in thickness of said slits or size of said pinholes and intervals and by selecting at least one of said plurality of types of mark elements to measure the position of a projected image.

13. A method of exposure as set forth in claim 4, wherein a plurality of said second marks of said control use reference mask are dispersed over said first area.

14. A method of exposure as set forth in claim 13, wherein said imaging characteristics are preliminarily corrected so as to give to the smallest sum of the squares of the amounts of offset of positions of images projected by said projection optical system of said second marks from their ideal positions multiplied with weighting coefficients.

15. A method of exposure as set forth in claim 14, wherein said weighting coefficients are the same for each of said second marks.

16. A method of exposure as set forth in claim 14, wherein said weighting coefficients differ in accordance with the positions of said second marks in said first area.

17. A method of exposure as set forth in claim 16, wherein said weighting coefficients are selected to become successively larger or successively smaller as the positions of the second marks in the first area move to the outside.

18. A method of exposure dividing an enlarged pattern of a pattern for transfer into patterns of a plurality of masks and projecting and exposing images reduced by a projection optical system of said patterns of a plurality of masks on a surface of a photosensitive substrate while stitching them, said method of exposure comprising the steps of:
forming a first mark in a peripheral area of a pattern area of said mask in which a pattern is formed;
measuring a position of an image projected by said projection optical system of a second mark of a control use reference mask formed with a plurality of said second marks in a first area corresponding to said pattern area of said mask and formed with a third mark facing said first mark in a second area corresponding to said peripheral area of said mask and defining it as a second image position;
finding a position of an image projected by said projection optical system of said third mark in a state with the imaging characteristics preliminarily corrected to reduce the amount of offset of said second image positions from their ideal positions and defining it as a third image position;
measuring a position of an image projected by said projection optical system of said first mark of said mask and defining it as a first image position; and
successively projecting and exposing patterns of said masks in a state with imaging characteristics corrected so that said first image position becomes in register with or proximity to said third image position.

19. A method of exposure as set forth in claim 18, wherein said mask is a master mask and said photosensitive substrate is a substrate for production of a mask.

20. A method of exposure as set forth in claim 18, wherein said mask is a working mask and said photosensitive substrate is a substrate for production of a device.

21. A method of exposure as set forth in claim 18, wherein:
said imaging characteristics are preliminarily corrected so as to give to the smallest sum of the squares of the amounts of offset of positions of images projected by said projection optical system of said second marks from their ideal positions multiplied with weighting coefficients; and
said weighting coefficients are selected so that ones for second marks positioned at portions in said first areas in proximity to sides to be stitched with other masks are larger and ones for the remaining portions are smaller.

22. A method of exposure projecting and exposing a pattern formed on a mask on to a photosensitive substrate through a projection optical system, comprising the steps of:
making part or all of said pattern reach a peripheral area of a pattern area of said mask in which a pattern is formed and defining the portion of said pattern present at said peripheral area as a mark portion for measurement of a spatial image;
measuring a position of an image projected by said projection optical system of said mark portion of said mask by a spatial image measurement method; and
correcting imaging characteristics so as to give the smallest amount of offset of the image position of said mark portion from its ideal position and exposing and projecting the pattern of said mask in a state with the mark portion blocked by a blind.

23. A method of exposure dividing an enlarged pattern of a pattern for transfer into patterns of a plurality of master masks and projecting and exposing images reduced by a projection optical system of said patterns of a plurality of master masks on a surface of a mask substrate while stitching them, said method of exposure comprising the steps of:
finding a displacement of an actually projected point on said mask substrate from an ideal projected point; and
making at least part of the pattern formed on said master mask distort based on the found displacement.

24. A method of exposure as set forth in claim 23, wherein said displacement is displacement caused by at least one of deformation of the pattern of said master mask, aberration of said projection optical system, and deformation of said mask substrate.

25. A method of exposure projecting an image of a pattern of a master mask on a mask substrate by a first projection optical system to produce a working mask and projecting and exposing an image of the pattern of said working mask on a device substrate on which a microdevice is to be formed by a second projection optical system, said method of exposure comprising the steps of:
finding at least one of a displacement of an actually projected point on said mask substrate from an ideal projected point and a displacement of an actual projected point on said device substrate from an ideal projected point; and
making at least part of the pattern formed on said master mask distort based on the found displacement.

26. A method of exposure as set forth in claim 25, comprising the additional steps of dividing an enlarged pattern of a pattern for transfer into patterns of a plurality of masks and successively transferring reduced images of the patterns of the plurality of master masks on the surface of said mask substrate while stitching them.

27. A method of exposure as set forth in claim 25, wherein said displacement is displacement caused by at least one of deformation of the pattern of said master mark, aberration of said first projection optical system, deformation of said mask substrate, deformation of the pattern of said working mask, and aberration of said second projection optical system.

28. A photomask produced by using the method of exposure as set forth in claim 1.

29. A photomask produced by using the method of exposure as set forth in claim 4.

30. A photomask produced by using the method of exposure as set forth in claim 18.

31. A photomask produced by using the method of exposure as set forth in claim 22.

32. A microdevice produced by using the method of exposure as set forth in claim 1.

33. A microdevice produced by using the method of exposure as set forth in claim 4.

34. A microdevice produced by using the method of exposure as set forth in claim 18.

35. A microdevice produced by using the method of exposure as set forth in claim 22.

36. A method of exposure projecting a pattern of a photomask on to a device substrate, the photomask being produced by transferring patterns of master masks on to a mask substrate, the method comprising the steps of:

producing the photomask by dividing an enlarged pattern of a pattern for transfer into patterns of a plurality of the master masks, forming an alignment mark on a surface of the mask substrate, and successively transferring reduced images of the patterns of the plurality of the master masks on the surface of the mask substrate while stitching them while aligning the mask substrate and the master mask using the alignment mark; and aligning said photomask and said device substrate using said alignment mark of said photomask.

37. A method of production of a microdevice comprising the steps of:

forming an alignment mark on a first photomask substrate;

dividing a device pattern to be transferred on to a second substrate on which the microdevice is to be formed into a plurality of element patterns;

transferring reduced images of said plurality of element patterns on to said first substrate to form a device pattern using positional information obtained by detecting said alignment mark; and transferring said device pattern on to said second substrate using said alignment mark of the photomask on which said device pattern is formed.

38. A method of exposure using a plurality of masks to transfer patterns on a photosensitive substrate in a plurality of partially overlapping areas, wherein an amount of exposure at at least one of said plurality of areas at the time of transfer of said pattern is different from an amount of exposure at the remainder of said plurality of areas.

39. A method of exposure as set forth in claim 38, wherein said amount of exposure is determined in accordance with an amount of change of line width of patterns to be transferred to said plurality of areas.

40. A method of exposure as set forth in claim 38, wherein said amount of exposure is determined in accordance with a time from transfer of said patterns to development of said photosensitive substrate.

41. A method of exposure as set forth in claim 38, wherein the patterns to be transferred to said plurality of areas are formed on different masks from each other and the amounts of exposure at the plurality of areas are different from each other.

42. A method of production of a photomask including the step of transferring a plurality of patterns on to a photomask substrate by a step-and-stitch method using the method of exposure as set forth in claim 38.

43. A method of production of a device including the step of transferring a plurality of patterns on to a device substrate by a step-and-stitch method using the method of exposure as set forth in claim 38.

44. A method of exposure emitting an illumination beam to a mask and exposing a photosensitive substrate by said illumination beam through a projection optical system, said method of exposure comprising the steps of:

detecting an image projected by said projection optical system at a plurality of different points in an area illuminated by said illumination beam to obtain first information, adjusting optical characteristics of said projected image based on the same, detecting an image projected by said projection optical system at least at one measurement point outside of said illuminated area in a state with said optical characteristics adjusted to obtain second information, and storing the same; and adjusting characteristics of the pattern image by said projection optical system using said second information so as to expose said photosensitive substrate by said illumination beam using said mask.

45. A method of exposure as set forth in claim 44, comprising the additional steps of detecting a mark arranged outside of said illuminated area on said mask and adjusting characteristics of said pattern image based on said second information and third information obtained by detection of said mark.

46. A method of exposure as set forth in claim 45, wherein said mark is formed at a plurality of different positions outside a pattern area of said mask on which the pattern to be transferred to said photosensitive substrate is formed.

47. A method of exposure as set forth in claim 46, wherein a specific mask different from said mask is used to obtain said first and second information.

48. A method of exposure as set forth in claim 47, wherein said specific mask has a first area corresponding to said pattern area and a second area outside of the same in each of which a plurality of marks are formed, said first information is obtained by detection of marks in said first area, and said second information is obtained by detection of marks in said second area.

49. A method of production of a device including the step of transferring a device pattern on to a workpiece using the method of exposure as set forth in claim 44.

50. A method of production of a photomask including the step of transferring patterns formed on a plurality of master masks on to a photomask substrate by a step-and-stitch method using the method of exposure as set forth in claim 44.

51. A method of production of a photomask as set forth in claim 50, including the additional steps of reducing and projecting the patterns of the master masks through said projection optical system, enlarging a device pattern to be formed on said photomask by exactly an inverse magnification of a projection magnification of said projection optical system, dividing said enlarged pattern into elements or functions, and forming the same on said plurality of master masks.

52. A method of production of a photomask for use in an exposure apparatus, comprising the steps of exposing a plurality of partially overlapping areas on a substrate for said photomask using a plurality of master masks formed by dividing an enlarged pattern of a device pattern to be formed on said photomask into a plurality of sections and adjusting at least one of a shape and position of a reduced image of a divided pattern on said substrate based on transfer characteristics of said master masks by said exposure apparatus.

53. A method of production of a photomask as set forth in claim 52, comprising the additional steps of modifying design data of said divided pattern produced from said enlarged pattern and forming said divided pattern on said master mask in accordance with said modified design data.

54. A method of production of a photomask as set forth in claim 52, comprising the additional step of adjusting optical characteristics of a projection optical system forming a reduced image of said divided pattern based on said transfer characteristics.

55. A method of production of a photomask as set forth in claim 52, comprising the additional steps of transferring said divided pattern on said substrate by synchronously moving said master mask and said substrate for scan exposure of said plurality of areas and adjusting the shape of said reduced image by changing conditions of said scan exposure based on said transfer characteristics.

56. A method of transfer dividing a pattern for transfer into patterns for a plurality of masks and successively transferring the patterns of the masks on to an object through a projection optical system while partially overlapping the patterns, the method comprising transferring the patterns of the masks on to the object in a state that a correction amount of imaging characteristics of a projection image obtained by the projection optical system is different between an overlapping area of the divided patterns and the other area except the overlapping area.

57. A method of transfer as set forth in claim 56, wherein the overlapping area of the divided patterns is a peripheral area in a pattern area formed on the mask and the other area is a center area in the pattern area.

58. A method of transfer as set forth in claim 56, wherein transfer conditions for the divided patterns are different from each other according to shapes of the divided patterns.

59. A method of transfer as set forth in claim 58, wherein the shapes of the divided patterns are line-widths.

60. A method of transfer as set forth in claim 56, wherein an enlarged pattern of the pattern for transfer is divided and the divided patterns are formed on the respective masks.

61. A photomask produced by using the method as set forth in claim 56.

62. A microdevice produced by using the method as set forth in claim 56.

63. A method of producing a photomask comprising the step of using the method of transfer as set forth in claim 56.

64. A method of producing a device comprising the step of using the method of transfer as set forth in claim 56.

* * * * *